US007614253B2

(12) United States Patent
Ouellet et al.

(10) Patent No.: US 7,614,253 B2
(45) Date of Patent: Nov. 10, 2009

(54) METHOD OF REDUCING STRESS-INDUCED MECHANICAL PROBLEMS IN OPTICAL COMPONENTS

(75) Inventors: Luc Ouellet, Granby (CA); Jonathan Lachance, Granby (CA)

(73) Assignee: DALSA Semiconductor Inc., Waterloo, ON (CA)

( * ) Notice: Subject to any disclaimer, the term of this patent is extended or adjusted under 35 U.S.C. 154(b) by 257 days.

(21) Appl. No.: 11/561,044

(22) Filed: Nov. 17, 2006

(65) Prior Publication Data

US 2007/0130996 A1 Jun. 14, 2007

Related U.S. Application Data

(63) Continuation of application No. 09/973,778, filed on Oct. 11, 2001, now abandoned.

(51) Int. Cl.
*C03B 37/07* (2006.01)
(52) U.S. Cl. .............................. 65/377; 65/379; 65/384; 65/386; 65/429
(58) Field of Classification Search .................. 65/379, 65/377, 386, 384, 429; 438/31
See application file for complete search history.

(56) References Cited

U.S. PATENT DOCUMENTS

| 3,867,218 | A | * | 2/1975 | Henry | 438/757 |
|---|---|---|---|---|---|
| 5,094,984 | A | * | 3/1992 | Liu et al. | 438/760 |
| 5,612,171 | A | * | 3/1997 | Bhagavatula | 430/321 |
| 5,679,165 | A | * | 10/1997 | Maeda et al. | 118/719 |
| 5,904,491 | A | * | 5/1999 | Ojha et al. | 438/31 |
| 5,979,188 | A | * | 11/1999 | Ojha | 65/386 |
| 6,044,192 | A | * | 3/2000 | Grant et al. | 385/129 |
| 6,154,582 | A | * | 11/2000 | Bazylenko et al. | 385/14 |
| 6,192,712 | B1 | * | 2/2001 | Saito et al. | 65/386 |
| 6,331,445 | B1 | * | 12/2001 | Janz et al. | 438/57 |
| 6,396,988 | B1 | * | 5/2002 | Shimoda | 385/129 |
| 6,584,807 | B1 | * | 7/2003 | Tregoat et al. | 65/386 |

FOREIGN PATENT DOCUMENTS

| WO | WO 96/41219 | 12/1996 |
|---|---|---|
| WO | WO 02/43119 A2 | 5/2002 |
| WO | WO 02/43130 A2 | 5/2002 |

OTHER PUBLICATIONS

D.A.P. Bulla, et al., "Deposition of thick TEOS PECVD silicon oxide layers for integrated optical waveguide applications", Thin Solid Films, vol. 334, 1998, pp. 60-64.
M.I. Alayo, et al., "Thick SiOxNy and SiO2 films obtained by PECVD technique at low temperatures", Thin Solid Films, vol. 332, 1998, pp. 40-45.

* cited by examiner

*Primary Examiner*—John Hoffmann
(74) *Attorney, Agent, or Firm*—Marks & Clerk; Richard J. Mitchell

(57) ABSTRACT

A method of making optical quality films is described. A silica film is deposited on a wafer by PECVD (Plasma Enhanced Chemical Vapor Deposition). The deposited film is then subjected to a first heat treatment to reduce optical absorption, wafer warp, and compressive stress. A second film is deposited. This step is then followed by a second heat treatment to reduce optical absorption, wafer warp and tensile stress. The two heat treatments have similar temperature profiles.

6 Claims, 48 Drawing Sheets

Figure 1

| Publication | PECVD Reaction | 'Delta-n' Control Method | Post-dep. Thermal Treatment T° (°C) |
|---|---|---|---|
| Valette S., 1987 | Unknown | P doping | Not specified |
| Valette S., 1988 | Unknown | P doping | 400°C |
| Grand G., 1990 | Unknown | P doping | 1000°C |
| Liu K., 1995 | Unknown | Content in Si, P | Not specified |
| Ojha S., 1998 | Unknown | Ge, B, or P doping | Not specified |
| Canning J., 1998 | Unknown | Ge doping | Not specified |
| Bulla D., 1998 | TEOS | TEOS | Not specified |
| Johnson C., 1998 | $SiH_4 + O_2$ | Si ion Implantation | 400°C |
| Boswell R. W., 1997 | $SiH_4 + O_2$ | $SiH_4/O_2$ flow ratio | 1000°C |
| Bazylenko M. V., 1995 | $SiH_4 + O_2 + CF_4$ | $(SiH_4+O_2)/CF_4$ flow ratio | Not specified |
| Bazylenko M. V., 1996 | $SiH_4 + O_2 + CF_4$ | $(SiH_4+O_2)/CF_4$ flow ratio | 1000°C |
| Durandet A., 1996 | $SiH_4 + O_2 + CF_4$ | $SiH_4/O_2/CF_4$ flow ratio | 100°C |
| Kapser K., 1991 | $SiH_4 + N_2O$ | $SiH_4/N_2O$ flow ratio | 1060°C |
| Lai Q., 1992 | $SiH_4 + N_2O$ | $SiH_4/N_2O$ flow ratio | 1100°C |
| Lai Q., 1993 | $SiH_4 + N_2O$ | $SiH_4/N_2O$ flow ratio | 1100°C |
| Pereyra I., 1997 | $SiH_4 + N_2O$ | $SiH_4/N_2O$ flow ratio | 400°C |
| Alayo M., 1998 | $SiH_4 + N_2O$ | $SiH_4/N_2O$ flow ratio | 1000°C |
| Kenyon T., 1997 | $SiH_4 + N_2O + Ar$ | $SiH_4/N_2O/Ar$ flow ratio | 1000°C |
| Lam D. K. W., 1984 | $SiH_4 + N_2O + NH_3$ | $SiH_4/N_2O/NH_3$ flow ratio | Not specified |
| Bruno F., 1991 | $SiH_4 + N_2O + NH_3$ | $SiH_4/N_2O/NH_3$ flow ratio | 1100°C |
| Yokohama S., 1995 | $SiH_4 + N_2O + NH_3$ | $SiH_4/N_2O/NH_3$ flow ratio | Not specified |
| Agnihotri O. P., 1997 | $SiH_4 + N_2O + NH_3$ | $SiH_4/N_2O/NH_3$ flow ratio | 700-900°C |
| Germann R., 1999 | $SiH_4 + N_2O + NH_3$ | Unknown | 1100°C |
| Offrein B., 1999 | $SiH_4 + N_2O + NH_3$ | Unknown | 1150°C |
| Hoffmann M., 1995 | $SiH_4 + N_2O + NH_3 + Ar$ | $SiH_4/N_2O/NH_3/Ar$ flow ratio | Not specified |
| Hoffmann M., 1997 | $SiH_4 + N_2O + NH_3 + Ar$ | $SiH_4/N_2O/NH_3/Ar$ flow ratio | Not specified |
| Tu Y., 1995 | $SiH_4 + N_2O + NH_3 + N_2$ | $N_2O/(N_2O + NH_3)$ flow ratio | 1050°C |
| Poenar D., 1997 | $SiH_4 + N_2O + NH_3 + N_2$ | $SiH_4/N_2O/NH_3/N_2$ flow ratio | 850°C |
| Ridder R., 1998 | $SiH_4 + N_2O + NH_3 + N_2$ | $SiH_4/N_2O/NH_3/Ar$ flow ratio | 1100°C |
| Worhoff K., 1999 | $SiH_4 + N_2O + NH_3 + N_2$ | $SiH_4/N_2O/NH_3/N_2$ flow ratio | 1150°C |
| Bulat E.S., 1993 | $SiH_4 + N_2O + N_2 + O_2 + He + CF_4$ | $SiH_4/(N_2O/N_2)/O_2/CF_4$ flow ratio | 425°C |
| This Patent Application | $SiH_4 + N_2O + PH_3 + N_2$ | Patented Pending Method | 650°C |

Figure 2

| | | O-H | SiO-H | SiN-H | Si:N-H | Si-H | Si=O | N=N | Si-O-Si | Si-O-Si | Si-ON | Si-OH | Si-O-Si | Si-O-Si |
|---|---|---|---|---|---|---|---|---|---|---|---|---|---|---|
| FTIR 1st mode (cm-1) | Min | 3550 | 3470 | 3380 | 3300 | 2210 | 1800 | 1530 | 1080 | 1000 | 910 | 860 | 740 | 410 |
| | Ave | 3650 | 3510 | 3420 | 3380 | 2260 | 1875 | 1555 | 1180 | 1080 | 950 | 885 | 810 | 460 |
| | Max | 3750 | 3550 | 3460 | 3460 | 2310 | 1950 | 1580 | 1280 | 1160 | 990 | 910 | 880 | 510 |
| 1st mode (μm) | Min | 2.817 | 2.882 | 2.959 | 3.030 | 4.525 | 5.556 | 6.536 | 9.259 | 10.000 | 10.989 | 11.628 | 13.514 | 24.390 |
| | Ave | 2.740 | 2.849 | 2.924 | 2.959 | 4.425 | 5.333 | 6.431 | 8.475 | 9.259 | 10.526 | 11.299 | 12.346 | 21.739 |
| | Max | 2.667 | 2.817 | 2.890 | 2.890 | 4.329 | 5.128 | 6.329 | 7.813 | 8.621 | 10.101 | 10.989 | 11.364 | 19.608 |
| 2nd mode (μm) | Min | 1.408 | 1.441 | 1.479 | 1.515 | 2.262 | 2.778 | 3.268 | 4.630 | 5.000 | 5.495 | 5.814 | 6.757 | 12.195 |
| | Ave | 1.370 | 1.425 | 1.462 | 1.479 | 2.212 | 2.667 | 3.215 | 4.237 | 4.630 | 5.263 | 5.650 | 6.173 | 10.870 |
| | Max | 1.333 | 1.408 | 1.445 | 1.445 | 2.165 | 2.564 | 3.165 | 3.906 | 4.310 | 5.051 | 5.495 | 5.682 | 9.804 |
| 3rd mode (μm) | Min | 0.939 | 0.961 | 0.986 | 1.010 | 1.508 | 1.852 | 2.179 | 3.086 | 3.333 | 3.663 | 3.876 | 4.505 | 8.130 |
| | Ave | 0.913 | 0.950 | 0.975 | 0.986 | 1.475 | 1.778 | 2.144 | 2.825 | 3.086 | 3.509 | 3.766 | 4.115 | 7.246 |
| | Max | 0.889 | 0.939 | 0.963 | 0.963 | 1.443 | 1.709 | 2.110 | 2.604 | 2.874 | 3.367 | 3.663 | 3.788 | 6.536 |
| 4th mode (μm) | Min | 0.704 | 0.720 | 0.740 | 0.758 | 1.131 | 1.389 | 1.634 | 2.315 | 2.500 | 2.747 | 2.907 | 3.378 | 6.098 |
| | Ave | 0.685 | 0.712 | 0.731 | 0.740 | 1.106 | 1.333 | 1.608 | 2.119 | 2.315 | 2.632 | 2.825 | 3.086 | 5.435 |
| | Max | 0.667 | 0.704 | 0.723 | 0.723 | 1.082 | 1.282 | 1.582 | 1.953 | 2.155 | 2.525 | 2.747 | 2.841 | 4.902 |
| 5th mode (μm) | Min | 0.563 | 0.576 | 0.592 | 0.606 | 0.905 | 1.111 | 1.307 | 1.852 | 2.000 | 2.198 | 2.326 | 2.703 | 4.878 |
| | Ave | 0.548 | 0.570 | 0.585 | 0.592 | 0.885 | 1.067 | 1.286 | 1.695 | 1.852 | 2.105 | 2.260 | 2.469 | 4.348 |
| | Max | 0.533 | 0.563 | 0.578 | 0.578 | 0.866 | 1.026 | 1.266 | 1.563 | 1.724 | 2.020 | 2.198 | 2.273 | 3.922 |
| 6th mode (μm) | Min | 0.469 | 0.480 | 0.493 | 0.505 | 0.754 | 0.926 | 1.089 | 1.543 | 1.667 | 1.832 | 1.938 | 2.252 | 4.065 |
| | Ave | 0.457 | 0.475 | 0.487 | 0.493 | 0.737 | 0.889 | 1.072 | 1.412 | 1.543 | 1.754 | 1.883 | 2.058 | 3.623 |
| | Max | 0.444 | 0.469 | 0.482 | 0.482 | 0.722 | 0.855 | 1.055 | 1.302 | 1.437 | 1.684 | 1.832 | 1.894 | 3.268 |
| 7th mode (μm) | Min | 0.402 | 0.412 | 0.423 | 0.433 | 0.646 | 0.794 | 0.934 | 1.323 | 1.429 | 1.570 | 1.661 | 1.931 | 3.484 |
| | Ave | 0.391 | 0.407 | 0.418 | 0.423 | 0.632 | 0.762 | 0.919 | 1.211 | 1.323 | 1.504 | 1.614 | 1.764 | 3.106 |
| | Max | 0.381 | 0.402 | 0.413 | 0.413 | 0.618 | 0.733 | 0.904 | 1.116 | 1.232 | 1.443 | 1.570 | 1.623 | 2.801 |
| 8th mode (μm) | Min | 0.352 | 0.360 | 0.370 | 0.379 | 0.566 | 0.694 | 0.817 | 1.157 | 1.250 | 1.374 | 1.453 | 1.689 | 3.049 |
| | Ave | 0.342 | 0.356 | 0.365 | 0.370 | 0.553 | 0.667 | 0.804 | 1.059 | 1.157 | 1.316 | 1.412 | 1.543 | 2.717 |
| | Max | 0.333 | 0.352 | 0.361 | 0.361 | 0.541 | 0.641 | 0.791 | 0.977 | 1.078 | 1.263 | 1.374 | 1.420 | 2.451 |

Figure 10
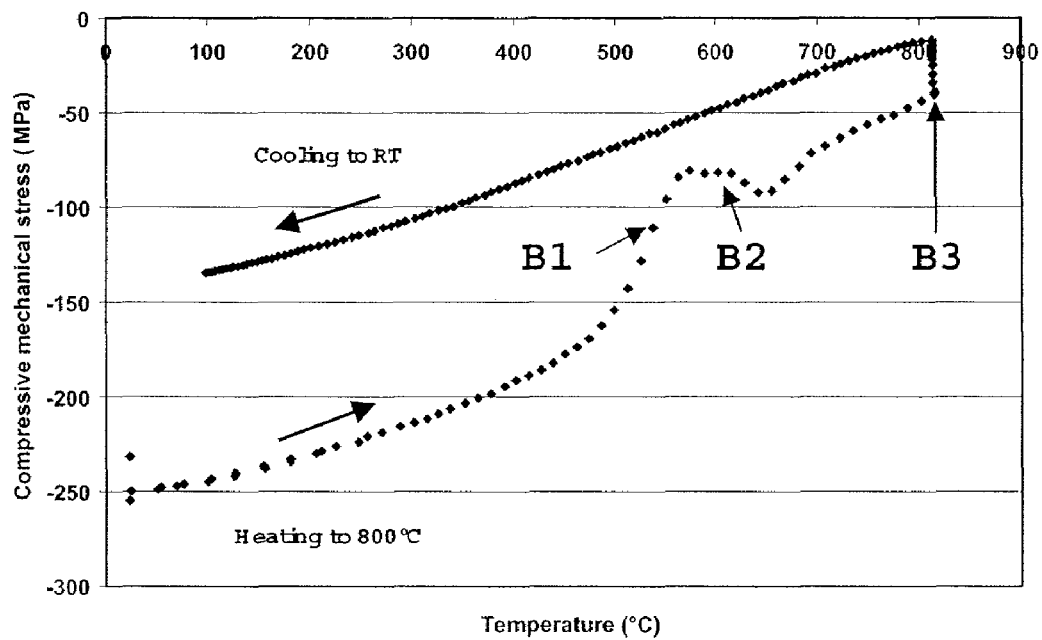
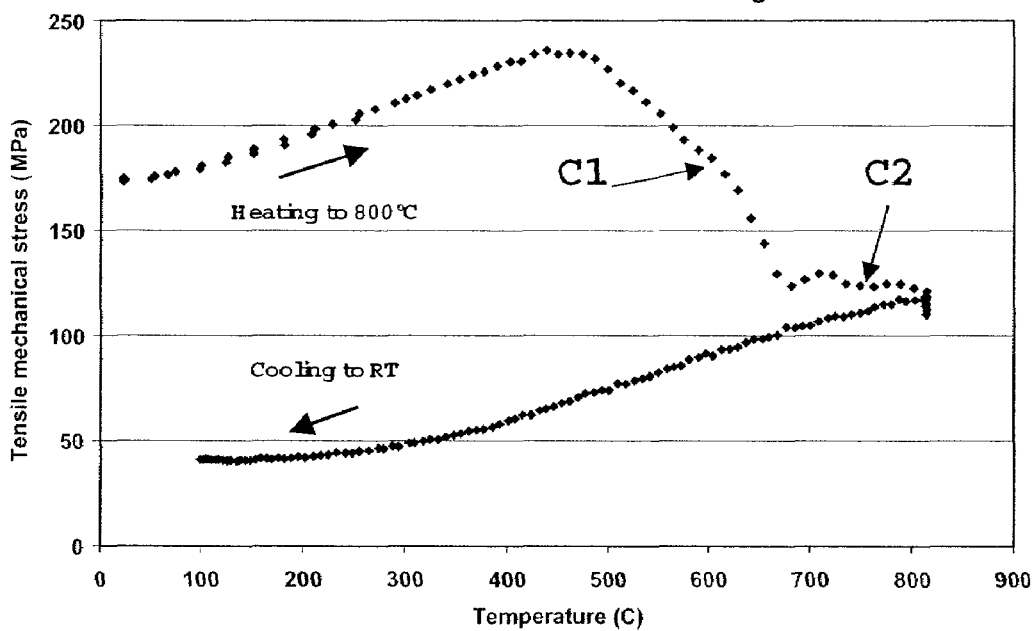

Figure 11
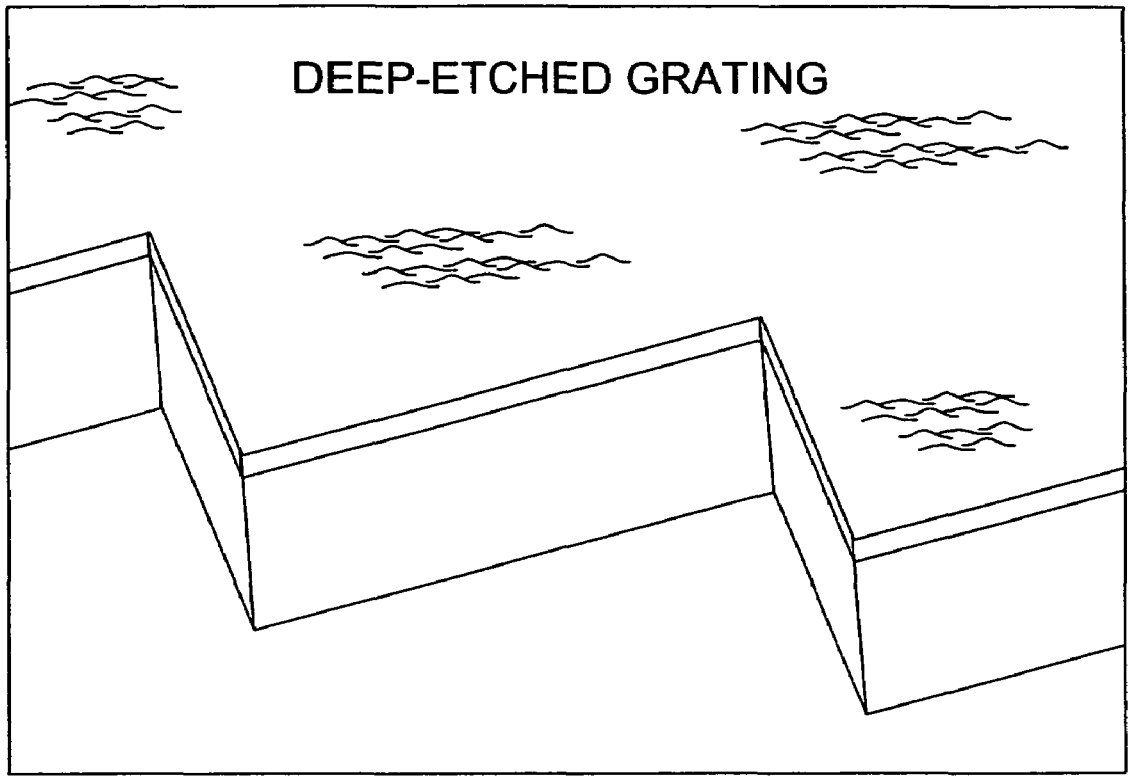
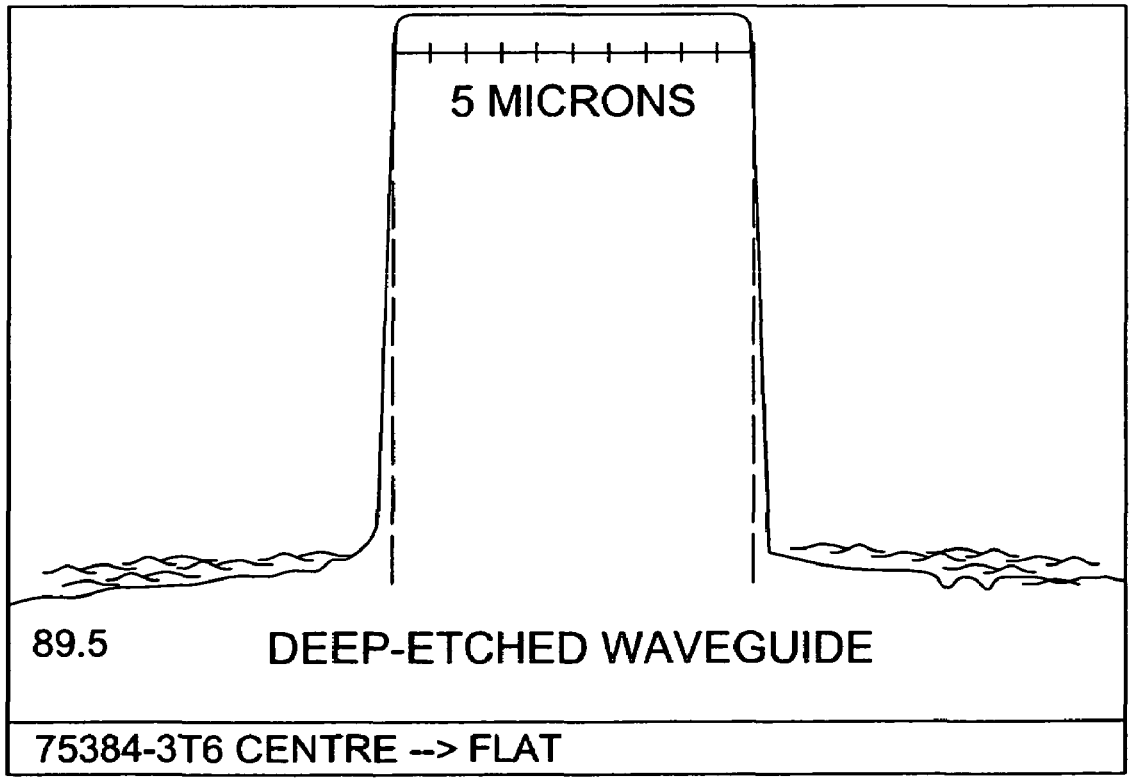

Figure 12
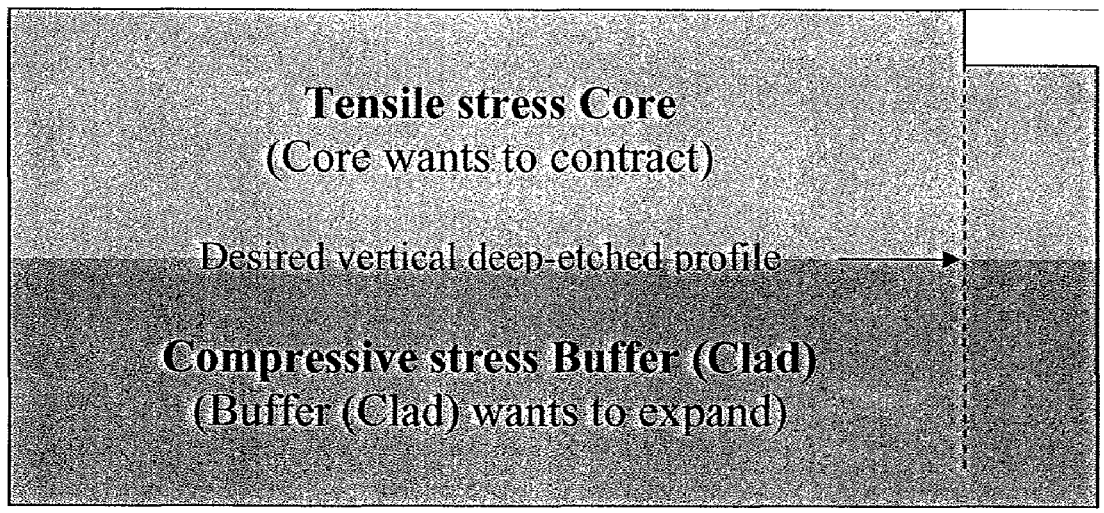
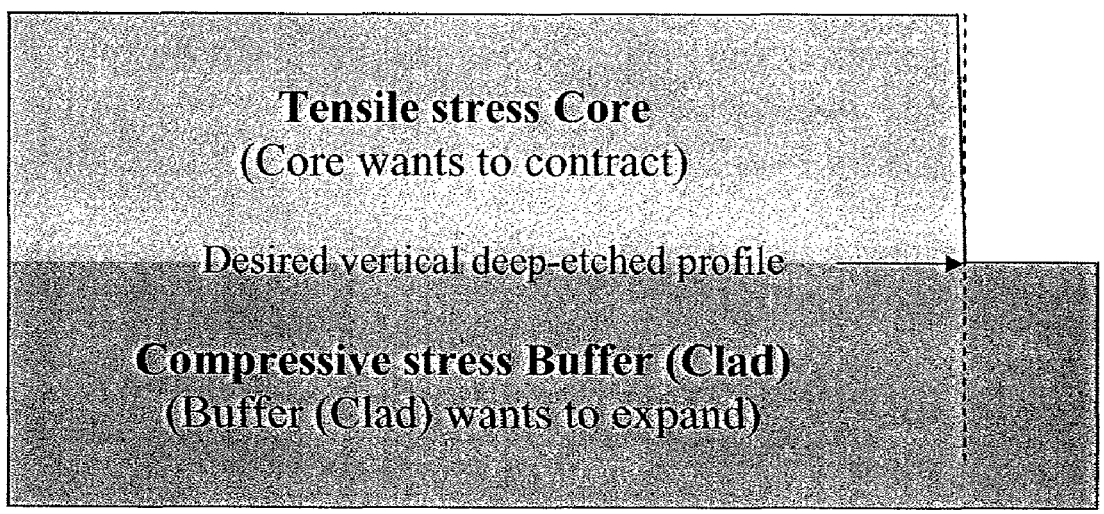
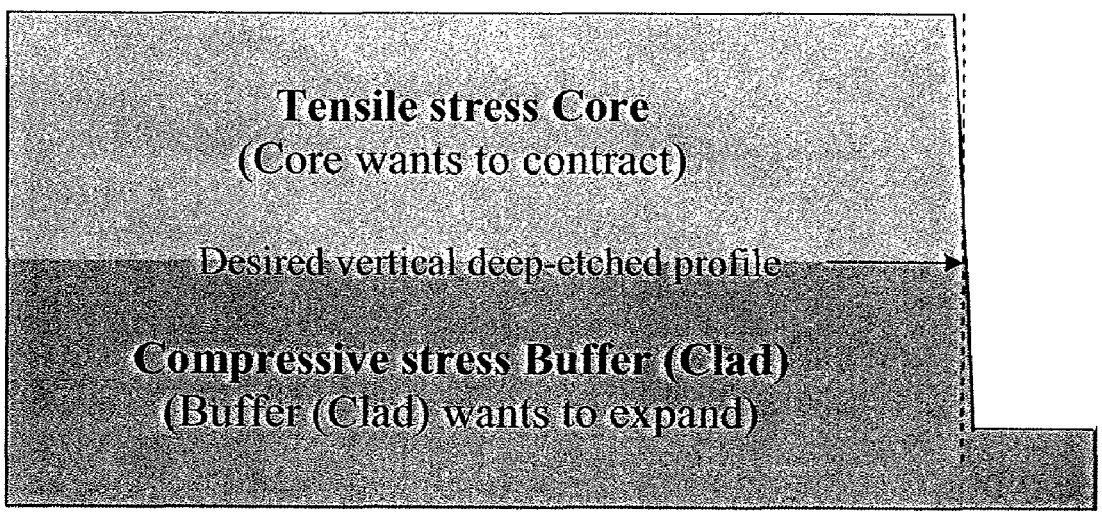

Figure 13

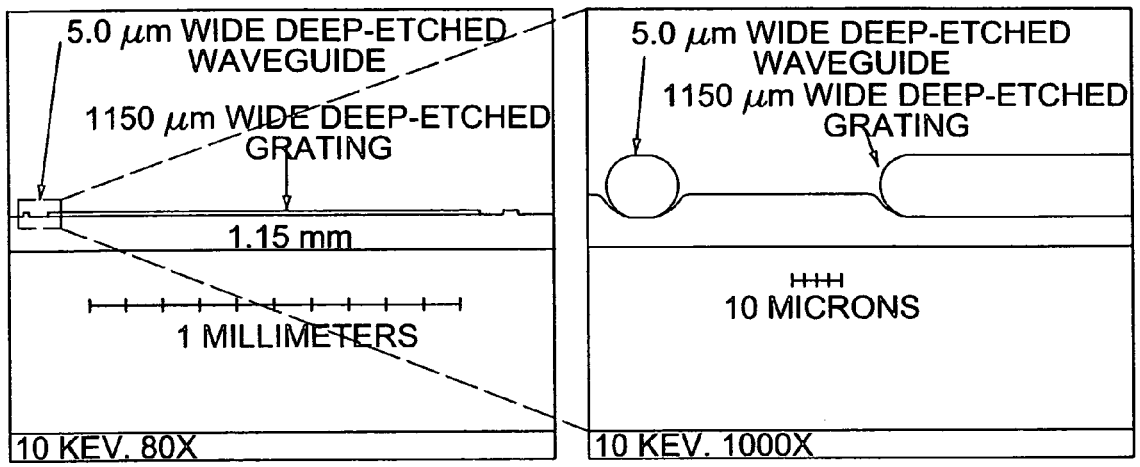

THE RELATIVE POSITION BETWEEN AN ISOLATED 5.0μm WIDE
DEEP-ETCHED WAVEGUIDE AND ITS NEIGHBORING 1150μm WIDE
DEEP-ETCHED GRATING AT TWO DIFFERENT MAGNIFICATIONS.

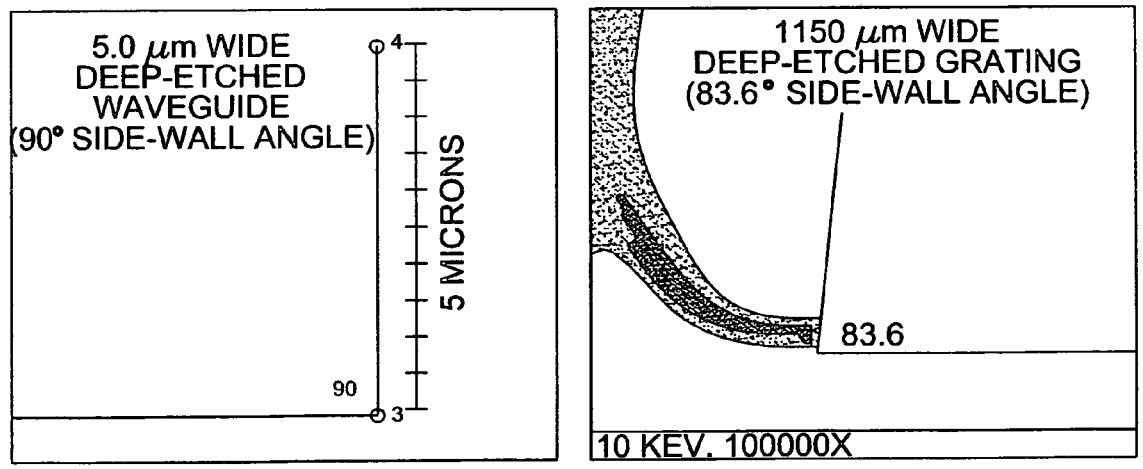

THE SIDE-WALL OF THE 5.0μm
WIDE DEEP-ETCHED WAVEGUIDE
FACING THE NEIGHBORING
GRATING HAS A SLOPE OF
ABOUT 90°.

THE SIDE-WALL OF THE 1150μm
WIDE DEEP-ETCHED GRATING
FACING THE NEIGHBORING
DEEP-ETCHED WAVEGUIDE HAS A
MUCH SMALLER SLOPE OF
ABOUT 84°

Figure 14
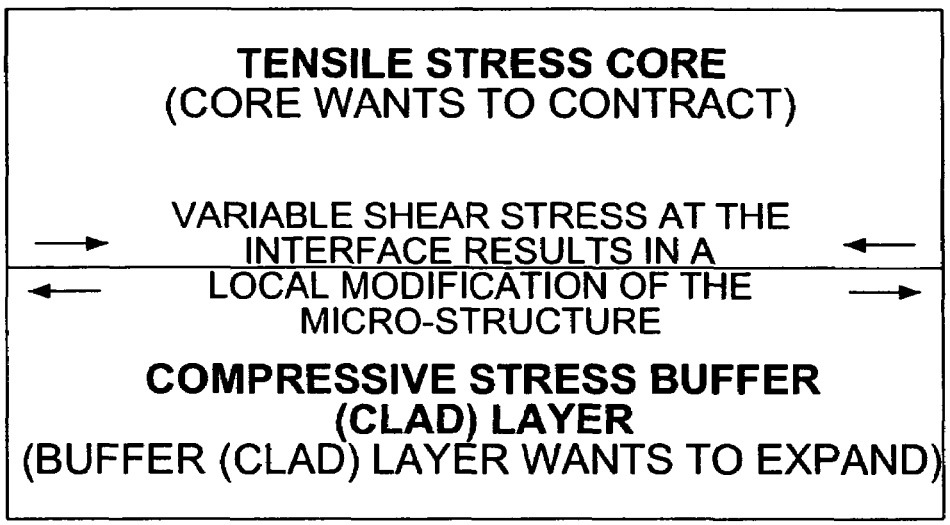
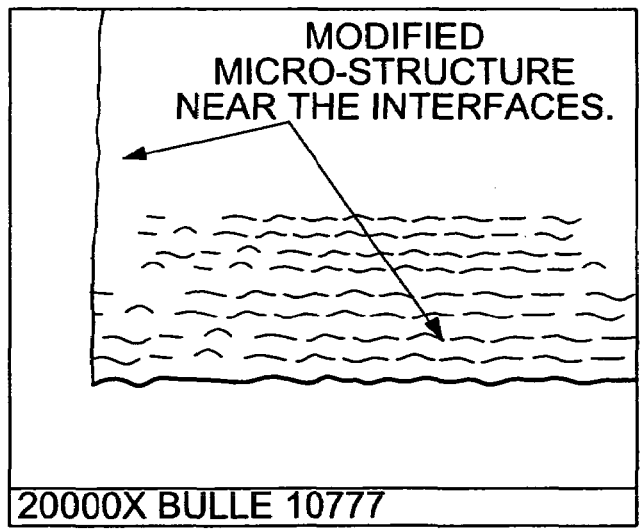
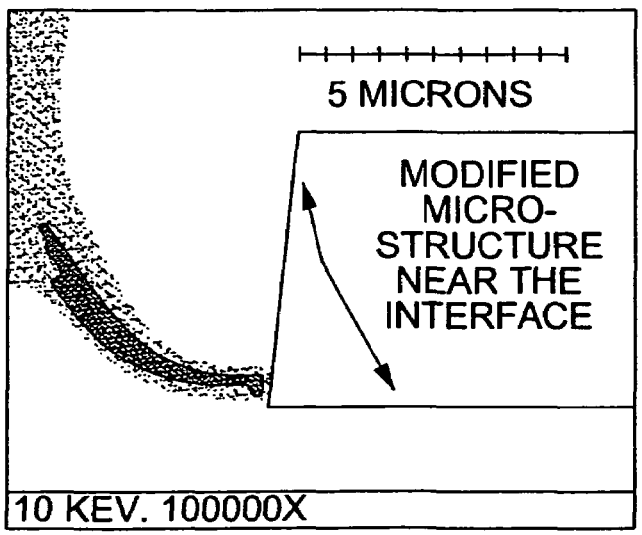

Figure 15
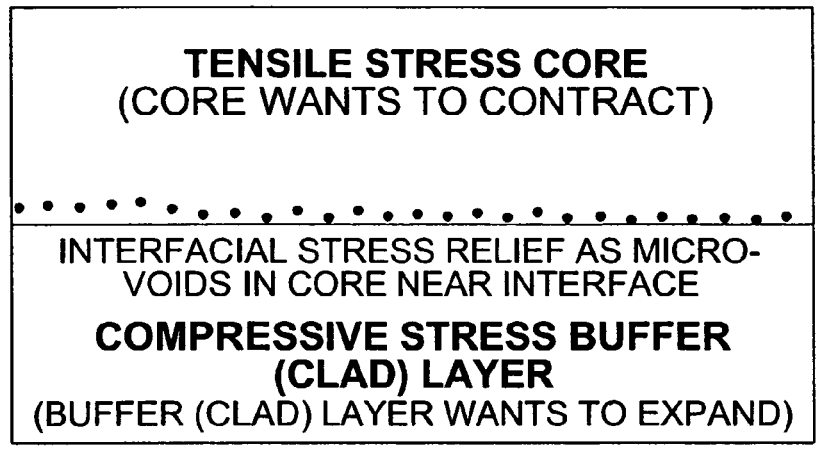
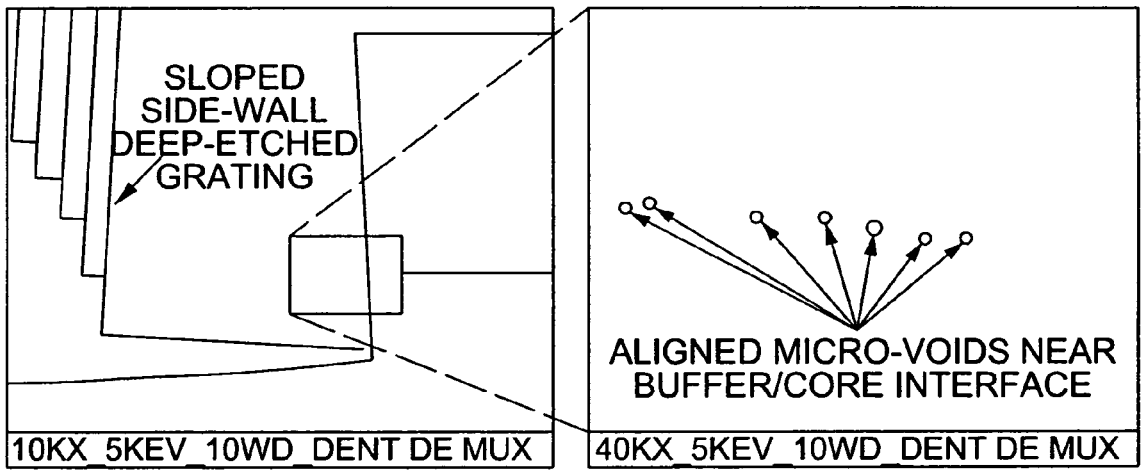
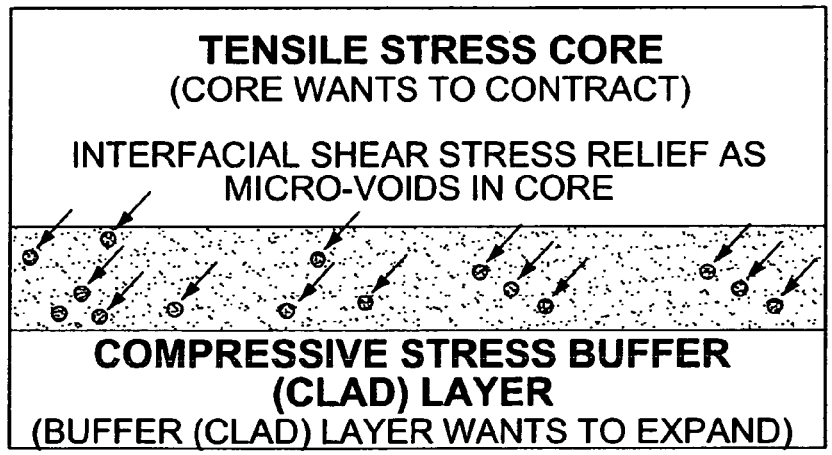

METHOD OF REDUCING STRESS-INDUCED MECHANICAL PROBLEMS IN OPTICAL COMPONENTS

CROSS REFERENCE TO RELATED APPLICATION

This application is a continuation of U.S. patent application Ser. No. 09/973,778, filed Oct. 11, 2001, the contents of which are herein incorporated by reference.

BACKGROUND OF THE INVENTION

1. Field of the Invention

This invention relates to the field of integrated optical devices, and in particular to a method of reducing stress-induced mechanical problems in optical components, especially optical components that are deep-etched, such as multiplexers and demultiplexers employing echelon gratings.

2. Description of the Related Art

The manufacture of integrated optical devices such as optical Multiplexers (Mux) and Demultiplexers (Dmux) requires the fabrication optical quality elements, such as waveguides and gratings highly transparent in the 1.30 and 1.55 µm optical bands. These silica-based optical elements are basically composed of three films: buffer, core and cladding. For reasons of simplicity, the buffer and cladding are typically of the same composition and of same refractive index. In order to confine the 1.55 µm (and/or 1.30 µm) wavelength laser beam, the core must have a higher refractive index than the buffer (cladding). This required refractive index difference is called the 'delta-n' and is one of the most important characteristics of these silica-based optical elements. It is very difficult to fabricate such transparent silica-based optical elements in the 1.55 µm wavelength (and/or 1.30 wavelength) optical region while maintaining the suitable 'delta-n' and while preventing stress-induced mechanical and problems.

Our co-pending U.S. patent application Ser. No. 09/867,772 entitled "Method of Depositing Optical Quality Films", describes an improved Plasma Enhanced Chemical Vapour Deposition technique of these silica-based elements which allows the achievement of the required 'delta-n' while eliminating the undesirable residual Si:N—H oscillators (observed as a FTIR peak centered at 3380 cm$^{-1}$ whose $2^{nd}$ harmonics could cause an optical absorption between 1.445 and 1.515 µm), SiN—H oscillators (centered at 3420 cm$^{-1}$ whose $2^{nd}$ harmonics could cause an optical absorption between 1.445 and 1.479 µm) and SiO—H oscillators (centered at 3510 cm$^{-1}$ and whose $2^{nd}$ harmonics could cause an optical absorption between 1.408 and 1.441 µm) after a high temperature thermal treatment in a nitrogen ambient at 800° C.

Another co-pending patent application, Ser. No. 09/956,916, filed on Sep. 21, 2001, entitled "Method of Depositing an Optical Quality Silica Film by PECVD", shows that to such a high temperature thermal treatment are associated some residual stress-induced mechanical problems of deep-etched optical elements (mechanical movement of the side-walls), some residual stress-induced mechanical problems at the buffer/core interface or at the core/cladding interface (microstructural defects, micro-voiding and separation) and some residual stress-induced optical problems (polarisation dependant power loss) which can be eliminated by an improved process allowing the simultaneous optimization of the optical and of the mechanical properties of buffer (cladding) and core in a seven-dimensional space, namely a first independent variable, the SiH$_4$ flow; a second independent variable, the N$_2$O flow; a third independent variable, the N$_2$ flow; a fourth independent variable, the PH$_3$ flow; a fifth independent variable, the total deposition pressure; a sixth independent variable, the optimised post-deposition thermal treatment; and the observed silica-based optical elements characteristics.

Recently published literature reveals various PECVD (Plasma Enhanced Chemical Vapor Deposition) approaches to obtain these high performance optically transparent silica-based optical elements: Valette S., New integrated optical multiplexer-demultiplexer realized on silicon substrate, ECIO '87, 145, 1987; Grand G., Low-loss PECVD silica channel waveguides for optical communications, Electron. Lett., 26 (25), 2135, 1990; Bruno F., Plasma-enhanced chemical vapor deposition of low-loss SiON optical waveguides at 1.5-µm wavelength, Applied Optics, 30 (31), 4560, 1991; Kapser K., Rapid deposition of high-quality silicon-oxinitride waveguides, IEEE Trans. Photonics Tech. Lett., 5 (12), 1991; Lai Q., Simple technologies for fabrication of low-loss silica waveguides, Elec. Lett., 28 (11), 1000, 1992; Lai Q., Formation of optical slab waveguides using thermal oxidation of SiOx, Elec. Lett., 29 (8), 714, 1993; Liu K., Hybrid optoelectronic digitally tunable receiver, SPIE, Vol 2402, 104, 1995; Tu Y., Single-mode SiON/SiO2/Si optical waveguides prepared by plasma-enhanced Chemical vapor deposition, Fiber and integrated optics, 14, 133, 1995; Hoffmann M., Low temperature, nitrogen doped waveguides on silicon with small core dimensions fabricated by PECVD/RIE, ECIO'95, 299, 1995; Bazylenko M., Pure and fluorine-doped silica films deposited in a hollow cathode reactor for integrated optic applications, J. Vac. Sci. Technol. A 14 (2), 336, 1996; Poenar D., Optical properties of thin film silicon-compatible materials, Appl. Opt. 36 (21), 5112, 1997; Hoffmann M., Low-loss fiber-matched low-temperature PECVD waveguides with small-core dimensions for optical communication systems, IEEE Photonics Tech. Lett., 9 (9), 1238, 1997; Pereyra I., High quality low temperature DPECVD silicon dioxide, J. Non-Crystalline Solids, 212, 225, 1997; Kenyon T., A luminescence study of silicon-rich silica and rare-earth doped silicon-rich silica, Fourth Int. Symp. Quantum Confinement Electrochemical Society, 97-11, 304, 1997; Alayo M., Thick SiOxNy and SiO2 films obtained by PECVD technique at low temperatures, Thin Solid Films, 332, 40, 1998; Bulla D., Deposition of thick TEOS PECVD silicon oxide layers for integrated optical waveguide applications, Thin Solid Films, 334, 60, 1998; Valette S., State of the art of integrated optics technology at LETI for achieving passive optical components, J. of Modern Optics, 35 (6), 993, 1988; Ojha S., Simple method of fabricating polarization-insensitive and very low crosstalk AWG grating devices, Electron. Lett., 34 (1), 78, 1998; Johnson C., Thermal annealing of waveguides formed by ion implantation of silica-on-Si, Nuclear Instruments and Methods in Physics Research, B141, 670, 1998; Ridder R., Silicon oxynitride planar waveguiding structures for application in optical communication, IEEE J. of Sel. Top. In Quantum Electron., 4 (6), 930, 1998; Germann R., Silicon-oxynitride layers for optical waveguide applications, 195$^{th}$ meeting of the Electrochemical Society, 99-1, May 1999, Abstract 137, 1999; Worhoff K., Plasma enhanced cyhemical vapor deposition silicon oxynitride optimized for application in integrated optics, Sensors and Actuators, 74, 9, 1999; Offrein B., Wavelength tunable optical add-after-drop filter with flat passband for WDM networks, IEEE Photonics Tech. Lett., 11 (2), 239, 1999.

A comparison of these various PECVD techniques is summarised in FIG. 1 which describes the approaches and methods used to modify the 'delta-n' between buffer (cladding) and core with a post-deposition thermal treatment.

The various techniques can be grouped in main categories: PECVD using unknown chemicals, unknown chemical reactions and unknown boron (B) and/or phosphorus (P) chemicals and unknown chemical reactions to adjust the 'delta-n' (When specified, the post-deposition thermal treatments range from 400 to 1000° C.); PECVD using TEOS and unknown means of adjusting the 'delta-n' (The post-deposition thermal treatments are not specified); PECVD using oxidation of $SiH_4$ with $O_2$ coupled with silicon ion implantation or adjustment of silicon oxide stoichiometry as means of adjusting the 'delta-n' (The post-deposition thermal treatments range from 400 to 1000° C.) PECVD using oxidation of $SiH_4$ with $O_2$ coupled with the incorporation of $CF_4$ ($SiH_4$/$O_2$/$CF_4$ flow ratio) an means of adjusting the 'delta-n' (Wen specified, the post-deposition thermal treatments range from 100 to 1000° C.) PECVD using oxidation of $SiH_4$ with $N_2O$ coupled with variations of $N_2O$ concentration ($SiH_4$/$N_2O$ flow ratio) as means of adjusting the silicon oxide stoechiometry and the 'delta-n' (The post-deposition thermal treatments range from 400 to 1100° C.); PECVD using oxidation of $SiH_4$ with $N_2O$ coupled with variations of $N_2O$ concentration and with the incorporation of Ar ($SiH_4$/$N_2O$/Ar flow ratio) as means of adjusting the silicon oxide stoechiometry and the 'delta-n' (The post-deposition thermal treatments is 1000° C.); PECVD using oxidation of $SiH_4$ with $N_2O$ coupled with the incorporation of $NH_3$ ($SiH_4$/$N_2O$/$NH_3$ flow ratio) as to form silicon oxynitrides with various 'delta-n' (When specified, the post-deposition thermal treatments range from 700 to 1100° C.); PECVD using oxidation of $SiH_4$ with $N_2O$ coupled with the incorporation of $NH_3$ and Ar ($SiH_4$/$N_2O$/$NH_3$/Ar flow ratio) as to form silicon oxynitrides with various 'delta-n' (The post-deposition thermal treatments are not specified); PECVD using oxidation of $SiH_4$ with $N_2O$ coupled with the incorporation of $NH_3$ and $N_2$ chemicals variation ($SiH_4$/$N_2O$/$NH_3$/$N_2$ flow ratio) as to form silicon oxynitrides with various 'delta-n' (The post-deposition thermal treatments range from 850 to 1150° C.); and PECVD using oxidation of $SiH_4$ with $N_2O$ and $O_2$ coupled with the incorporation of $CF_4$, $N_2$ and He ($SiH_4$/($N_2O$/$N_2$)/$O_2$/$CF_4$ flow ratio) as to form complex mixtures of carbon and fluorine containing silicon oxide as means of adjusting the 'delta-n' (The post-deposition thermal treatments is 425° C.).

Our co-pending patent application Ser. No. 09/833,711 entitled "Optical Quality Silica Films" describes an improved Plasma Enhanced Chemical Vapour Deposition technique of low optical absorption buffer (cladding) which shows that the independent control of the $SiH_4$, $N_2O$ and $N_2$ gases as well as of the total deposition pressure via an automatic control of the pumping speed of the vacuum pump in a five-dimensional space: a first independent variable, the $SiH_4$ flow; a second independent variable, the $N_2O$ flow; a third independent variable, the $N_2$ flow; a fourth independent variable; the total deposition pressure (controlled by an automatic adjustment of the pumping speed); and the observed film characteristics is key to eliminating the undesirable residual Si:N—H oscillators (observed as a FTIR peak centered at 3380 $cm^{-1}$ whose $2^{nd}$ harmonics could cause an optical absorption between 1.445 and 1.515 µm), SiN—H oscillators (centered at 3420 $cm^{-1}$ whose $2^{nd}$ harmonics could cause an optical absorption between 1.445 and 1.479 µm) and SiO—H oscillators (centered at 3510 $^{-1}$ and whose $2^{nd}$ harmonics could cause an optical absorption between 1.408 and 1.441 µm) after thermal treatments at a low post-deposition temperature of 800° C. to provide improved silica films with reduced optical absorption in the 1.55 µm wavelength (and/or 1.30 wavelength) optical region.

Our co-pending patent application Ser. No. 09/867,662 entitled "Method of Depositing Optical Films" describes a new improved Plasma Enhanced Chemical Vapour Deposition technique of low optical absorption core which shows that the independent control of the $SiH_4$, $N_2O$, $N_2$ and $PH_3$ gases as well as of the total deposition pressure via an automatic control of the pumping speed of the vacuum pump in a six-dimensional space: a first independent variable, the $SiH_4$ flow; a second independent variable, the $N_2O$ flow; a third independent variable, the $N_2$ flow; a fourth independent variable, the $PH_3$ flow; a fifth independent variable; the total deposition pressure (controlled by an automatic adjustment of the pumping speed); and the observed waveguides characteristics, is key to achieving the required 'delta-n' while still eliminating the undesirable residual Si:N—H oscillators (observed as a FTIR peak centered at 3380 $cm^{-1}$ whose $2^{nd}$ harmonics could cause an optical absorption between 1.445 and 1.515 µm), SiN—H oscillators (centered at 3420 $cm^{-1}$ whose $2^{nd}$ harmonics could cause an optical absorption between 1.445 and 1.479 µm) and SiO—H oscillators (centered at 3510 $cm^{-1}$ and whose $2^{nd}$ harmonics could cause an optical absorption between 1.408 and 1.441 µm) after thermal treatments at a low post-deposition temperature of 800° C. as to provide improved silica waveguides with reduced optical absorption in the 1.55 µm wavelength (and/or 1.30 wavelength) optical region.

Our co-pending application Ser. No. 09/956,916 filed on September 21, entitled "Method of Depositing an Optical Quality Silica Film by PECVD" describes a technique which shows that the simultaneous optimization of the optical and of the mechanical properties of buffer (cladding) and core in a seven-dimensional space: a first independent variable, the $SiH_4$ flow; a second independent variable, the $N_2O$ flow; a third independent variable, the $N_2$ flow; a fourth independent variable, the $PH_3$ flow; a fifth independent variable, the total deposition pressure; a sixth independent variable, the optimised post-deposition thermal treatment; and the observed silica-based optical elements characteristics is key to achieving the required 'delta-n' while eliminating the undesirable residual Si:N—H oscillators (observed as a FTIR peak centered at 3380 $^{-1}$ whose $2^{nd}$ harmonics could cause an optical absorption between 1.445 and 1.515 µm), SiN—H oscillators (centered at 3420 $cm^{-1}$ whose $2^{nd}$ harmonics could cause an optical absorption between 1.445 and 1.479 µm) and SiO—H oscillators (centered at 3510 $^{-1}$ and whose $2^{nd}$ harmonics could cause an optical absorption between 1.408 and 1.441 µm) after an optimised thermal treatment in a nitrogen which can provide improved silica-based optical elements with reduced optical absorption in the 1.55 µm wavelength (and/or 1.30 wavelength) optical region without the residual stress-induced mechanical problems of deep-etched optical elements (mechanical movement of side-walls), without the residual stress-induced mechanical problems at the buffer/core or core/cladding interfaces (micro-structural defects, micro-voiding and separation) and without the residual stress-induced optical problems (polarisation dependant power loss).

Our co-pending pending patent application, Ser. No. 09/799,491 entitled Method Of Making A Functional Device With Deposited Layers Subject To High Temperature Anneal" describes a new improved technique involving the deposition of thick PECVD silica films on the back face of the silicon wafer in order to prevent the wafer warp problem following high temperature anneals and to achieve a stable manufacturing of high performance high temperature annealed PECVD optical silica films with lower polarisation dependence.

An object of the present invention is to an optimised process which allow the elimination of these residual stress-induced mechanical problems of deep-etched optical elements (mechanical movement of the side-walls), of these residual stress-induced mechanical problems at the buffer/core interface or at the core/cladding interface (micro-structural defects, micro-voiding and separation) and of these residual stress-induced optical problems (polarisation dependant power loss).

SUMMARY OF THE INVENTION

The invention allows an improvement in PECVD optical quality silica-based optical elements to be obtained using a commercially available PECVD system, such as the "Concept One" system manufactured by Novellus Systems in California, U.S.A, and a standard diffusion tube.

According to the present invention there is provided a method of making optical quality films, comprising the steps of depositing a first silica film on a wafer by PECVD (Plasma Enhanced Chemical Vapor Deposition); subjecting the wafer to a first heat treatment to reduce optical absorption, wafer warp, and compressive stress;

depositing a second silica film on the wafer by PECVD; and subsequently subjecting the wafer to a second heat treatment to reduce optical absorption, wafer warp and tensile stress.

The invention is typically applied to the fabrication of photonic devices, in which case the first layer can be a buffer layer and the second layer a core layer. The buffer layer is preferably applied symmetrically on the front and back faces of the wafer.

The method is preferably applied in conjunction with the methods described in our co-pending U.S. patent applications referred to herein, and which are all herein incorporated by reference.

In another aspect the invention provides a method of making a photonic device by PECDV (Plasma Enhanced Chemical Vapor Deposition) comprising depositing a thick first silica buffer layer on the back side of a wafer; depositing a thick silica buffer layer on the front side of said wafer; subjecting the wafer to a first heat treatment to reduce optical absorption, wafer warp, and compressive stress; depositing a silica core layer; subsequently to the previous step subecting the wafer to a second heat treatment to reduce optical absorption, wafer warp and tensile stress; and depositing a silica cladding layer on said silica core layer.

BRIEF DESCRIPTION OF THE DRAWINGS

The invention will now be described in more detail, by way of example, only with reference to the accompanying drawings, in which:

FIG. 1 shows various PECVD chemical reactions approaches and the reported method used to control the refractive index and to reduce the optical absorption of silica films;

FIG. 2 shows the FTIR fundamental infrared absorption peaks and their corresponding higher harmonics peaks associated with the residual compounds resulting from high temperature thermal treatments of PECVD silica-based optical components in a nitrogen ambient;

FIG. 10 shows the stress hysteresis of buffer (cladding) core in a nitrogen ambient using a 180 minutes stabilisation at 800° C.;

FIG. 11 shows SEM pictures of a grating and of a waveguide with quasi-vertical side-walls deep-etched through buffer and core;

FIG. 12 shows gradually sloped side-wall formation from the elastic strain of deep-etched buffer/core optical elements resulting from the (compressive stress Buffer)/(tensile stress Core) combination;

FIG. 13 shows side-wall angle measurements of neighboring a 5.0 μm wide deep-etched waveguide and 1150 μm wide deep-etched grating and the relative position between an isolated 5.0 μm wide deep-etched waveguide and its neighboring 1150 μm wide deep-etched grating at two different magnifications;

FIG. 14 shows how the interfacial stress relief of the shear stress building at the buffer/core or core/cladding interfaces results in a noticeable modification of the micro-structure of these interfaces;

FIG. 15 shows the interfacial stress relief of the shear stress building at the buffer/core or core/cladding interfaces results in an important modification of the micro-structure and in the formation of micro-voids in Core and near these interfaces;

FIG. 18h); FIG. 18i).

DETAILED DESCRIPTION OF THE PREFERRED EMBODIMENTS

Figure 3A:
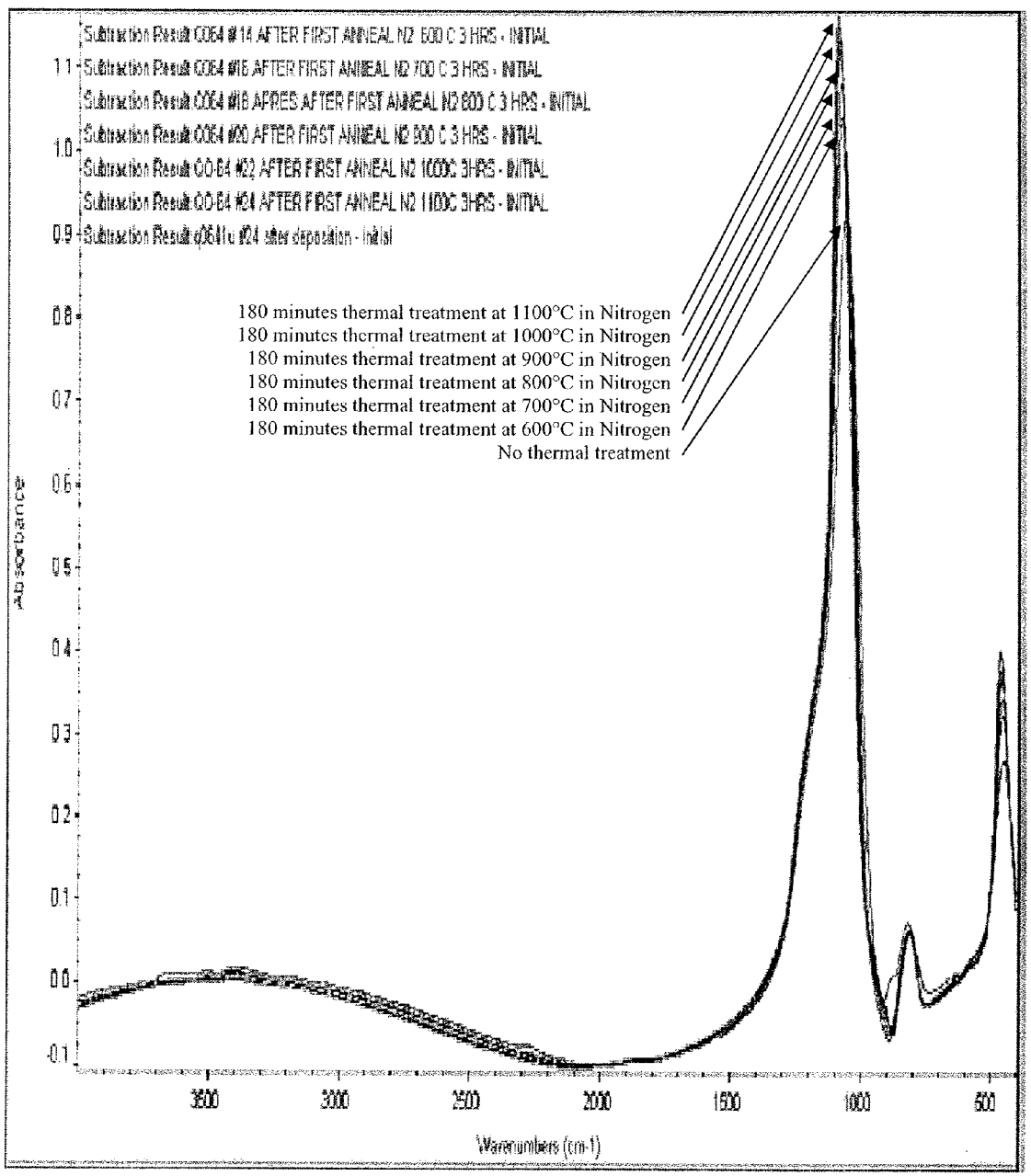
FIG. 3a shows the basic FTIR spectra of various buffers (claddings) obtained with a typical PECVD process after a 180 minutes thermal treatment in a nitrogen ambient at various temperatures.

FIG. 2 lists some FTIR fundamental infrared absorption peaks and their corresponding higher harmonics peaks associated with the various residual compounds resulting the Plasma Enhanced Chemical Vapour Deposition (PECVD) of buffer (cladding) from a silane (SiH$_4$) and nitrous oxide (N$_2$O) gas mixture at a relatively low temperature of 400° C. using the following reaction:

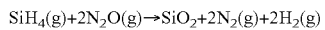

$$SiH_4(g)+2N_2O(g) \rightarrow SiO_2+2N_2(g)+2H_2(g)$$

and following high temperature thermal treatments in a nitrogen ambient. It is very clear from this FIG. 2 that the FTIR fundamental infrared absorption peaks and their corresponding higher harmonics peaks associated of the residual compounds resulting from high temperature thermal treatments of PECVD silica films in a nitrogen ambient will contribute to the optical absorption in the 1.30 to 1.55 μm optical bands:

The second vibration harmonics of the HO—H oscillators in trapped water vapour in the micro-pores of the silica films (3550 to 3750 cm$^{-1}$) increases the optical absorption near 1.333 to 1.408 µm. The second vibration harmonics of the SiO—H oscillators in the silica films (3470 to 3550 cm$^{-1}$) increases the optical absorption near 1.408 to 1.441 µm. The second vibration harmonics of the Si:N—H oscillators in the silica films (3300 to 3460 cm$^{-1}$) increases the optical absorption near 1.445 to 1.515 µm. The second vibration harmonics of the SiN—H oscillators in the silica films (3380 to 3460 cm$^{-1}$) increases the optical absorption near 1.445 to 1.479 µm. The third vibration harmonics of the Si—H oscillators in the silica films (2210 to 2310 cm$^{-1}$) increases the optical absorption near 1.443 to 1.505 µm. The fourth vibration harmonics of the Si═O oscillators in the silica films (1800 to 1950 cm$^{-1}$) increases the optical absorption near 1.282 to 1.389 µm. The fifth vibration harmonics of the N═N oscillators in the silica films (1530 to 1580 cm$^{-1}$) increases the optical absorption near 1.266 to 1.307 µm.

The negative effects of these oscillators on the optical properties of silica-based optical components are reported in the literature: Grand G., Low-loss PECVD silica channel waveguides for optical communications, Electron. Lett., 26 (25), 2135, 1990; Bruno F., Plasma-enhanced chemical vapor deposition of low-loss SiON optical waveguides at 1.5-µm wavelength, Applied Optics, 30 (31), 4560, 1991; Imoto K., High refractive index difference and low loss optical waveguide fabricated by low temperature processes, Electronic Letters, 29 (12), 1993; Hoffmann M., Low temperature, nitrogen doped waveguides on silicon with small core dimensions fabricated by PECVD/RIE, ECIO'95, 299, 1995; Bazylenko M., Pure and fluorine-doped silica films deposited in a hollow cathode reactor for integrated optic applications, J. Vac. Sci. Technol. A 14 (2), 336, 1996; Pereyra I., High quality low temperature DPECVD silicon dioxide, J. Non-Crystalline Solids, 212, 225, 1997; Kenyon T., A luminescence study of silicon-rich silica and rare-earth doped silicon-rich silica, Electrochem. Soc. Proc. Vol. 97-11, 304, 1997; Alayo M., Thick SiOxNy and SiO2 films obtained by PECVD technique at low temperatures, Thin Solid Films, 332, 40, 1998; Germann R., Silicon-oxynitride layers for optical waveguide applications, 195$^{th}$ meeting of the Electrochemical Society, 99-1, May 1999, Abstract 137, 1999; Worhoff K., Plasma enhanced chemical vapor deposition silicon oxynitride optimized for application in integrated optics, Sensors and Actuators, 74, 9, 1999.

This literature describes the tentative elimination of optical absorption (i.e. of the six residual oscillators) using the discussed thermal decomposition reactions during thermal treatments under a nitrogen ambient at a maximum temperature lower than 1350° C., the fusion point of the silicon wafer.

Figure 4A:
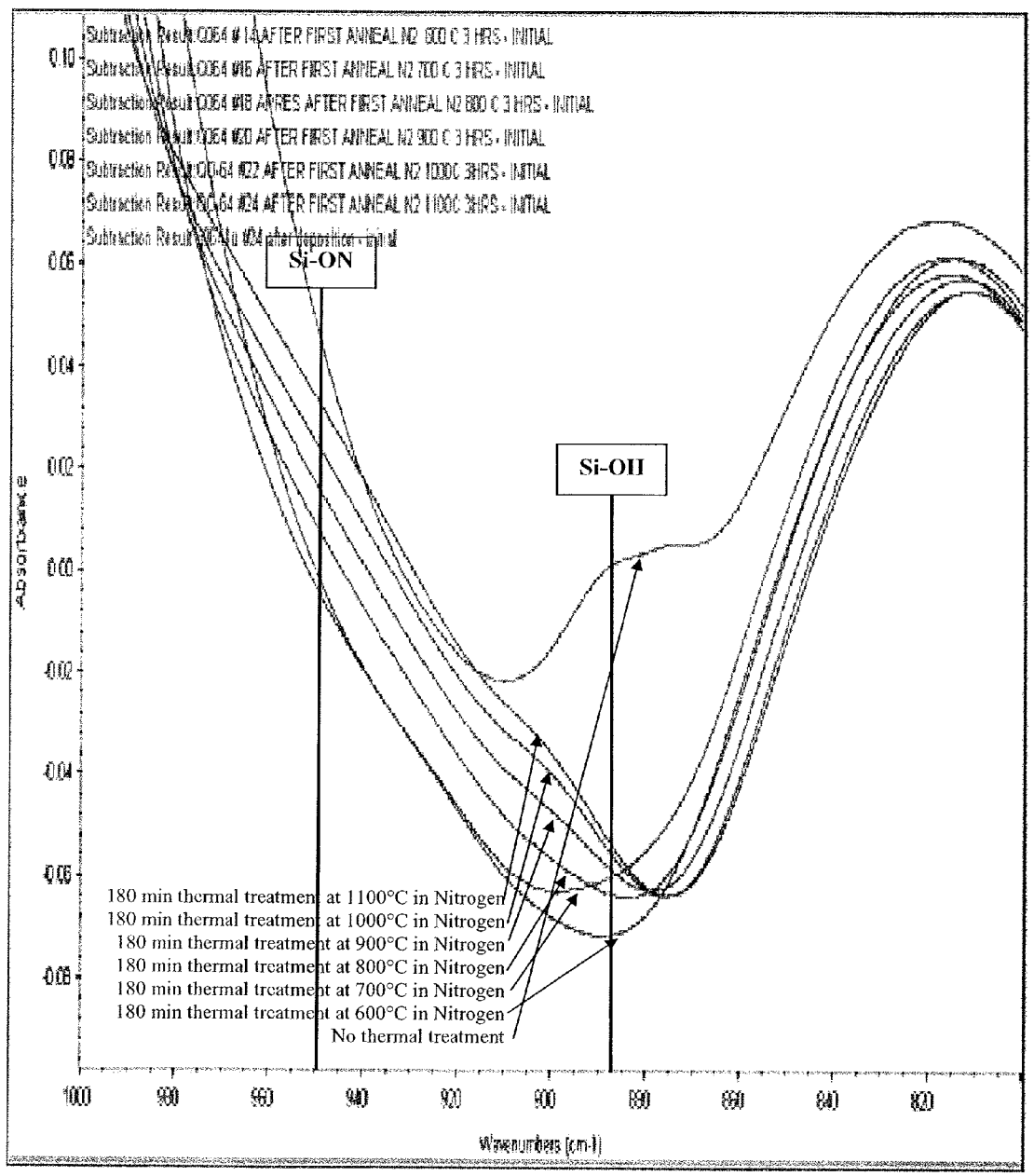
FIG. 4a shows the in-depth FTIR spectra from 810 to 1000 $cm^{-1}$ of various buffers (claddings) obtained with a typical PECVD process after a 180 minutes thermal treatment in a nitrogen ambient at various temperatures.
Figure 6A:
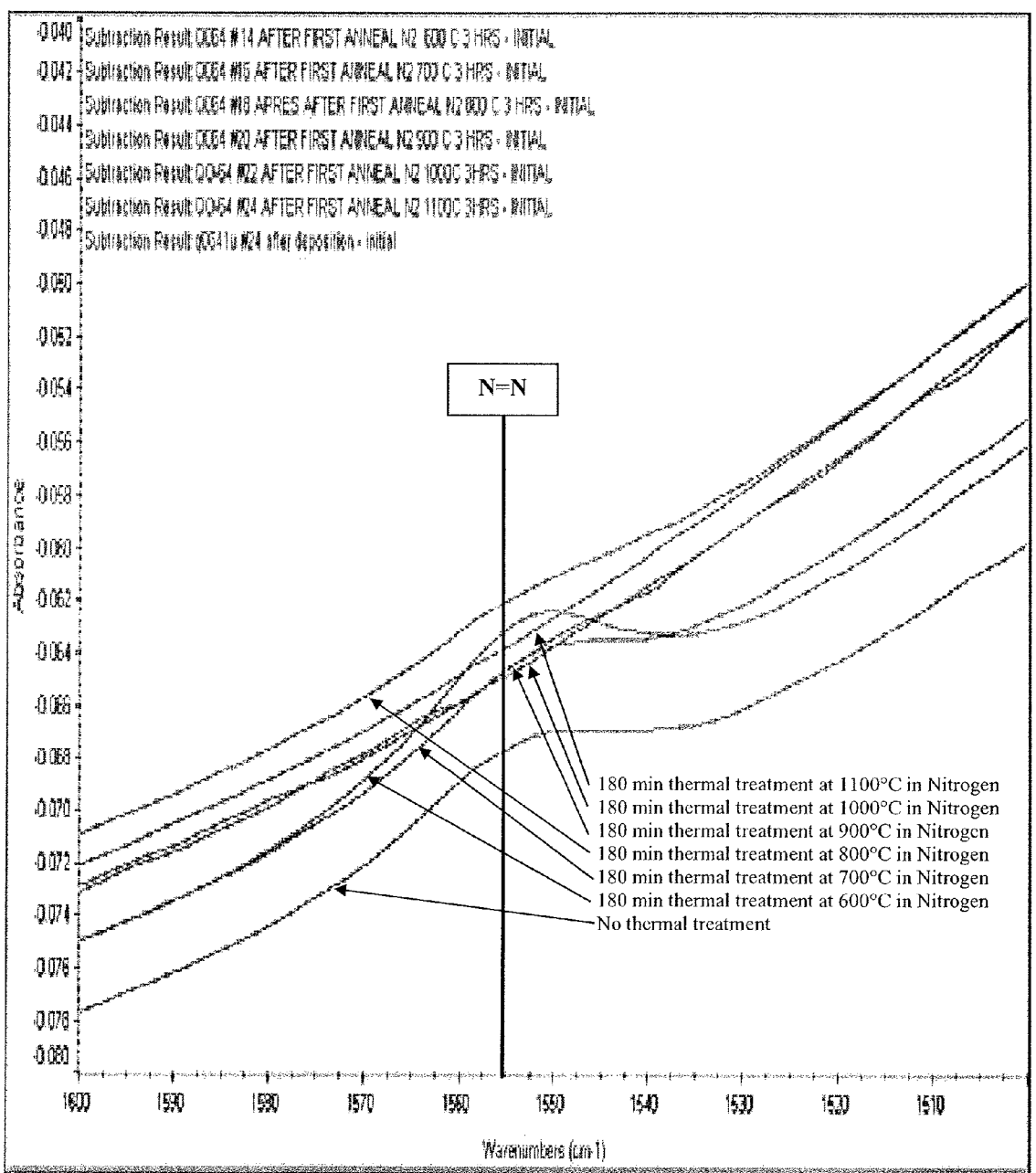
FIG. 6a shows the in-depth FTIR spectra from 1500 to 1600 $cm^{-1}$ of various Buffers (Clads) obtained with a typical PECVD process after a 180 minutes thermal treatment in a nitrogen ambient at various temperatures.
Figure 7A:
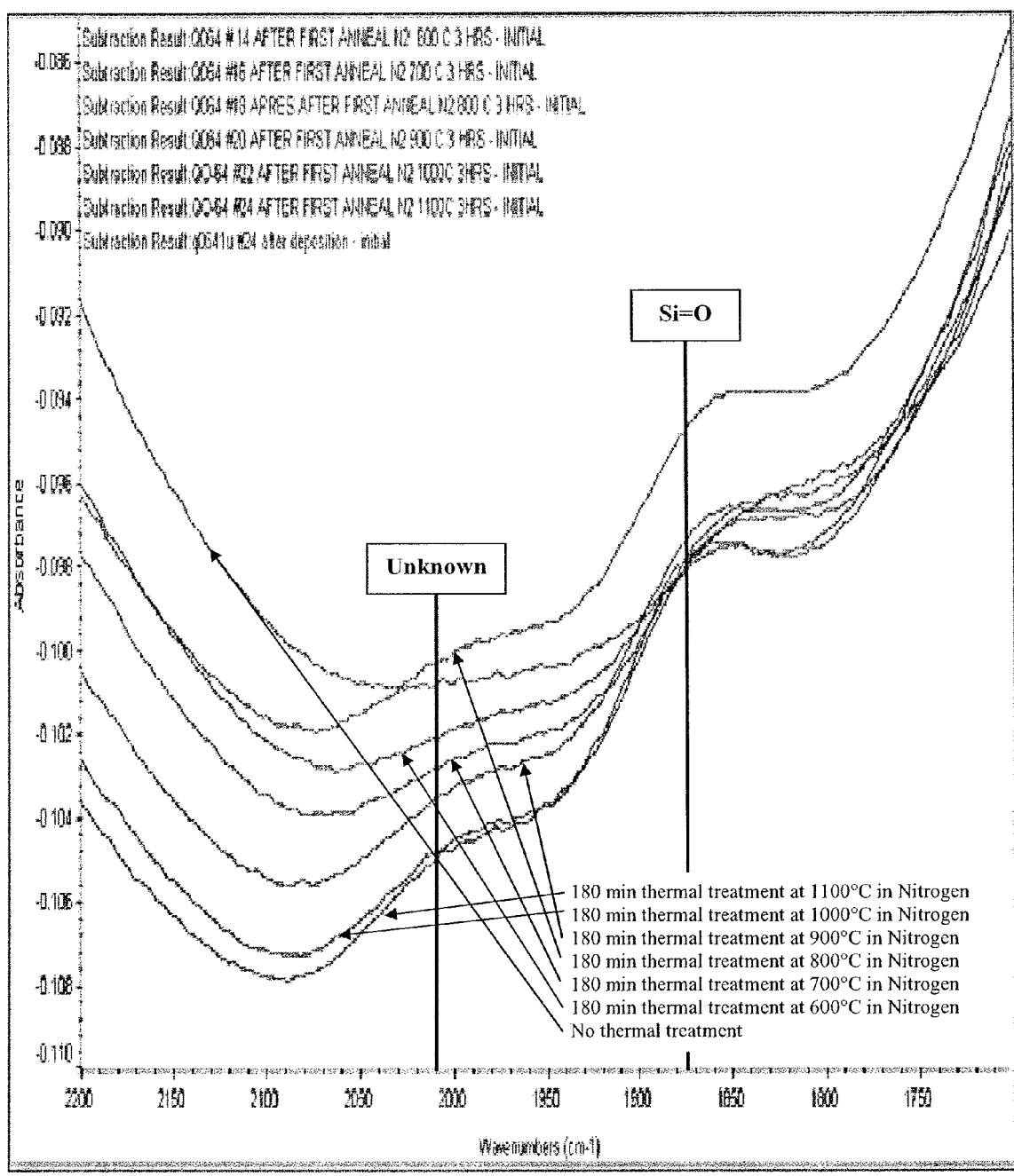
FIG. 7a shows the in-depth FTIR spectra from 1700 to 2200 $cm^{-1}$ of various Buffers (Clads) obtained with a typical PECVD process after a 180 minutes thermal treatment in a nitrogen ambient at various temperatures.

Optical Absorption of Typical PECVD Buffer (Cladding) Following a 180 Minutes Thermal Treatment in a Nitrogen Ambient at Various High Temperatures FIG. 3a, FIG. 4a, FIG. 6a, FIG. 7a, FIG. 8a and FIG. 9a show the FTIR spectra of typically deposited PECVD silica films before and after a 180 minutes long high temperature thermal treatment in a nitrogen ambient at a temperature of either 600, 700, 800, 900, 1000 or 1100° C. It is clear that the higher the thermal decomposition temperature of the high temperature thermal treatment in a nitrogen ambient, the better the basic FTIR spectra of the treated silica films:

FIG. 3a shows the expected gradually more intense and smaller FWHM Si—O—Si "rocking mode" absorption peak (centred at 460 cm$^{-1}$) and Si—O—Si "in-phase-stretching mode" absorption peak (centred at 1080 cm$^{-1}$) as the temperature of the 180 minutes long thermal treatment in a nitrogen ambient is increased from 600° C. to 1100° C.;

FIG. 4a shows that the elimination of the Si—OH oscillators (centered at 885 cm$^{-1}$) is easy and already complete after the 180 minutes long thermal treatment in a nitrogen ambient at 600° C. FIG. 4a also shows that the elimination of the Si—ON oscillators (centred at 950 cm$^{-1}$) is much more difficult and that the higher the temperature of the 180 minutes long thermal treatment in a nitrogen ambient, the more nitrogen incorporation as Si—ON oscillators (i.e. as SiONH and/or SiON$_2$ compounds);

FIG. 6a shows that the elimination of the N═N oscillators (centered at 1555 cm$^{-1}$) is also very difficult and does require the temperature of the high temperature thermal treatment in a nitrogen ambient to reach 1000° C.;

FIG. 7a shows that there is very little influence of the temperature of the high temperature thermal treatment in a nitrogen ambient on the Si═O oscillators (centered at 1875 cm$^{-1}$) and on the unknown oscillator (centered at 2010 cm$^{-1}$).

Figure 8A:
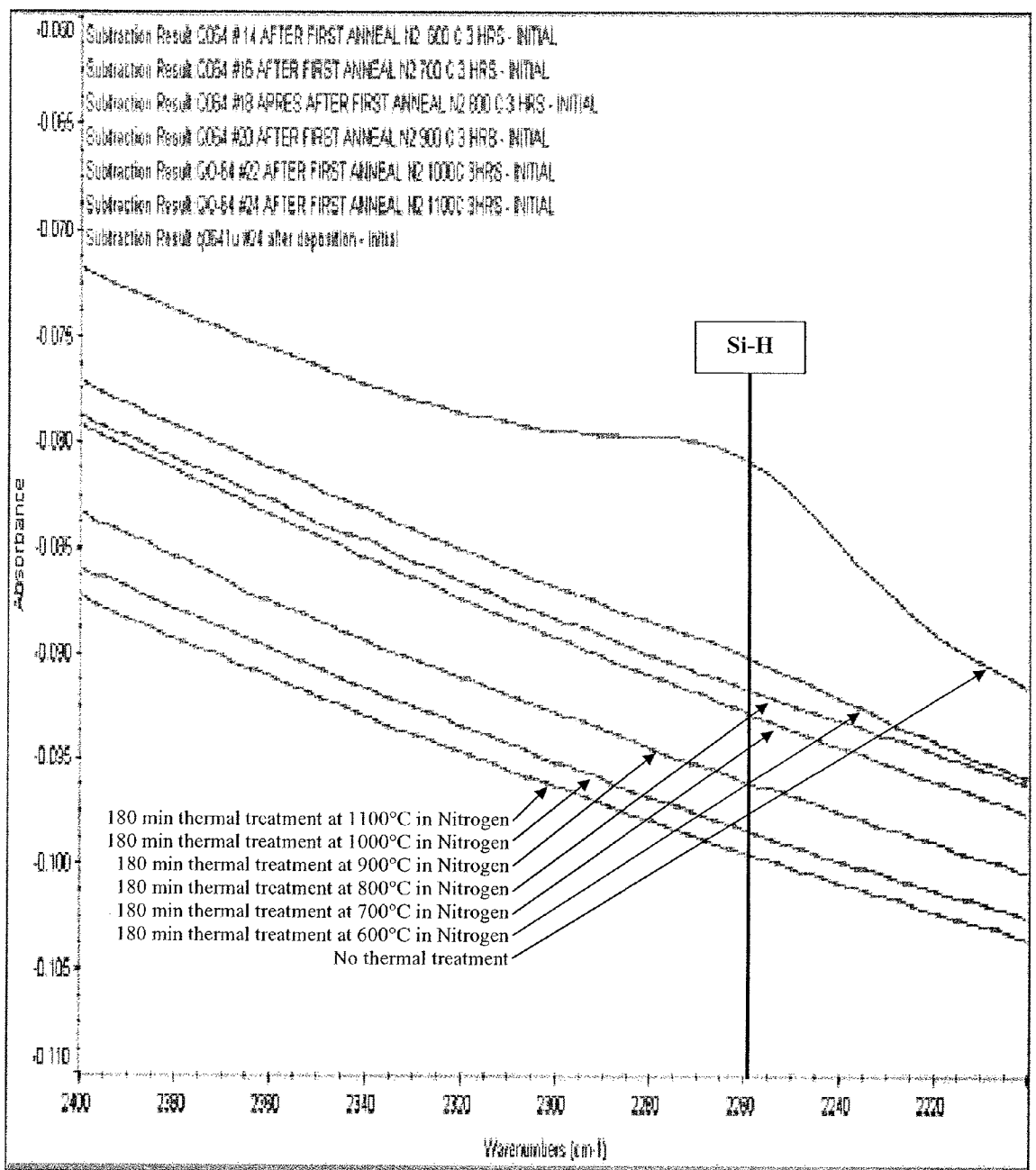
FIG. 8a shows the in-depth FTIR spectra from 2200 to 2400 cm$^{-1}$ of various Buffers (Clads) obtained with a typical PECVD process after a 180 minutes thermal treatment in a nitrogen ambient at various temperatures.

FIG. 8a shows that the elimination of the Si—H oscillators (centered at 2260 cm$^{-1}$ and which 3$^{rd}$ harmonics could cause an optical absorption between 1.443 and 1.508 µm) is easy and already complete after the 180 minutes long thermal treatment in a nitrogen ambient at 600° C.

Figure 9A:
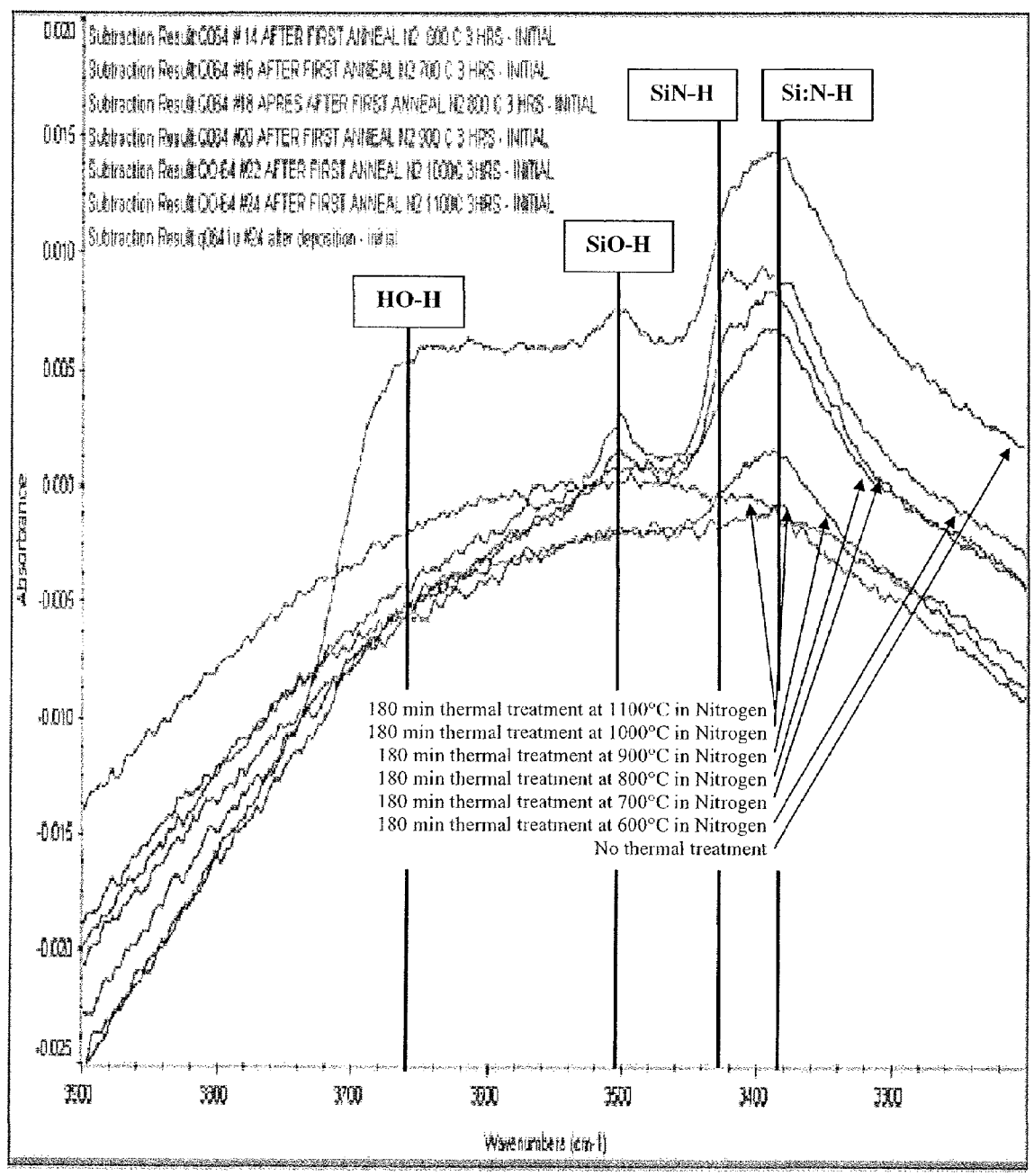
FIG. 9a shows the in-depth FTIR spectra from 3200 to 3900 cm$^{-1}$ of various Buffers (Clads) obtained with a typical PECVD process after a 180 minutes thermal treatment in a nitrogen ambient at various temperatures.

FIG. 9a shows that the elimination of the Si:N—H oscillators (centered at 3380 cm$^{-1}$ whose 2$^{nd}$ harmonics could cause an optical absorption between 1.445 and 1.515 µm) is also very difficult and does require the temperature of the high temperature thermal treatment in a nitrogen ambient to reach 1100° C. The complete elimination of the Si:N—H oscillators is highly difficult because the nitrogen atoms of these oscillators are bonded to the silicon atoms of the SiO2 network via two covalent bonds. FIG. 9a also shows that the elimination of the SiN—H oscillators (centered at 3420 cm$^{-1}$ whose 2$^{nd}$ harmonics could cause an optical absorption between 1.445 and 1.479 µm) is almost as difficult and does require the temperature of the high temperature thermal treatment in a nitrogen ambient to reach 1000° C. FIG. 9a also shows that the elimination of the SiO—H oscillators (centered at 3510 cm$^{-1}$ and whose 2$^{nd}$ harmonics could cause an optical absorption between 1.408 and 1.441 µm) is slightly easier and does require the temperature of the high temperature thermal treatment in a nitrogen ambient to reach 900° C. Finally, FIG. 9a also shows that the elimination of the HO—H oscillators (centered at 3650 cm$^{-1}$ and whose 2$^{nd}$ harmonics could cause an optical absorption between 1.333 and 1.408 µm) is very easy since already complete after the high temperature thermal treatment in a nitrogen ambient of only 600° C.

It is clear from the various FTIR spectra that it is necessary to use extremely high temperature thermal treatments in a nitrogen ambient in order to eliminate the residual optical absorption of typically deposited PECVD silica films. In particular, it is demonstrated that the elimination of the residual nitrogen and hydrogen of typically deposited PECVD silica films is very difficult since: the residual Si:N—H oscillators (whose 2$^{nd}$ harmonics could cause an optical absorption between 1.445 and 1.515 µm) does require a temperature of 1100° C. because the nitrogen atoms of these oscillators are bonded to the silicon atoms of the SiO2 network via two covalent bonds; the elimination of the SiN—H oscillators (whose 2$^{nd}$ harmonics could cause an optical absorption between 1.445 and 1.479 µm) does require a temperature of 1000° C.; the elimination of the SiO—H oscillators (whose 2$^{nd}$ harmonics could cause an optical absorption between 1.408 and 1.441 µm) does require a temperature of 900° C.

It is then very difficult to achieve high optical quality silica-based optical components from typically deposited PECVD silica films using thermal treatments in nitrogen ambient at temperatures lower than 1100° C.

Optical Absorption of PECVD Buffer (Cladding) Deposited by the Technique Described in Co-pending patent application 'Ser. No. 09/833,711 Following a 180 Minutes Thermal Treatment in a Nitrogen Ambient at a Reduced Temperature of 800° C.

This patent application describes a new improved Plasma Enhanced Chemical Vapour Deposition technique of buffer (cladding) which shows that the independent control of the $SiH_4$, $N_2O$ and $N_2$ gases as well as of the total deposition pressure via an automatic control of the pumping speed of the vacuum pump in a five-dimensional space, namely: the first independent variable, the $SiH_4$ gas flow, being fixed at 0.20 std litre/min; the second independent variable, the $N_2O$ gas flow, being fixed at 6.00 std litre/min; the third independent variable, the $N_2$ gas flow, being fixed at 3.15 std litre/min; the fourth independent variable, the total deposition pressure, being 2.00 Torr, 2.10 Torr, 2.20 Torr, 2.30 Torr, 240 Torr, 2.50 Torr, or 2.60 Torr.

The fifth dimension is the observed FTIR characteristics of various buffers (claddings), as reported in: FIG. 3b, FIG. 4b, FIG. 6b, FIG. 7b, FIG. 8b and FIG. 9b.

These dimensions permit the elimination of these residual nitrogen and hydrogen atoms as to achieve high optical quality silica-based optical components from typically deposited PECVD silica films a 180 minutes thermal treatment in a nitrogen ambient at a reduced temperature of 800° C.

FIG. 3b, FIG. 4b, FIG. 6b, FIG. 7b, FIG. 8b and FIG. 9b show the FTIR spectra of PECVD silica films deposited using a commercially available PECVD system, the "Concept One" system manufactured by Novellus Systems in California, U.S.A, using the fixed flow rates of silane ($SiH_4$), of nitrous oxide ($N_2O$) and of nitrogen ($N_2O$), as described in our co-pending patent application Ser. No. 09/833,711. These spectra are obtained before and after a 180 minutes thermal treatment in a nitrogen ambient at a reduced temperature of 800° C. in a standard diffusion tube. It is clear that this technique allows the achievement of high optical quality silica films after a 180 minutes thermal treatment in a nitrogen ambient at a reduced temperature of 800° C. and that the independent control of the downstream pressure of this improved PECVD deposition technique has a major effect on the FTIR spectra of the treated silica films.

Figure 3B:
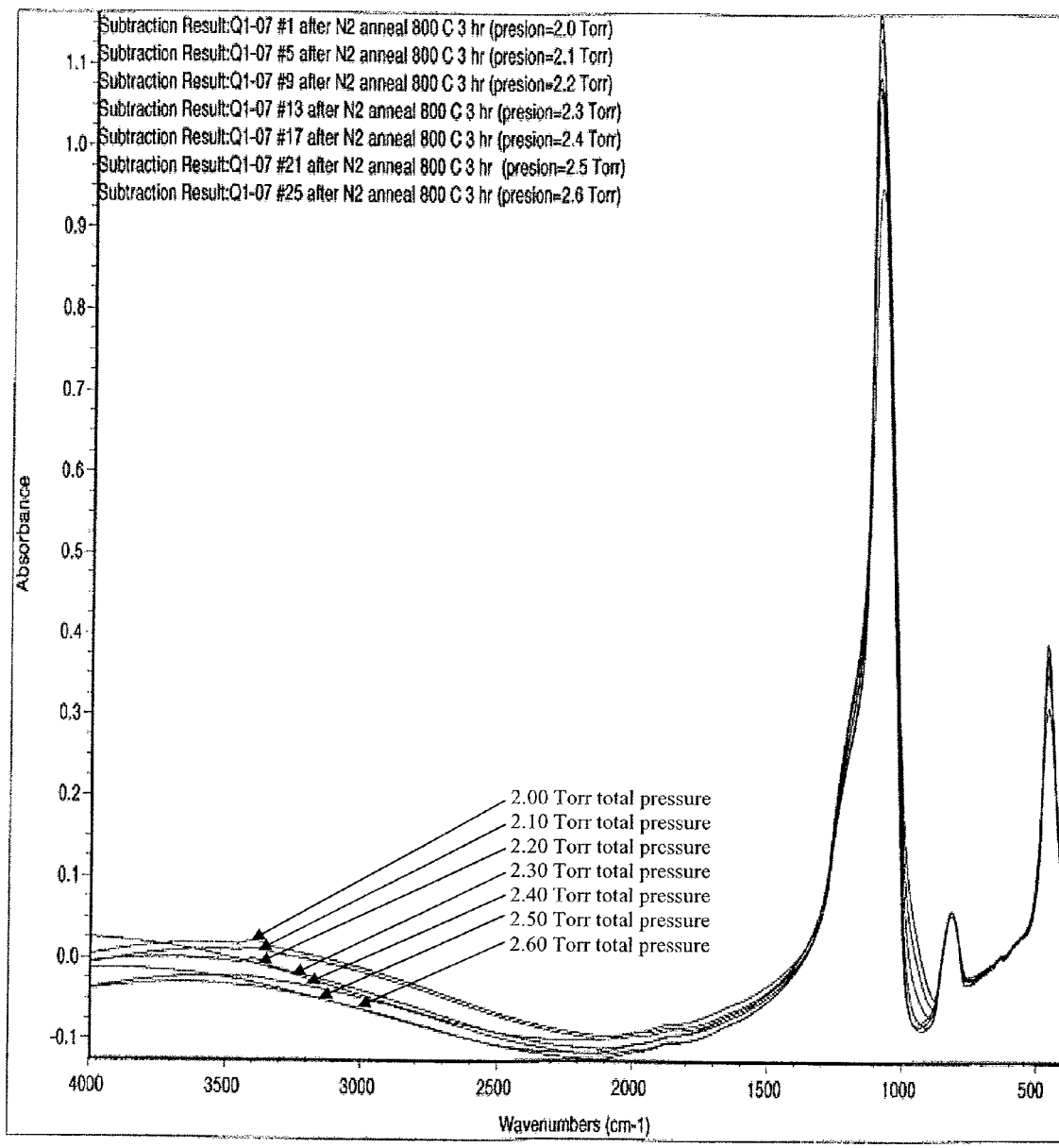
FIG. 3b shows the basic FTIR spectra of various buffers (claddings) obtained with the PECVD deposition technique described in our co-pending patent application Ser. No. 09/833,711 and after a thermal treatment in a nitrogen ambient at 800° C.

FIG. 3b shows a more intense and smaller FWHM Si—O—Si "rocking mode" absorption peak (centred at 460 $cm^{-1}$) and Si—O—Si "in-phase-stretching mode" absorption peak (centred at 1080 $cm^{-1}$) as the total deposition pressure is increased from 2.00 Torr to 2.40 Torr followed by a slight degradation as the pressure is increased further more up to 2.60 Torr.

Figure 4B:
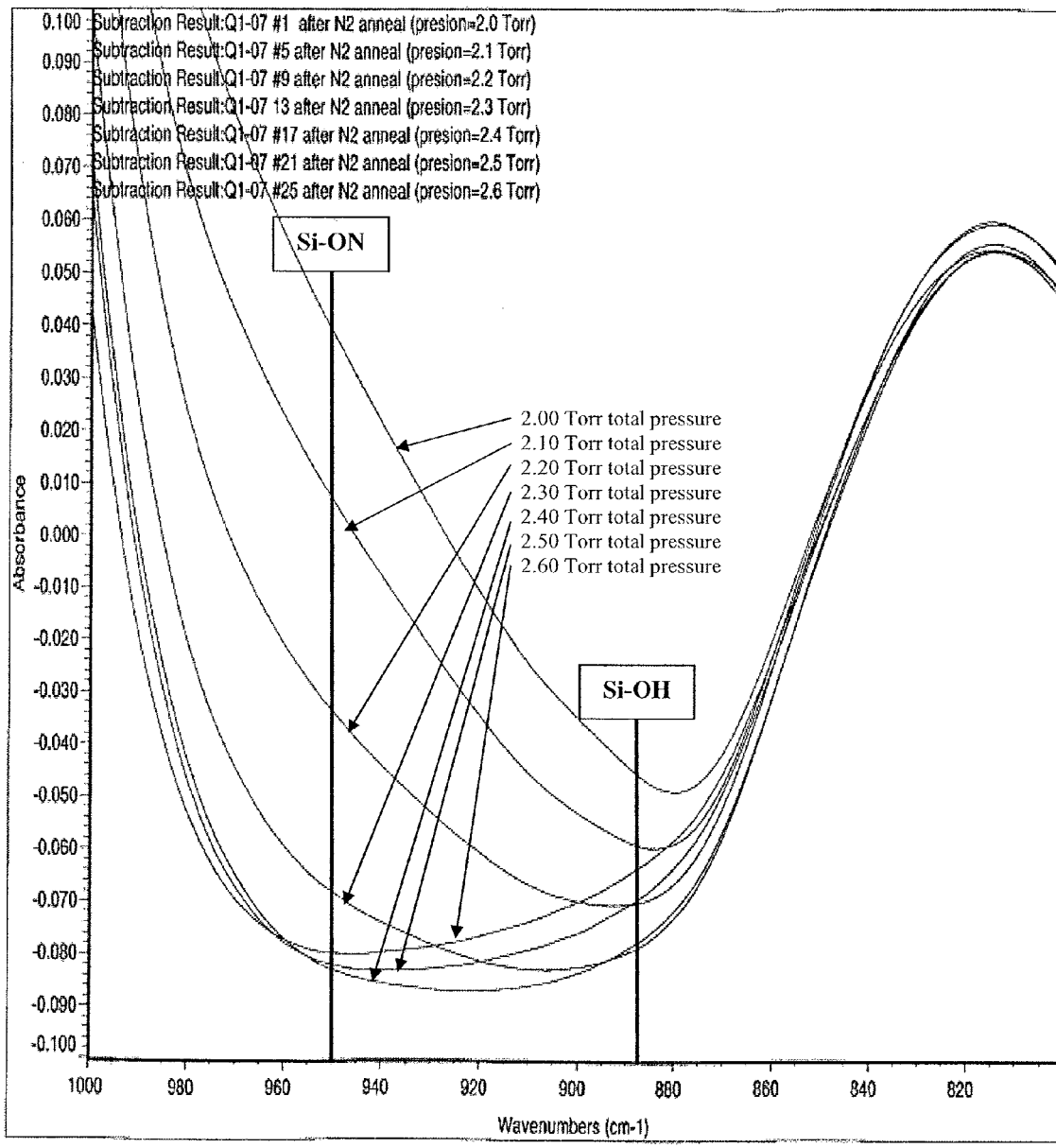
FIG. 4b shows the in-depth FTIR spectra from 810 to 1000 $cm^{-1}$ of various Buffers (Clads) obtained with the PECVD deposition technique described in our pending patent application Ser. No. 09/833,711 after a thermal treatment in a nitrogen ambient at 800° C.

FIG. 4b shows the gradual elimination of the Si—OH oscillators (centered at 885 $cm^{-1}$) as the total deposition pressure is increased from 2.00 Torr up to the optimum pressure of 2.40 Torr followed by a slight degradation as the pressure is increased further more up to 2.60 Torr. FIG. 4b also shows the gradual elimination of the Si—ON oscillators (centred at 950 $cm^{-1}$) as the total deposition pressure is increased from 2.00 Torr to 2.40 Torr followed by a slight degradation as the pressure is increased further more up to 2.60 Torr. The optimum separation and deep valley observed at 2.40 Torr is an indication that the silica films resulting from this optimum deposition pressure are composed of high quality $SiO_2$ material. This contrasts with the upper-mentioned results of typical PECVD silica films which still incorporate a lot of Si—ON oscillators even after much higher temperature thermal treatments in a nitrogen ambient.

Figure 6B:
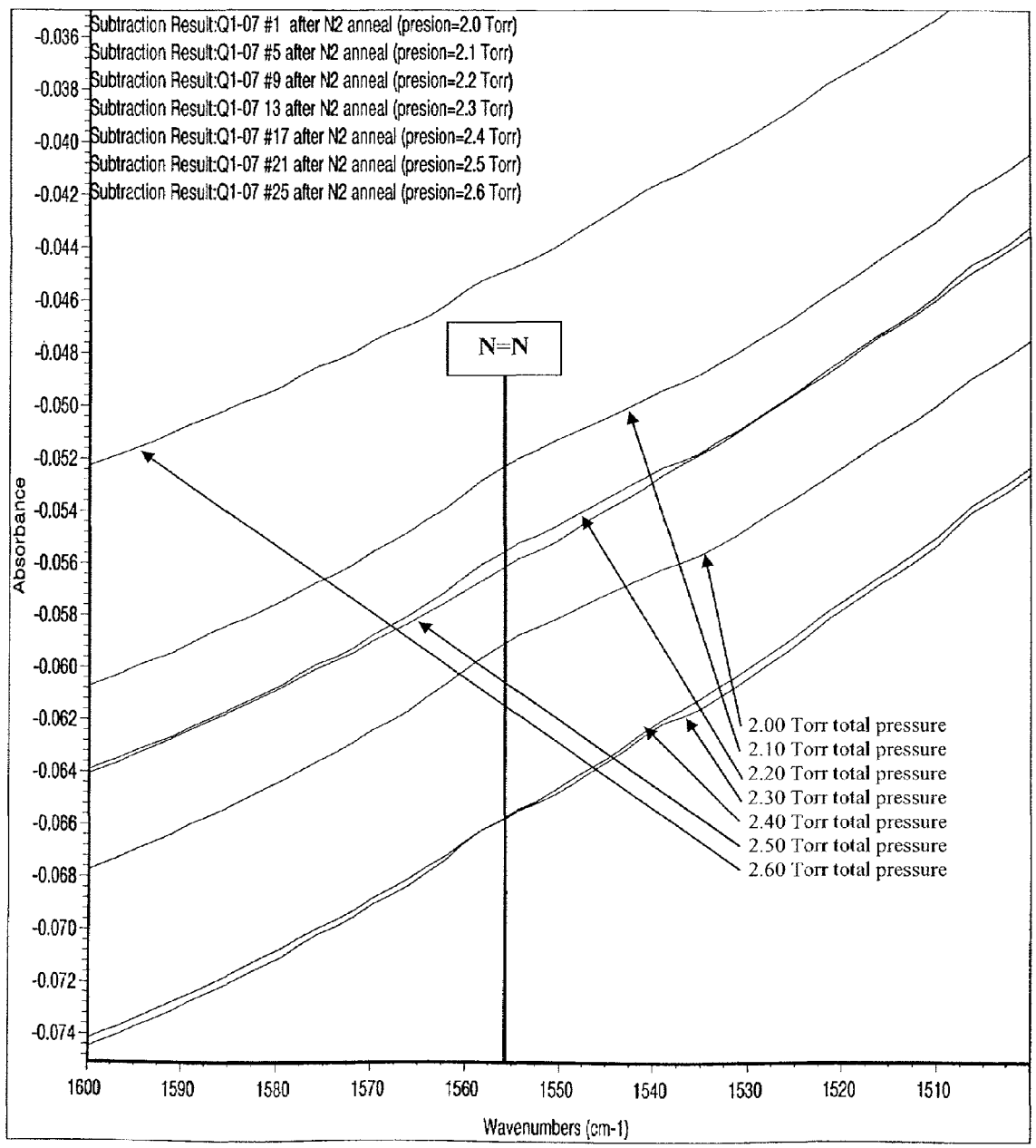
FIG. 6b shows the in-depth FTIR spectra from 1500 to 1600 $cm^{-1}$ of various Buffers (Clads) obtained with the PECVD deposition technique described in our pending patent application Ser. No. 09/833,711 after a thermal treatment in a nitrogen ambient at 800° C.

FIG. 6b shows the gradual and total elimination of the N=N oscillators (centered at 1555 $cm^{-1}$) as the total deposition pressure is increased from 2.00 Torr to 2.60 Torr. This also contrasts with the upper-mentioned results of typical PECVD silica films which require a 180 minutes thermal treatment in a nitrogen ambient at a temperature of 1000° C. in order to achieve similar results.

Figure 7B:
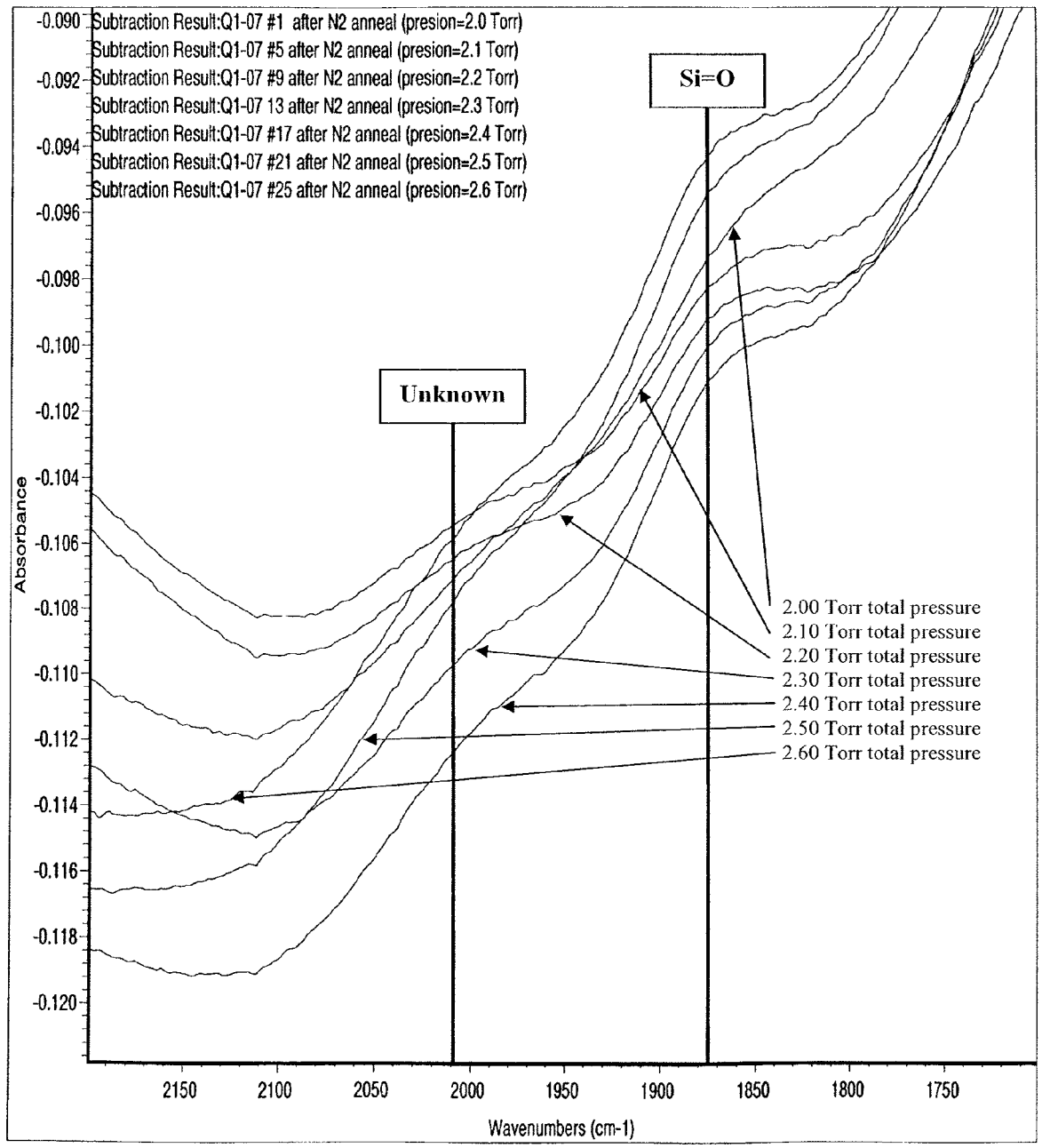
FIG. 7b shows the in-depth FTIR spectra from 1700 to 2200 $cm^{-1}$ of various Buffers (Clads) obtained with the PECVD deposition technique described in our pending patent application Ser. No. 09/833,711 after a thermal treatment in a nitrogen ambient at 800° C.

FIG. 7b shows the gradual elimination of the Si=O oscillators (centered at 1875 $cm^{-1}$) and on the unknown oscillator (centered at 2010 $cm^{-1}$) as the total deposition pressure is increased from 2.00 Torr to 2.40 Torr followed by a slight degradation as the pressure is increased further more up to 2.60 Torr. These effects are not that important since only the fourth harmonics of the Si=O oscillators could absorb in the 1.30 to 1.55 μm optical bands.

Figure 8B:
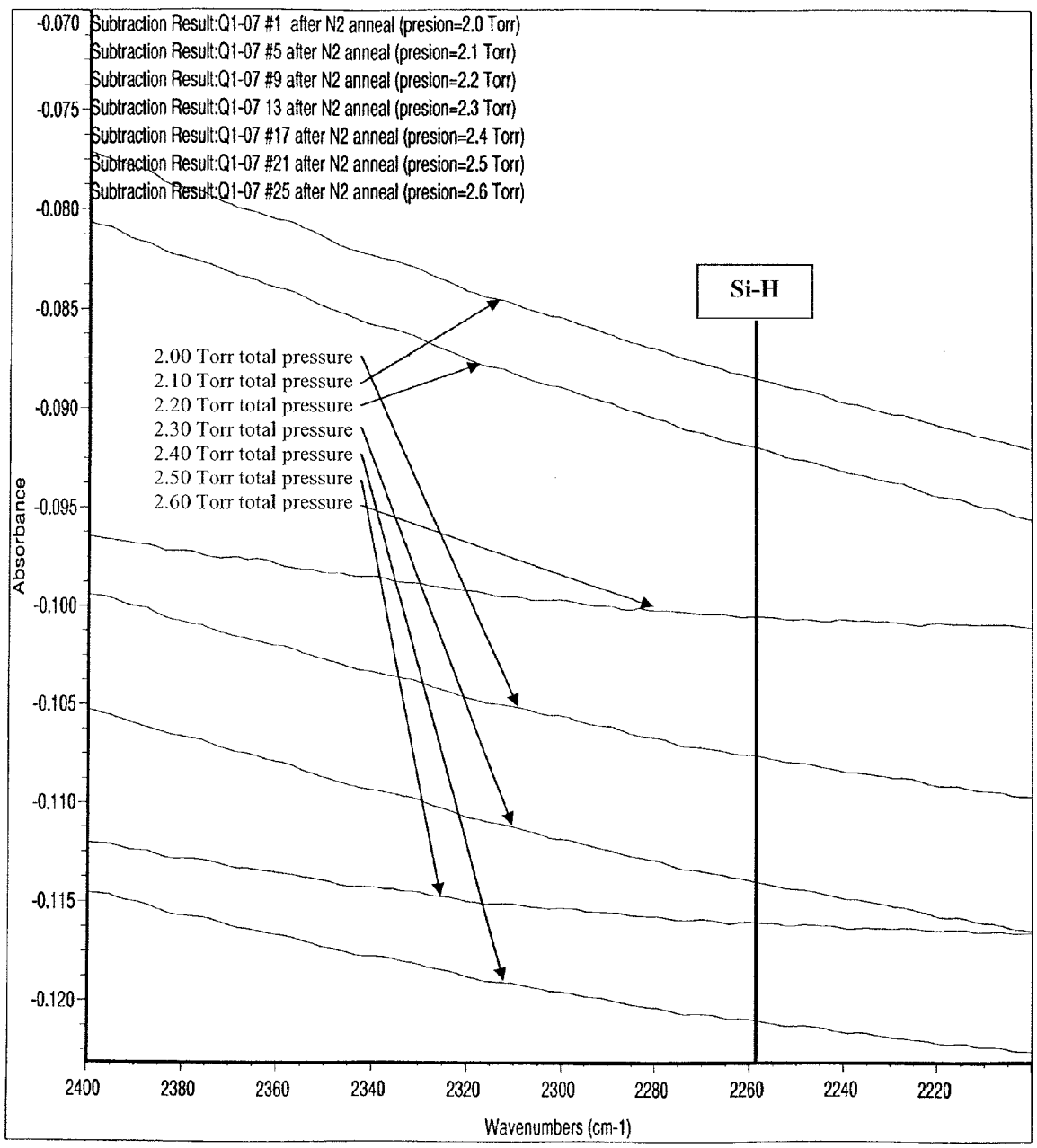
FIG. 8b shows the in-depth FTIR spectra from 2200 to 2400 cm$^{-1}$ of various Buffers (Clads) obtained with the PECVD deposition technique described in our pending patent application Ser. No. 09/833,711 after a thermal treatment in a nitrogen ambient at 800° C.

FIG. 8b shows that the Si—H oscillators (centered at 2260 $cm^{-1}$ and which $3^{rd}$ harmonics could cause an optical absorption between 1.443 and 1.508 μm) are completely eliminated for all deposition pressures.

Figure 9B:
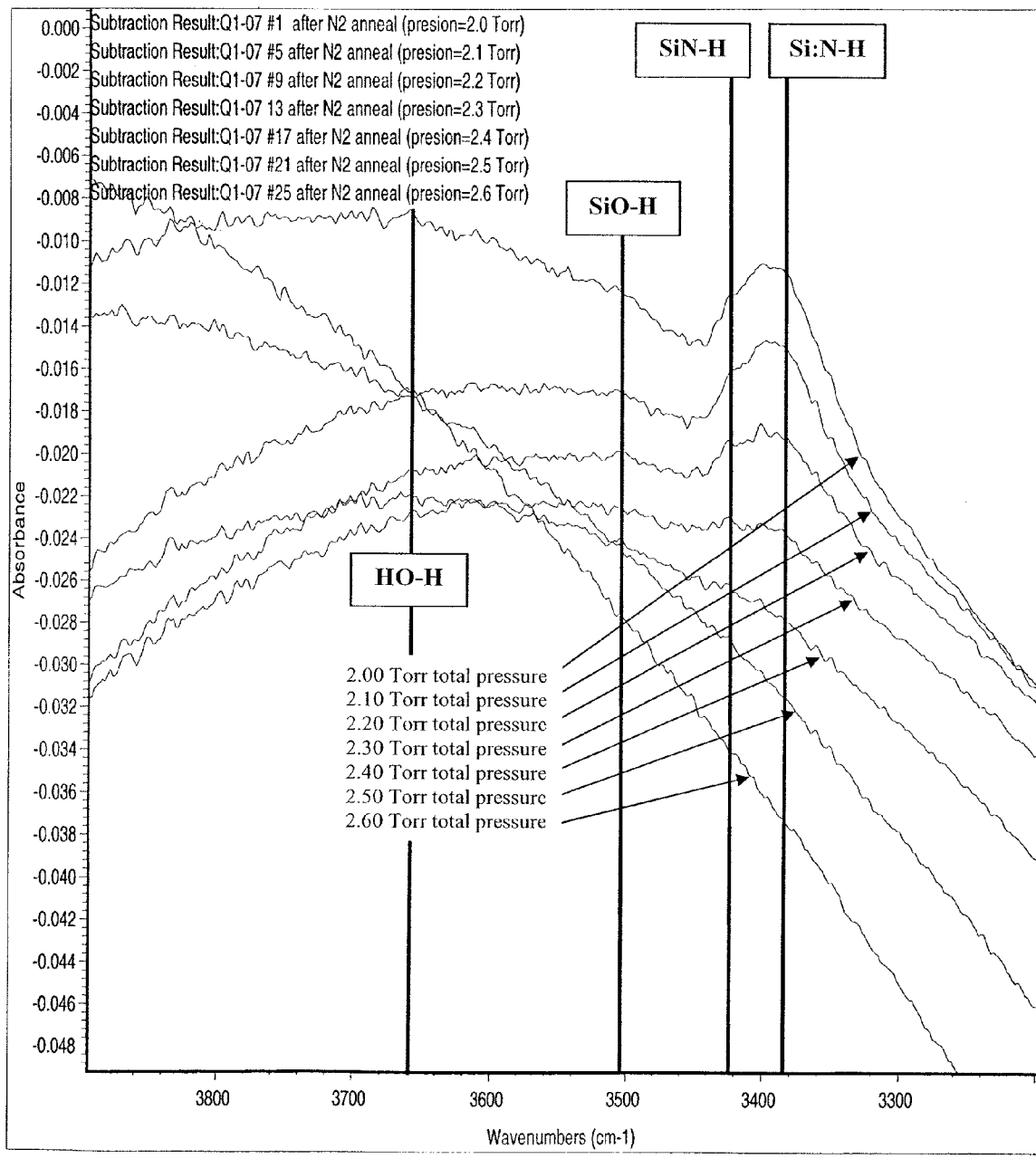
FIG. 9b shows the in-depth FTIR spectra from 3200 to 3900 cm$^{-1}$ of various Buffers (Clads) obtained with the PECVD deposition technique described in our pending patent application Ser. No. 09/833,711 after a thermal treatment in a nitrogen ambient at 800° C.

FIG. 9b shows the spectacular gradual elimination of the Si:N—H oscillators (centered at 3380 $cm^{-1}$ whose $2^{nd}$ harmonics could cause an optical absorption between 1.445 and 1.515 μm) as the total deposition pressure is increased from 2.00 Torr to 2.60 Torr. This contrasts with the upper-mentioned results of typical PECVD silica films which require a thermal treatment in a nitrogen ambient at a temperature of 1100° C. in order to achieve similar results. FIG. 9b also shows a spectacular gradual elimination of the SiN—H oscillators (centered at 3420 $cm^{-1}$ whose $2^{nd}$ harmonics could cause an optical absorption between 1.445 and 1.479 μm) as the total deposition pressure is increased from 2.00 Torr to 2.60 Torr. This also contrasts with the upper-mentioned results of typical PECVD silica films which require a thermal treatment in a nitrogen ambient at a temperature of 1000° C. in order to achieve similar results. FIG. 9b also shows that the SiO—H oscillators (centered at 3510 $cm^{-1}$ and whose $2^{nd}$ harmonics could cause an optical absorption between 1.408 and 1.441 μm) are completely eliminated for all deposition pressures. This also contrasts with the upper-mentioned results of typical PECVD silica films which require a thermal treatment in a nitrogen ambient at a temperature of 900° C. in order to achieve similar results. Finally, FIG. 9b also shows that the elimination of the HO—H oscillators (centered at 3650 $cm^{-1}$ and whose $2^{nd}$ harmonics could cause an optical absorption between 1.333 and 1.408 μm) are completely eliminated for all deposition pressures.

It is clear from the various FTIR spectra that the technique described in this co-pending patent application avoids the need for extremely high temperature thermal treatments in a nitrogen ambient in order to eliminate the residual optical absorption of typically deposited PECVD silica films. In particular, it is demonstrated that the elimination of the residual nitrogen and hydrogen of typically deposited PECVD silica films is completely achieved after a 180 minutes thermal treatment in a nitrogen ambient at a reduced temperature of 800° C.:

The residual Si:N—H oscillators (whose $2^{nd}$ harmonics could cause an optical absorption between 1.445 and 1.515 μm) are completely eliminated as the total deposition pressure is increased from 2.00 Torr to 2.60 Torr;

The residual SiN—H oscillators (whose $2^{nd}$ harmonics could cause an optical absorption between 1.445 and 1.479 μm) are also completely eliminated as the total deposition pressure is increased from 2.00 Torr to 2.60 Torr;

The residual SiO—H oscillators (whose $2^{nd}$ harmonics could cause an optical absorption between 1.408 and 1.441 pm) are also completely eliminated as the total deposition pressure is increased from 2.00 Torr to 2.60 Torr.

It is then very easy to achieve high optical quality buffer (cladding) after a 180 minutes thermal treatment in a nitrogen ambient at a reduced temperature of 800° C. if we use the technique described in our patent pending application 'Plasma Enhanced Chemical Vapour Deposition of low optical absorption silica films for Mux/Dmux optical devices'.

Optical Absorption of PECVD Core Deposited by Our Co-pending patent application Ser. No. 09/867,662 After a 180 Minutes Thermal Treatment in a Nitrogen Ambient at a Reduced Temperature of 800° C.

This co-pending patent application shows the spectacular effect of a fifth independent variable, the phosphine, $PH_3$, gas flow, on the optimization of the optical properties of the various core in a six-dimensional space: the first independent variable, the $SiH_4$ gas flow, being fixed at 0.20 std litre/min; the second independent variable, the $N_2O$ gas flow, being fixed at 6.00 std litre/min; the third independent variable, the $N_2$ gas flow, being fixed at 3.15 std litre/min. The fourth independent variable, the $PH_3$ gas flow, is varied and can be 0.00 std litre/min, 0.12 std litre/min, 0.25 std litre/min, 0.35 std litre/min, 0.50 std litre/min, or 0.65 std litre/min. The fifth independent variable, the total deposition pressure, is fixed at 2.60 Torr;

The sixth dimension is the observed FTIR characteristics of various buffer (cladding) and core waveguides, as reported in: FIG. 3c, FIG. 4c, FIG. 5c, FIG. 6c, FIG. 7c, FIG. 8c, & FIG. 9c.

FIG. 3c, FIG. 4c, FIG. 5c, FIG. 6c, FIG. 7c, FIG. 8c and FIG. 9c show the FTIR spectra of PECVD silica films deposited using a commercially available PECVD system, the "Concept One" system manufactured by Novellus Systems in California, U.S.A, using the fixed optimum total deposition pressure and the fixed flow rates of silane ($SiH_4$), of nitrous oxide ($N_2O$) and of nitrogen ($N_2O$), as described in our patent pending application 'Silica waveguides for Mux/Dmux optical devices'. These spectra are obtained after a 180 minutes high temperature thermal treatment in a nitrogen ambient at a fixed temperature of only 800° C. in a standard diffusion tube. It is clear that this technique allows the achievement of high optical quality silica waveguides after a 180 minutes thermal treatment in a nitrogen ambient at a reduced temperature of 800° C.

Figure 3C:
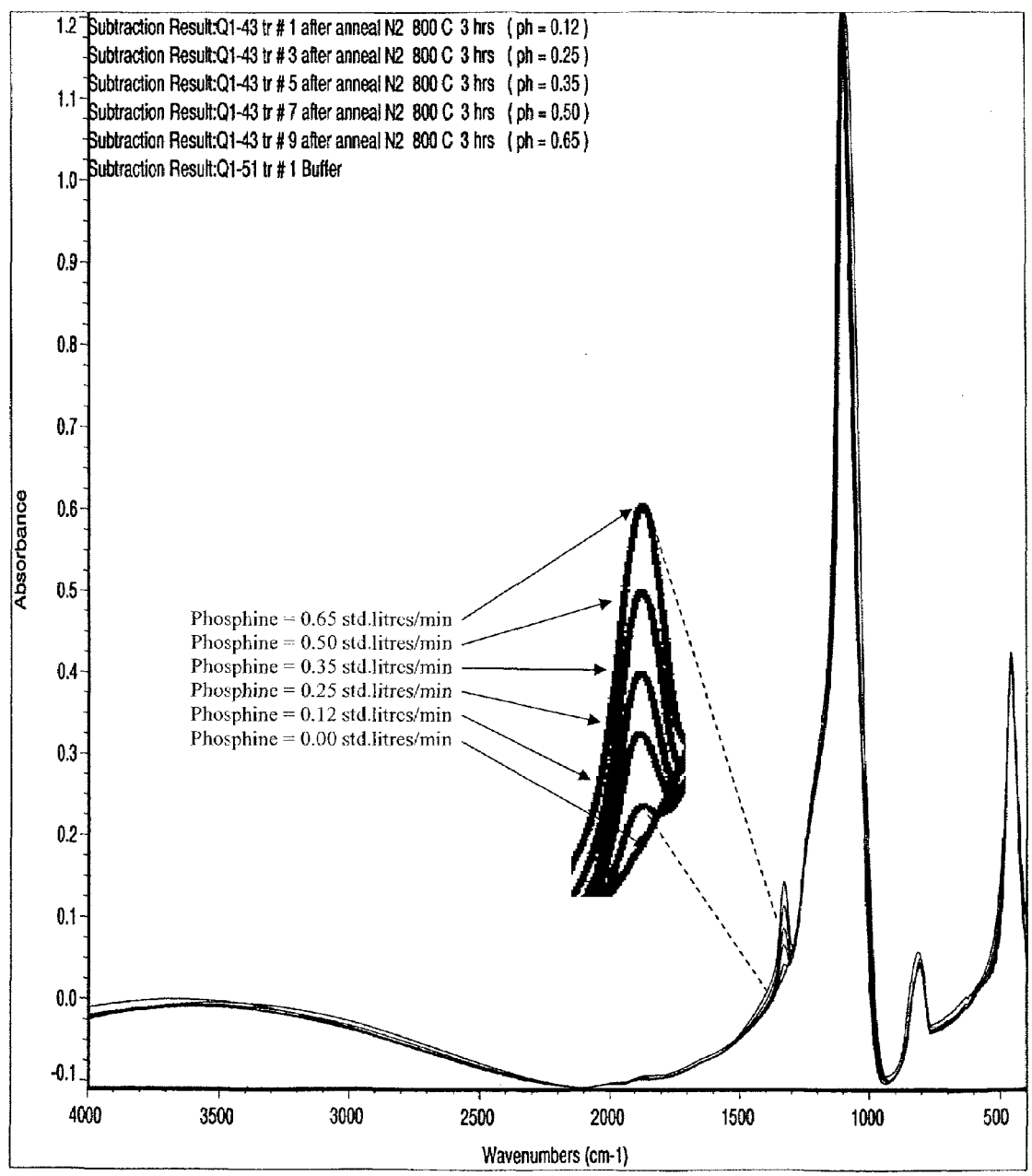
FIG. 3c shows the basic FTIR spectra of various Cores obtained at 2.60 Torr with the PECVD deposition technique described in our other pending patent application Ser. No. 09/867,662 and after a thermal treatment in a nitrogen ambient at 800° C.
Figure 4C:
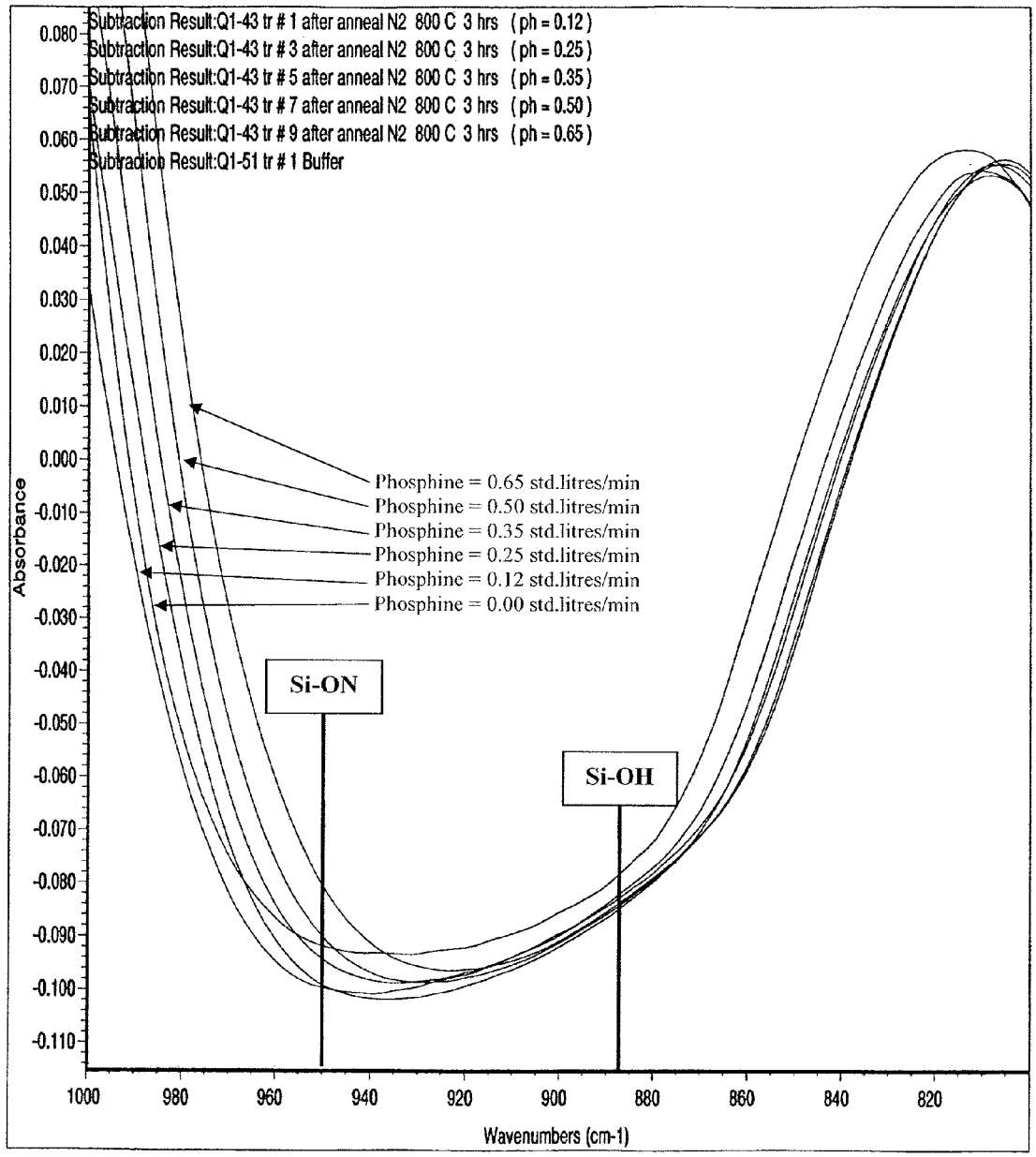
FIG. 4c shows the in-depth FTIR spectra from 810 to 1000 $cm^{-1}$ of various Cores obtained at 2.60 Torr with the PECVD deposition technique described in our other pending patent application Ser. No. 09/867,662.

FIG. 3c shows that the intense and small FWHM Si—O—Si "rocking mode" absorption peak (centred at 460 $cm^{-1}$) and Si—O—Si "in-phase-stretching mode" absorption peak (centred at 1080 $cm^{-1}$) of the fixed deposition pressure of 2.60 Torr of FIG. 3b is maintained in FIG. 3c as the $PH_3$ flow rate is gradually increased from 0.00 std litre/min to 0.65 std litre/min. This means that at a fixed deposition pressure of 2.60 Torr, the control of the $PH_3$ gas flow independently of the $SiH_4$ gas flow, of the $N_2O$ gas flow and of the $N_2$ gas flow has no effect on the basic FTIR spectra of the treated silica films;

FIG. 4c shows that an even more gradual elimination of the Si—OH oscillators (centered at 885 $cm^{-1}$) is observed at the total deposition pressure of 2.60 Torr as the $PH_3$ flow rate is increased from 0.00 std litre/min to 0.65 std litre/min. FIG. 4c also shows that a gradual elimination of the Si—ON oscillators (centred at 950 $cm^{-1}$) is also observed at the total deposition pressure of 2.60 Torr as the $PH_3$ flow rate is increased from 0.00 std litre/min up to the optimum 0.25 std litre/min followed by a very slight degradation as the $PH_3$ flow rate is increased further more up to 0.65 std litre/min. This spectacular improved elimination of the residual Si—ON oscillators after a 180 minutes thermal treatment of only 800° C. contrasts with the upper-mentioned results of typical PECVD silica films of FIG. 4a which still incorporate a lot of Si—ON oscillators even after a thermal treatment in a nitrogen ambient at a much higher temperature of 1100° C. This also contrasts with the upper-mentioned results of PECVD buffer (cladding) deposited at a non-optimized pressure of less than 2.40 Torr by our pending patent application 'Plasma Enhanced Chemical Vapour Deposition of low optical absorption silica films for Mux/Dmux optical devices' of FIG. 4b which still incorporate a lot of Si—ON oscillators even after a 180 minutes thermal treatment in a nitrogen ambient at a much higher temperature of 800° C. The optimum separation and deep valley between the Si—O—Si "in-phase-stretching mode" absorption peak (1080 $cm^{-1}$) and the Si—O—Si "bending mode" absorption peak (810 $cm^{-1}$) of the fixed deposition pressure of 2.60 Torr of FIG. 4b is maintained and in fact slightly improved as the $PH_3$ flow rate is gradually increased from 0.00 std litre/min to 0.35 std litre/min.

Figure 5C:
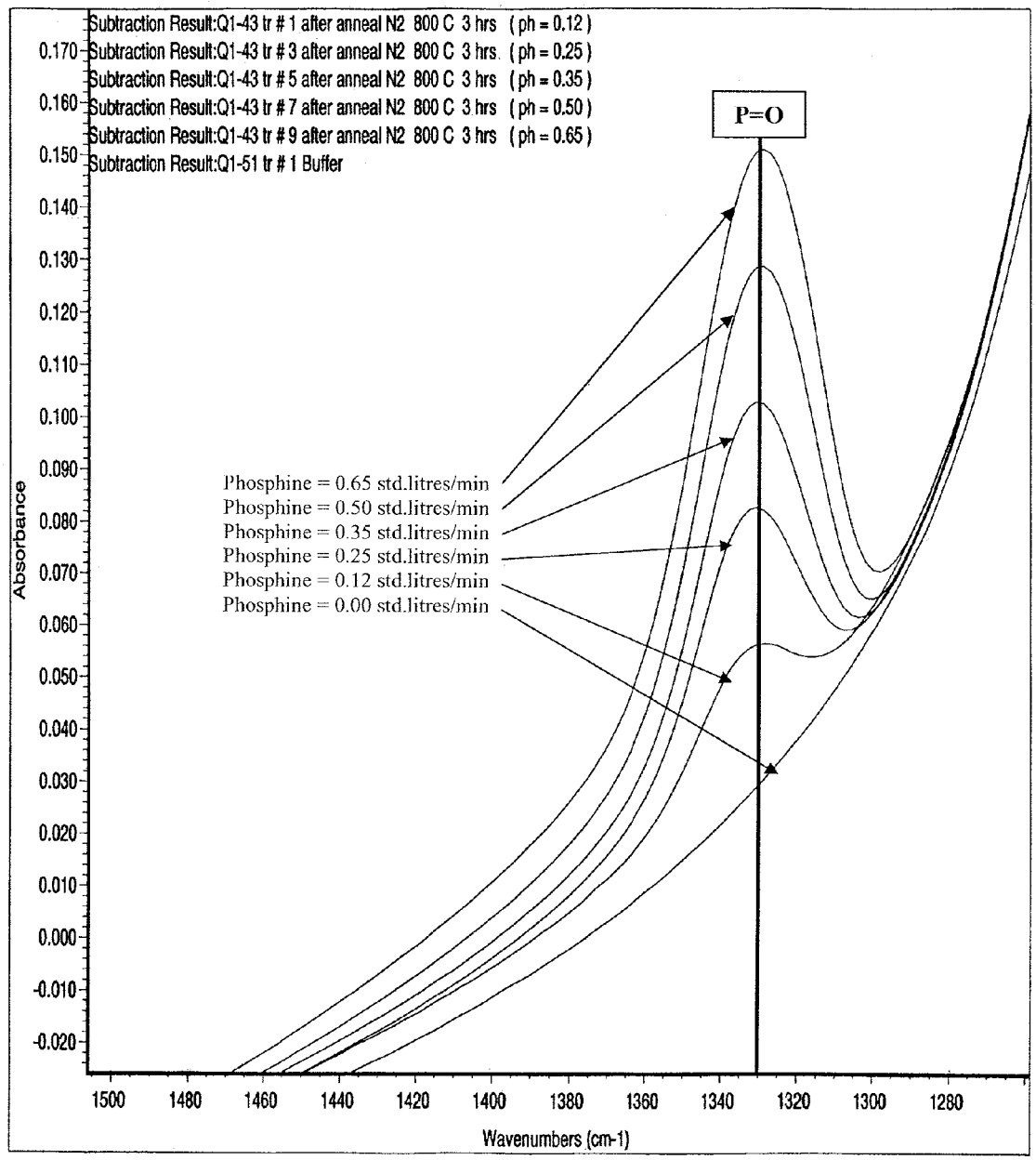
FIG. 5c shows the in-depth FTIR spectra from 1260 to 1500 $cm^{-1}$ of various Cores obtained at 2.60 Torr with the PECVD deposition technique described in our other pending patent application Ser. No. 09/867,662.

FIG. 5c shows that a gradual appearance of the P=O oscillators (centered at 1330 $cm^{-1}$ and which does not have a higher harmonics which could cause optical absorption in the 1.30 to 1.55 μm optical bands) is observed at the total deposition pressure of 2.60 Torr as the $PH_3$ flow rate is increased from 0.00 std litre/min to 0.65 std litre/min. This FTIR absorption peak is used to calibrate the phosphorus incorporation in core.

Figure 6C:
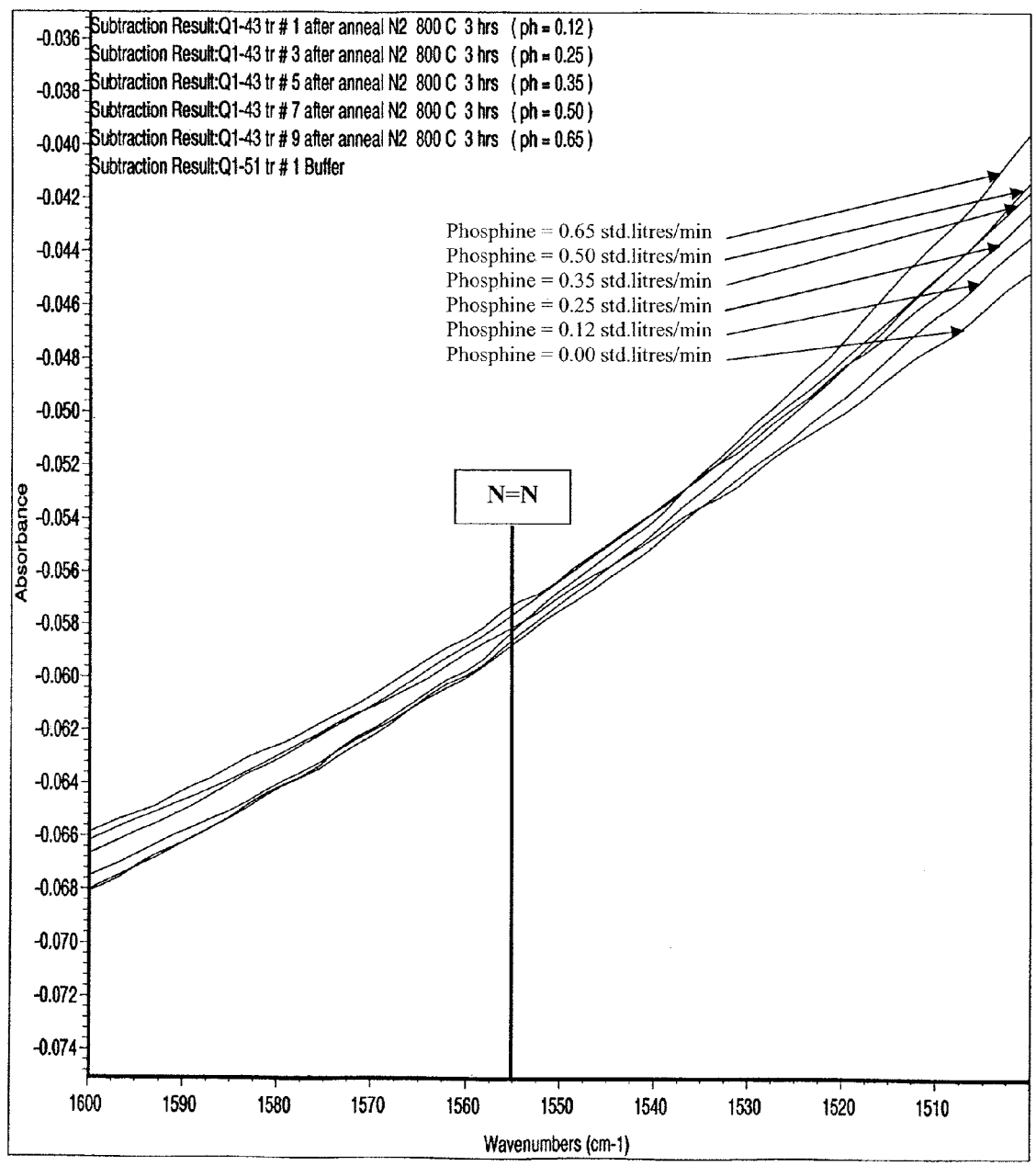
FIG. 6c shows the in-depth FTIR spectra from 1500 to 1600 $cm^{-1}$ of various Cores obtained at 2.60 Torr with the PECVD deposition technique described in our other pending patent application Ser. No. 09/867,662 after a thermal treatment in a nitrogen ambient at 800° C.

FIG. 6c shows that of the N=N oscillators (centered at 1555 $cm^{-1}$) are completely eliminated at the total deposition pressure of 2.60 Torr for all $PH_3$ flow rate values from 0.00 std litre/min to 0.65 std litre/min. This contrasts with the upper-mentioned results of typical PECVD silica films of FIG. 6a which require a 180 minutes thermal treatment in a nitrogen ambient at a temperature of 1000° C. in order to achieve similar results. This also contrasts with the upper-mentioned results of PECVD buffer (cladding) deposited at a non-optimized pressure of less than 2.40 Torr by our pending patent application 'Plasma Enhanced Chemical Vapour Deposition of low optical absorption silica films for Mux/Dmux optical devices' of FIG. 6b which still incorporate a lot of N=N oscillators even after a 180 minutes thermal treatment in a nitrogen ambient at a much higher temperature of 800° C.

Figure 7C:
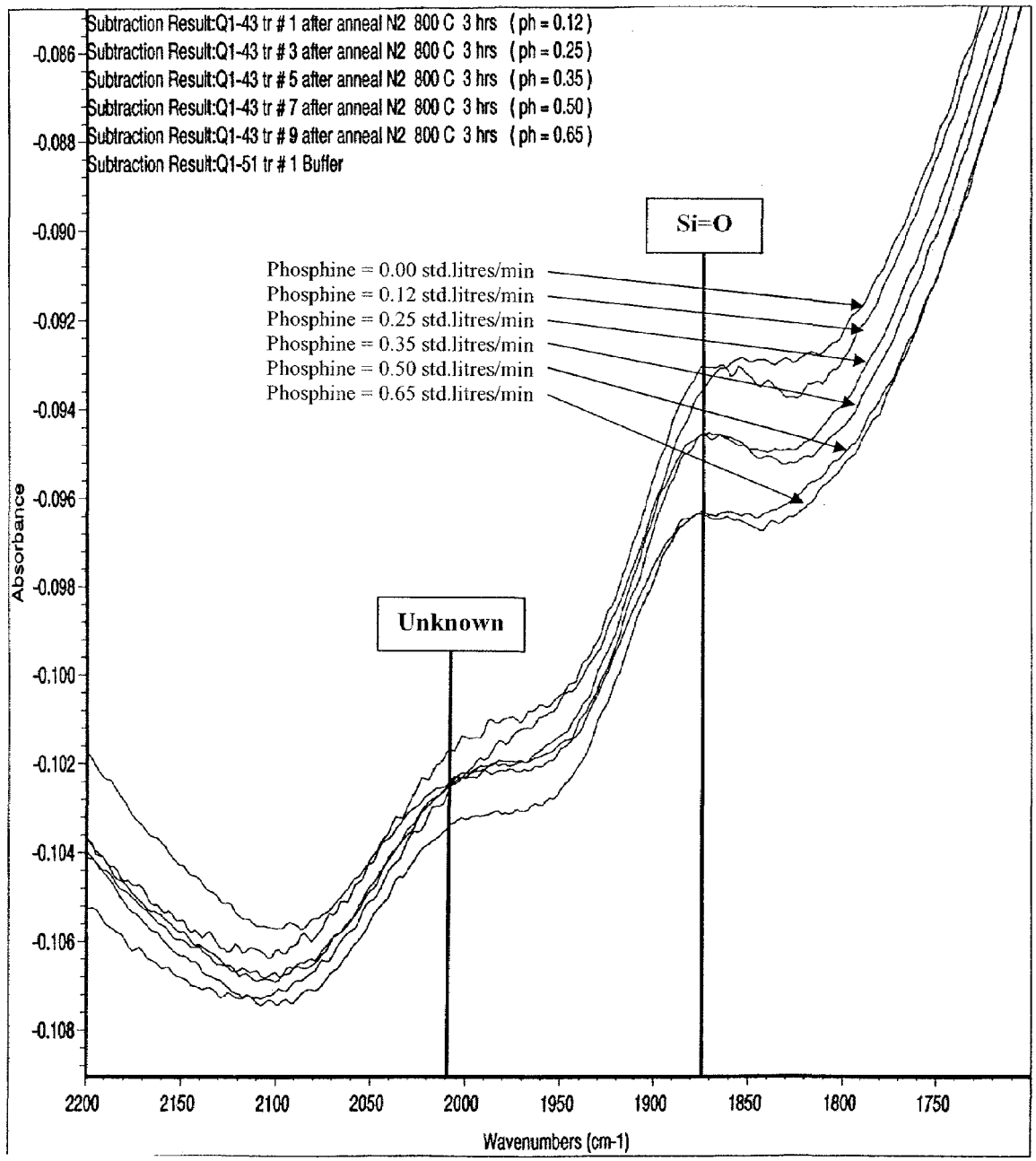
FIG. 7c shows the in-depth FTIR spectra from 1700 to 2200 cm$^{-1}$ of various Cores obtained at 2.60 Torr with the PECVD deposition technique described in our other pending patent application Ser. No. 09/867,662 after a thermal treatment in a nitrogen ambient at 800° C.
Figure 8C:
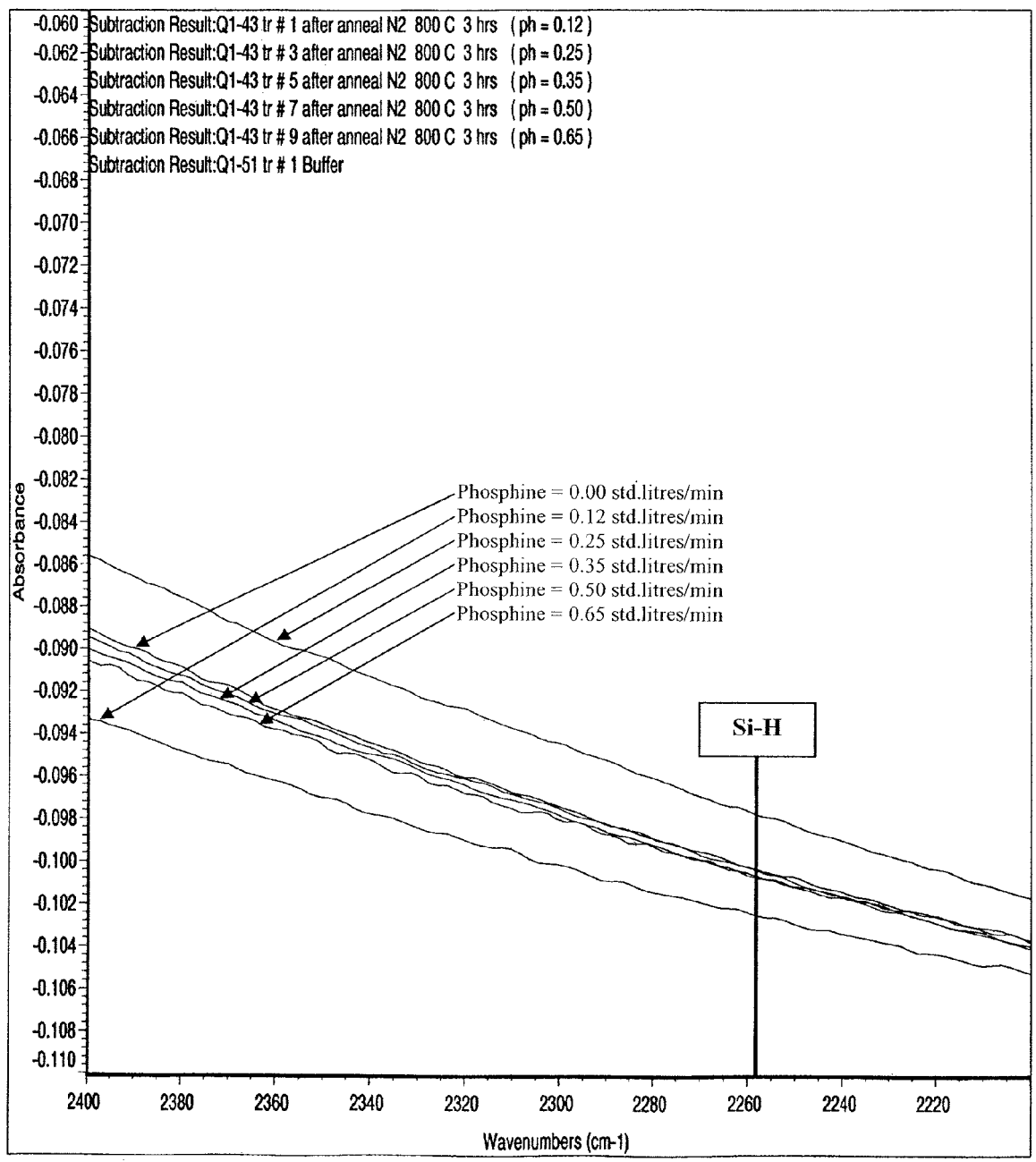
FIG. 8c shows the in-depth FTIR spectra from 2200 to 2400 cm$^{-1}$ of various Cores obtained at 2.60 Torr with the PECVD deposition technique described in our other pending patent application titled 09/867,662 after a thermal treatment in a nitrogen ambient at 800° C.

FIG. 7c shows that the Si=O oscillators (centered at 1875 $cm^{-1}$) and the unknown oscillator (centered at 2010 $cm^{-1}$) at the total deposition pressure of 2.60 Torr are not influenced by the $PH_3$ flow rate from 0.00 std litre/min to 0.65 std litre/min. These effects are not that important since only the fourth harmonics of the Si=O oscillators could absorb in the 1.30 to 1.55 μm optical bands;

FIG. 8c shows that the Si—H oscillators (centered at 2260 $cm^{-1}$ and which third harmonics could cause an optical absorption between 1.443 and 1.508 μm) at the total deposition pressure of 2.60 Torr are still completely eliminated by any of all $PH_3$ flow rates from 0.00 std litre/min to 0.65 std litre/min.

Figure 9C:
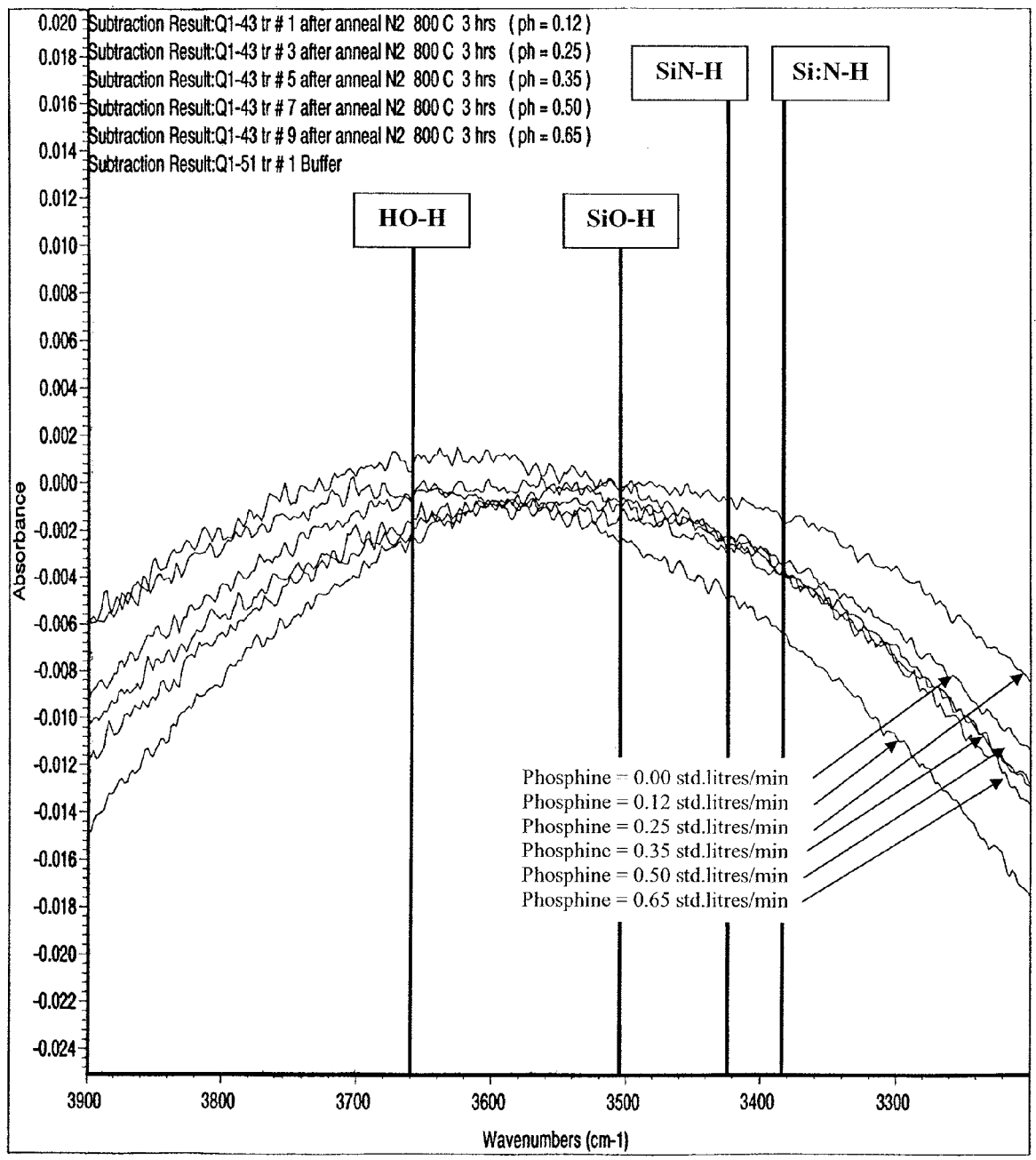
FIG. 9c shows the in-depth FTIR spectra from 3200 to 3900 cm$^{-1}$ of various Cores obtained at 2.60 Torr with the PECVD deposition technique described in our other pending patent application Ser. No. 09/867,662 after a thermal treatment in a nitrogen ambient at 800° C.

FIG. 9c shows that the spectacular complete elimination of the Si:N—H oscillators (centered at 3380 $cm^{-1}$ whose $2^{nd}$ harmonics could cause an optical absorption between 1.445 and 1.515 μm) at the total deposition pressure of 2.60 Torr is maintained for all $PH_3$ flow rates from 0.00 std litre/min to 0.65 std litre/min. This contrasts with the upper-mentioned results of typical PECVD silica films which require a thermal treatment in a nitrogen ambient at a temperature of 1100° C. in order to achieve similar results. This also contrasts with the upper-mentioned results of PECVD buffer (cladding) deposited at a non-optimized pressure of less than 2.40 Torr by our pending patent application 'Plasma Enhanced Chemical Vapour Deposition of low optical absorption silica films for Mux/Dmux optical devices' of FIG. 9b which still incorporate a lot of Si:N—H oscillators even after a 180 minutes thermal treatment in a nitrogen ambient at a much higher temperature of 800° C. FIG. 9c also shows that the a spectacular complete elimination of the SiN—H oscillators (centered at 3420 cm$^{-1}$ whose $2^{nd}$ harmonics could cause an optical absorption between 1.445 and 1.479 μm) at the total deposition pressure of 2.60 Torr is also maintained for all $PH_3$ flow rates from 0.00 std litre/min to 0.65 std litre/min. This contrasts with the upper-mentioned results of typical PECVD silica films which require a thermal treatment in a nitrogen ambient at a temperature of 1000° C. in order to achieve similar results. This also contrasts with the upper-mentioned results of PECVD buffer (cladding) deposited at a non-optimized pressure of less than 2.40 Torr by our pending patent application 'Plasma Enhanced Chemical Vapour Deposition of low optical absorption silica films for Mux/Dmux optical devices' of FIG. 9b which still incorporate a lot of SiN—H oscillators even after a 180 minutes thermal treatment in a nitrogen ambient at a much higher temperature of 800° C. FIG. 9c also shows that the complete elimination of the SiO—H oscillators (centered at 3510 cm$^{-1}$ whose $2^{nd}$ harmonics could cause an optical absorption between 1.408 and 1.441 μm) at the total deposition pressure of 2.60 Torr is maintained for all $PH_3$ flow rates from 0.00 std litre/min to 0.65 std litre/min. This contrasts with the upper-mentioned results of typical PECVD silica films which require a thermal treatment in a nitrogen ambient at a temperature of 900° C. in order to achieve similar results. Finally, FIG. 9c also shows that the complete elimination of the HO—H oscillators (centered at 3650 cm$^{-1}$ whose $2^{nd}$ harmonics could cause an optical absorption between 1.333 and 1.408 μm) at the total deposition pressure of 2.60 Torr is maintained for all $PH_3$ flow rates from 0.00 std litre/min to 0.65 std litre/min.

It is clear from the various FTIR spectra that our pending patent application titled 'Silica waveguides for Mux/Dmux optical devices' allows the use of various $PH_3$ flow rates from 0.00 std litre/min to 0.65 std litre/min. as to achieve core with the required 'delta-n' after a 180 minutes thermal treatment in a nitrogen ambient at a reduced temperature of 800° C. while maintaining excellent optical quality.

Optical Absorption of PECVD Buffer (Cladding) and Core Deposited by Our Co-pending Patent Application Entitled Method of Depositing an Optical Quality Silica Film by PECVD After a 30 Minutes Thermal Treatment in a Nitrogen Ambient at a Reduced Temperatures of 600 to 900° C.

This patent application shows the spectacular flexibility of the post-deposition thermal treatment the optimization of the optical and of the mechanical properties of buffer (cladding) and core in a seven-dimensional space: a first independent variable, the $SiH_4$ flow, being fixed at 0.20 std litre/min; a second independent variable, the $N_2O$ flow, being fixed at 6.00 std litre/min; a third independent variable, the $N_2$ flow, being fixed at 3.15 std litre/min; a fourth independent variable, the $PH_3$ flow, being fixed at 0.50 std litre/min; a fifth independent variable, the total deposition pressure, being fixed at 2.60 Torr.

The sixth independent variable, the post-deposition thermal treatment is varied and consists of a 30 minutes duration thermal treatment in a nitrogen ambient at 600° C., 700° C., 750° C., 800° C., 850° C., or 900° C.;

A seventh dimension is the observed FTIR characteristics of various buffer (cladding) and core silica-based optical elements, as reported in: FIG. 3d, FIG. 4d, FIG. 5d, FIG. 6d, FIG. 7d, FIG. 8d, & FIG. 9d.

Figure 3D:
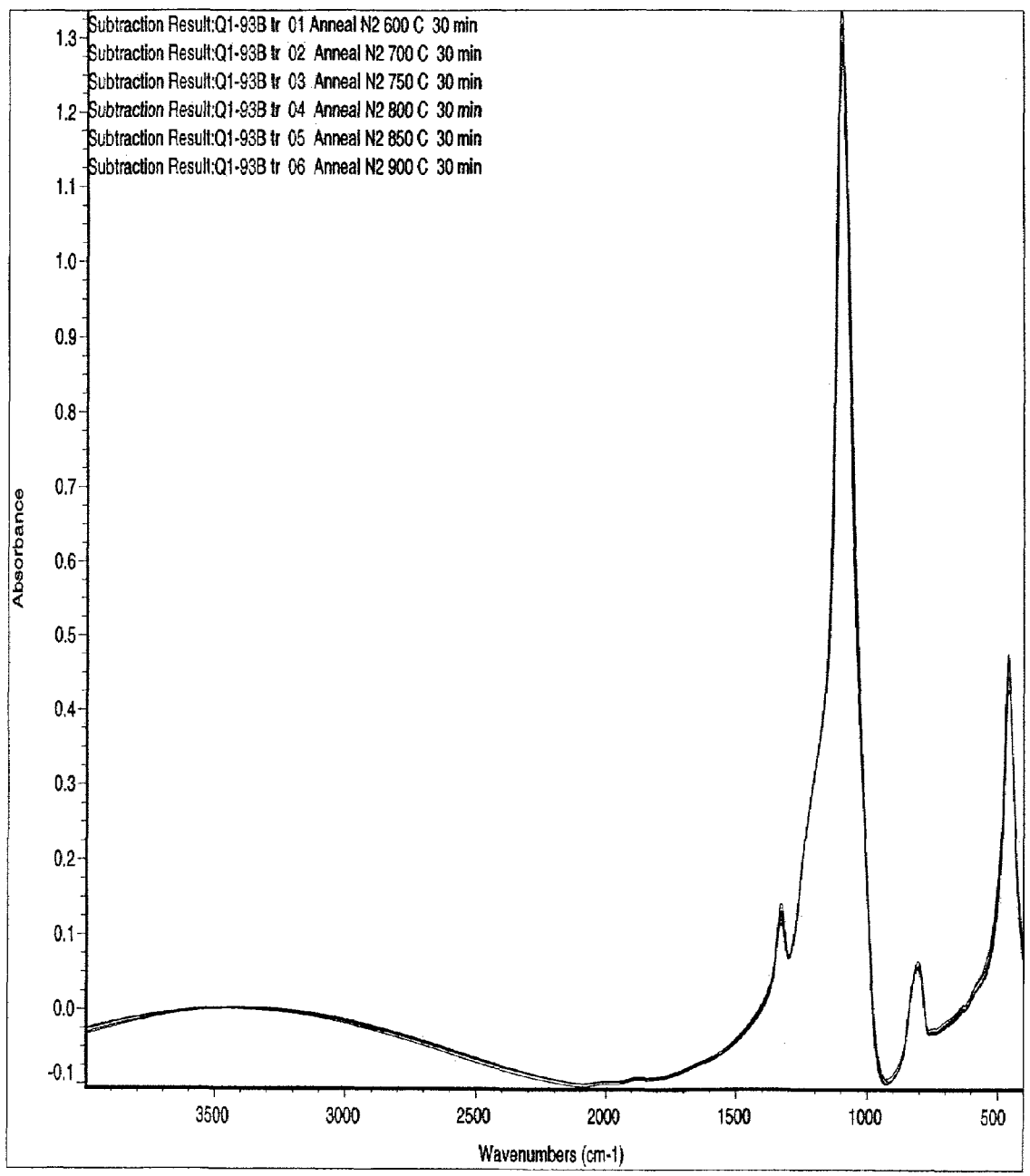
FIG. 3d shows the basic FTIR spectra of various cores obtained with the new PECVD deposition technique and after a 30 minutes thermal treatment in a nitrogen ambient at various temperatures.
Figure 4D:
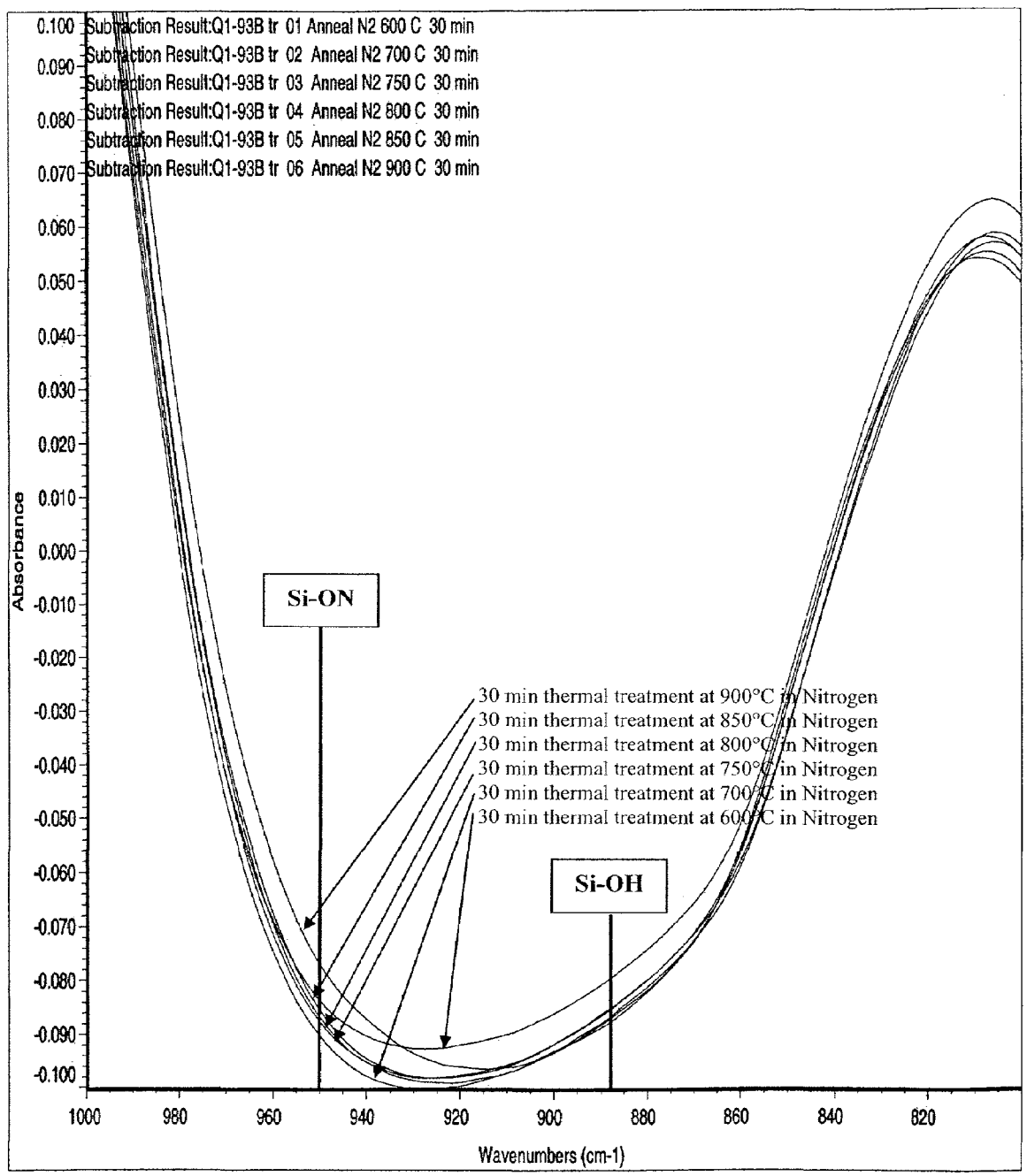
FIG. 4d shows the in-depth FTIR spectra from 810 to 1000 $cm^{-1}$ of various cores obtained with the new PECVD deposition technique after a 30 minutes thermal treatment in a nitrogen ambient at various temperatures.

FIG. 3d, FIG. 4d, FIG. 5d, FIG. 6d, FIG. 7d, FIG. 8d and FIG. 9d show the FTIR spectra of PECVD silica films deposited using a commercially available PECVD system, the "Concept One" system manufactured by Novellus Systems in California, U.S.A, using the fixed optimum total deposition pressure and the fixed flow rates of silane ($SiH_4$), of nitrous oxide ($N_2O$), of nitrogen ($N_2$), and of phosphine ($PH_3$) as described in our patent pending application 'Silica waveguides for Mux/Dmux optical devices'. These spectra are obtained after 30 minutes thermal treatments in a nitrogen ambient at various temperatures in a standard diffusion tube. It is clear that this new patent application describes a way to independently optimize the thermal treatment and the optical properties of buffer, core and cladding as to allow the thermal treatment optimization of the mechanical properties of the silica-based optical elements without any interaction with the optical properties stable of these optical elements:

FIG. 3d shows that the intense and small FWHM Si—O—Si "rocking mode" absorption peak (centred at 460 cm$^{-1}$) and Si—O—Si "in-phase-stretching mode" absorption peak (centred at 1080 cm$^{-1}$) of the fixed deposition pressure of 2.60 Torr of FIG. 3b and of the fixed $PH_3$ flow rate of 0.50 std litre/min of the FIG. 3c is maintained as the temperature of the 30 minutes thermal treatments in a nitrogen ambient is gradually decreased from 900° C. to 600° C. This means that independently of the $SiH_4$ gas flow of the $N_2O$ gas flow of the $N_2$ gas flow and of the $PH_3$ gas flow and as long as the deposition pressure is fixed to 2.60 Torr, the basic FTIR spectra of silica-based optical components are not affected by the temperature variation (between 600° C. and 900° C.) of the 30 minutes thermal treatment in a nitrogen ambient;

FIG. 4d shows that the elimination of the Si—OH oscillators (centered at 885 cm$^{-1}$) of the fixed deposition pressure of 2.60 Torr of FIG. 4b and of the fixed $PH_3$ flow rate of 0.50 std litre/min of the FIG. 4c is maintained. FIG. 4d also shows that the elimination of the Si—ON oscillators (centred at 950 cm$^{-1}$) of the fixed deposition pressure of 2.60 Torr of FIG. 4b and of the fixed $PH_3$ flow rate of 0.50 std litre/min of the FIG. 4c is also maintained. This very spectacular improved elimination of the residual Si—ON oscillators after a 30 minutes thermal treatment of only 600° C. contrasts with the upper-mentioned results of typical PECVD silica films of FIG. 4a which still incorporate a lot of Si—ON oscillators even after a 180 minutes thermal treatment in a nitrogen ambient at a much higher temperature of 1100° C. This also contrasts with the upper-mentioned results of PECVD buffer (cladding) deposited at a non-optimized pressure of less than 2.40 Torr by our pending patent application 'Plasma Enhanced Chemical Vapour Deposition of low optical absorption silica films for Mux/Dmux optical devices' of FIG. 4b which still incorporate a lot of Si—ON oscillators even after a 180 minutes thermal treatment in a nitrogen ambient at a much higher temperature of 800° C. The optimum separation and deep valley between the Si—O—Si "in-phase-stretching mode" absorption peak (1080 cm$^{-1}$) and the Si—O—Si "bending mode" absorption peak (810 cm$^{-1}$) of the fixed deposition pressure of 2.60 Torr of FIG. 4b and of the fixed $PH_3$ flow rate of 0.50 std litre/min of the FIG. 4c is also maintained. This means that this new technique allows the elimination of the Si—OH oscillators and of the Si—ON oscillators independently of the thermal treatment of buffer, core and cladding as to allow the thermal treatment optimization of the mechanical properties of the silica-based optical elements without any interaction with the Si—OH oscillators and of the Si—ON oscillators of these optical elements.

Figure 5D:
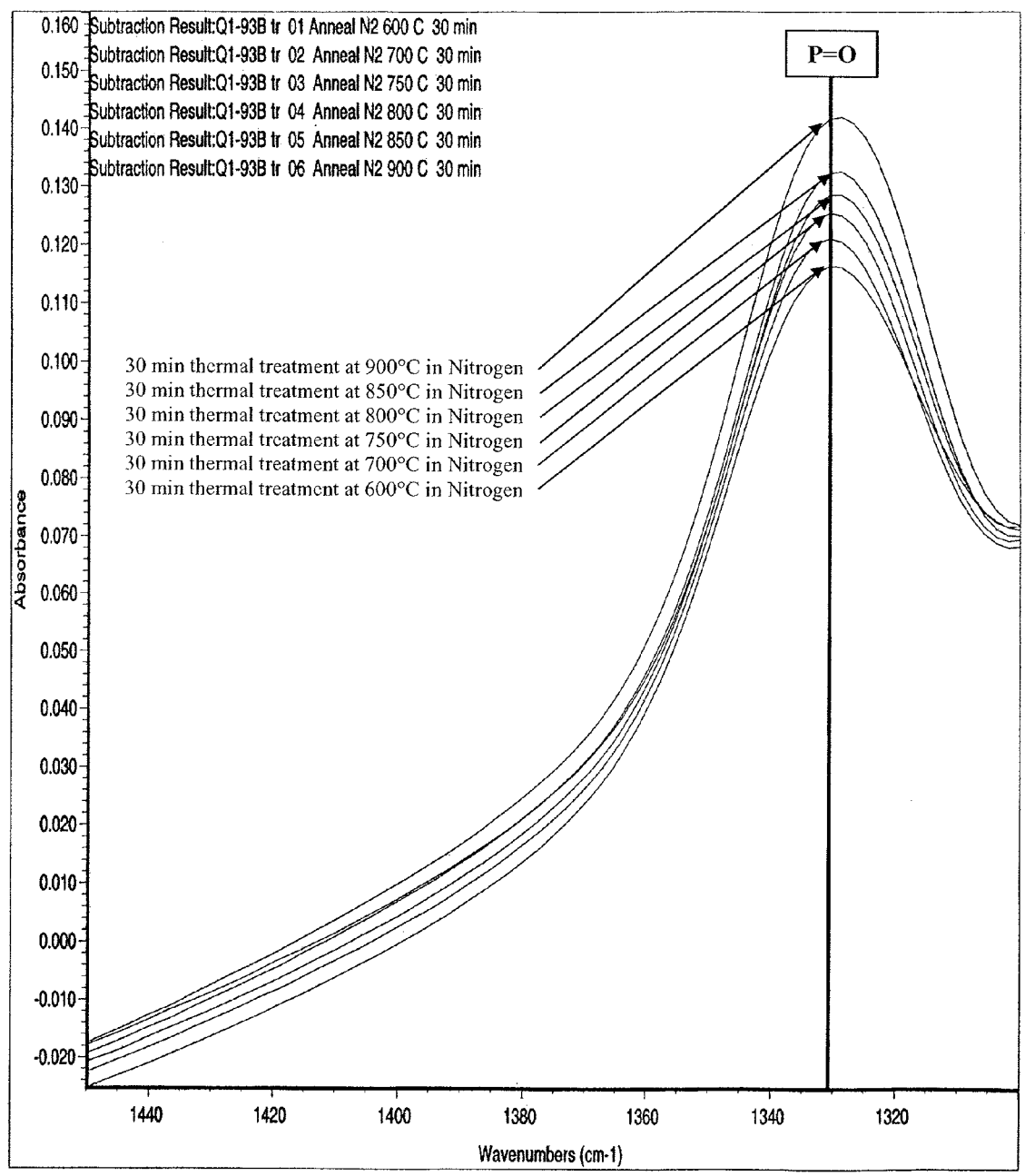
FIG. 5d shows the in-depth FTIR spectra from 1260 to 1500 $cm^{-1}$ of various Cores obtained with the new PECVD deposition technique after a 30 minutes thermal treatment in a nitrogen ambient at various temperatures.

FIG. 5d shows the gradual appearance of the P=O oscillators (centered at 1330 cm$^{-1}$ and which does not have a higher harmonics which could cause optical absorption in the 1.30 to 1.55 μm optical bands) as the temperature of the 30 minutes thermal treatment in a nitrogen ambient is increased from 600° C. to 900° C.

Figure 6D:
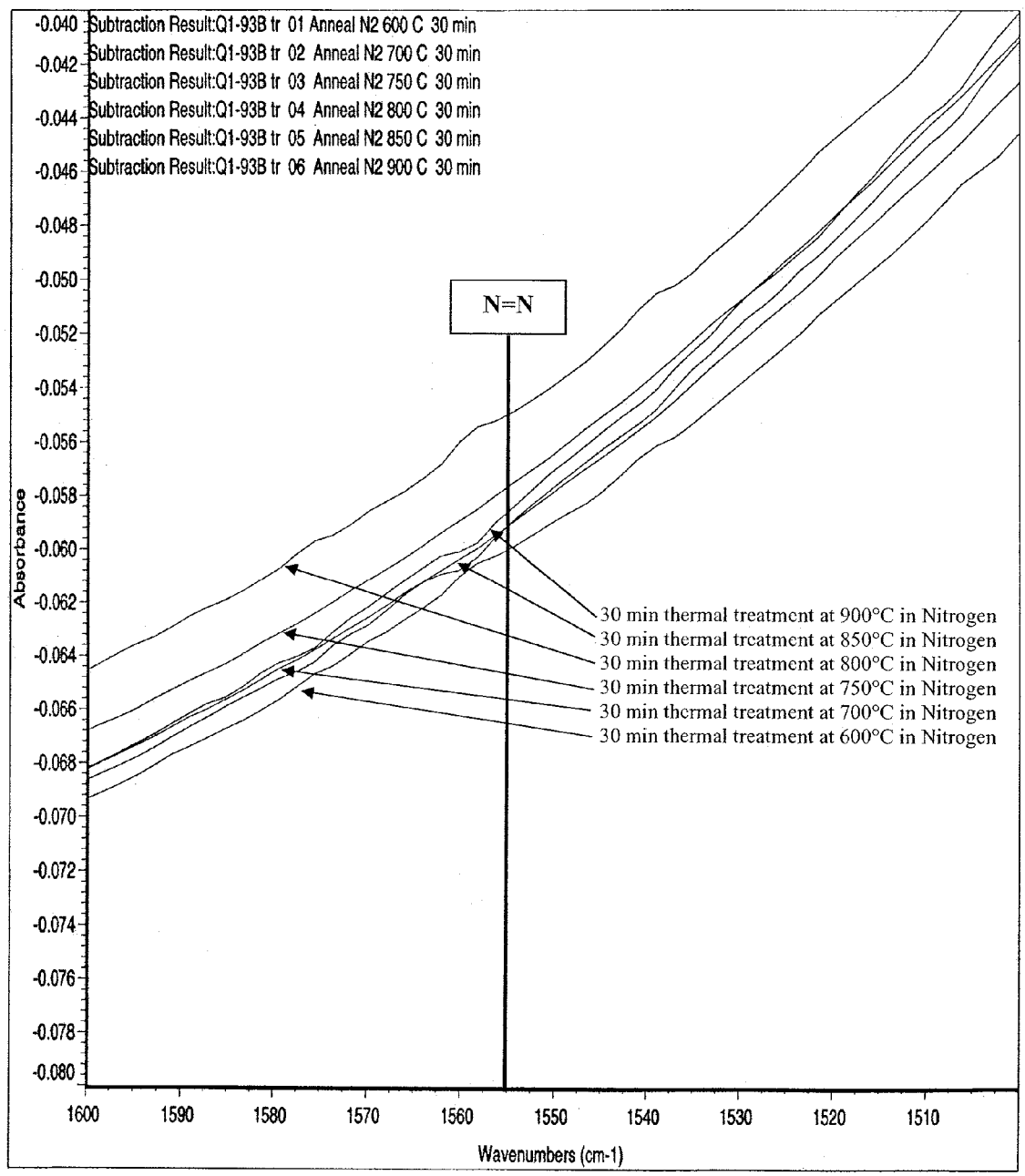
FIG. 6d shows the in-depth FTIR spectra from 1500 to 1600 $cm^{-1}$ of various Cores obtained with the new PECVD deposition technique after a 30 minutes thermal treatment in a nitrogen ambient at various temperatures.

FIG. 6d shows that the elimination of the N=N oscillators (centered at 1555 cm$^{-1}$) of the fixed deposition pressure of 2.60 Torr of FIG. 6b and of the fixed PH$_3$ flow rate of 0.50 std litre/min of the FIG. 6c is maintained. This also contrasts with the upper-mentioned results of typical PECVD silica films of FIG. 6a which require a 180 minutes thermal treatment in a nitrogen ambient at a temperature of 1000° C. in order to achieve similar results. This also contrasts with the upper-mentioned results of PECVD buffer (cladding) deposited at a non-optimized pressure of less than 2.40 Torr by our pending patent application 'Plasma Enhanced Chemical Vapour Deposition of low optical absorption silica films for Mux/Dmux optical devices' of FIG. 6b which still incorporate a lot of N=N oscillators even after a 180 minutes thermal treatment in a nitrogen ambient at a much higher temperature of 800° C. This means that this new technique allows the elimination of the N=N oscillators independently of the thermal treatment of buffer, core and cladding as to allow the thermal treatment optimization of the mechanical properties of the silica-based optical elements without any interaction with the N=N oscillators of these optical elements.

Figure 7D:
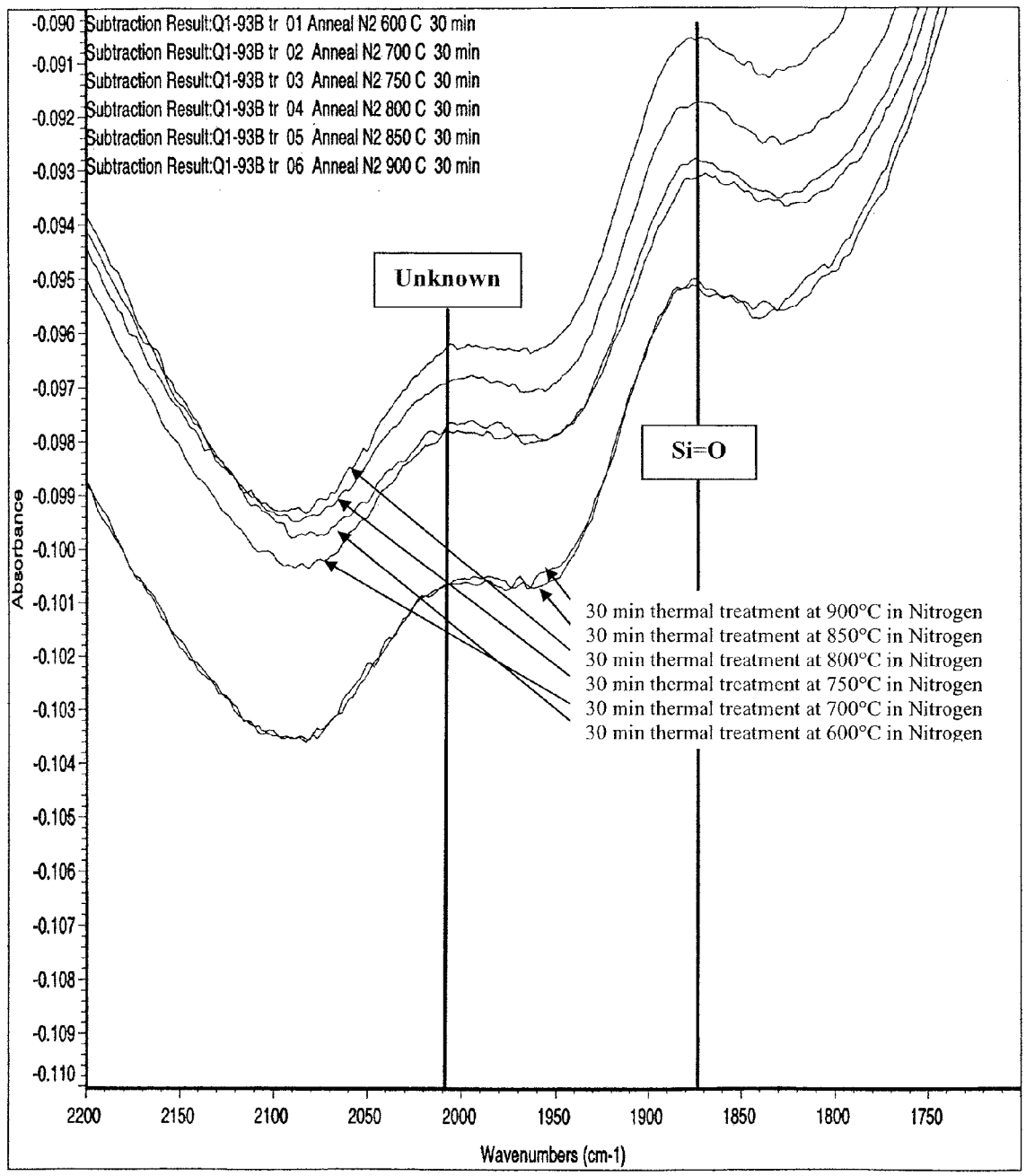
FIG. 7d shows the in-depth FTIR spectra from 1700 to 2200 cm$^{-1}$ of various Cores obtained with the new PECVD deposition technique after a 30 minutes thermal treatment in a nitrogen ambient at various temperatures.
Figure 8D:
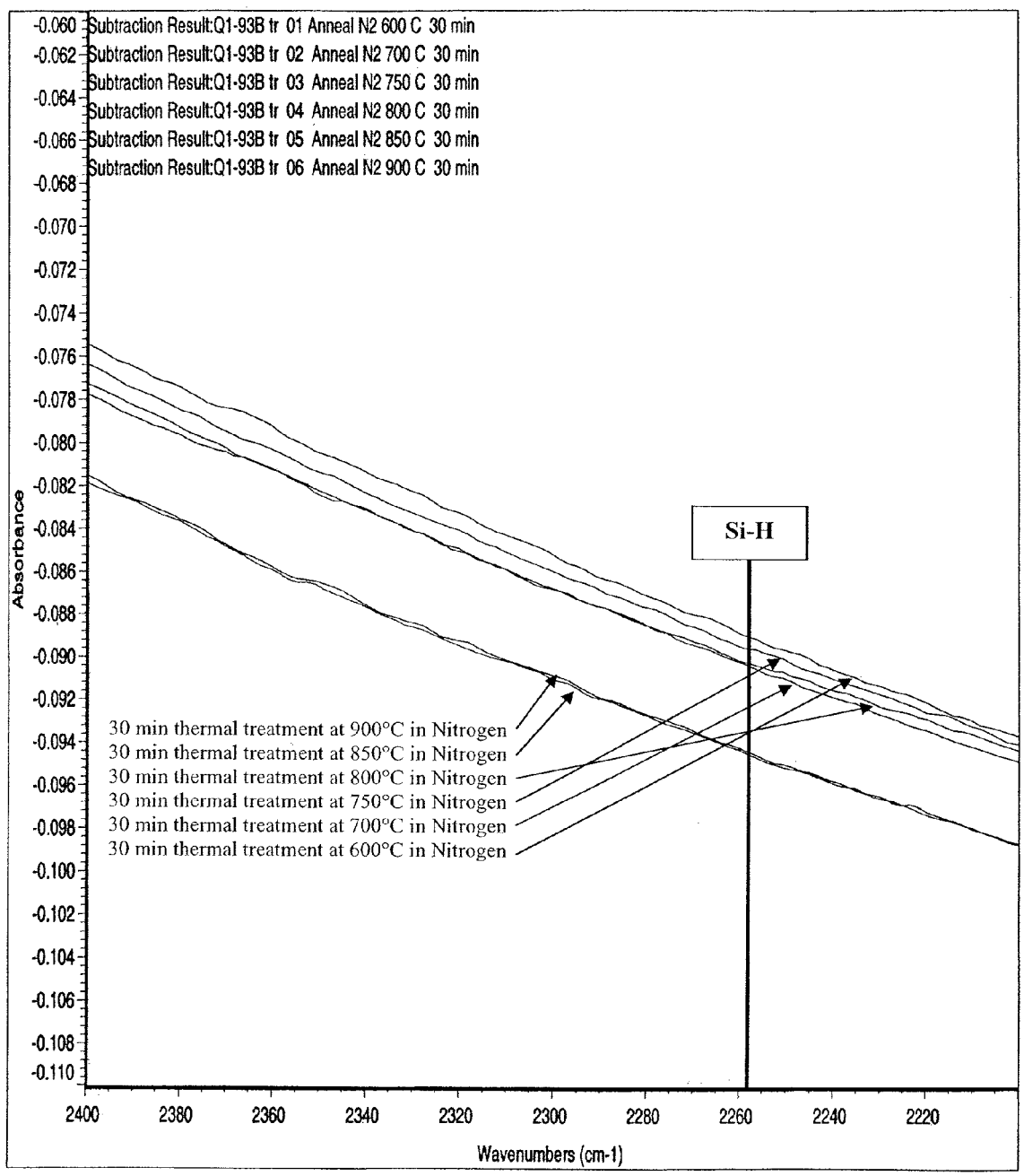
FIG. 8d shows the in-depth FTIR spectra from 2200 to 2400 cm$^{-1}$ of various Cores obtained with the new PECVD deposition technique after a 30 minutes thermal treatment in a nitrogen ambient at various temperatures.

FIG. 7d shows that the Si=O oscillators (centered at 1875 cm$^{-1}$) and the unknown oscillator (centered at 2010 cm$^{-1}$) of the fixed deposition pressure of 2.60 Torr of FIG. 7b and of the fixed PH$_3$ flow rate of 0.50 std litre/min of the FIG. 7c are unchanged. These effects are not that important since only the fourth harmonics of the Si=O oscillators could absorb in the 1.30 to 1.55 μm optical bands;

FIG. 8d shows that the elimination of the Si—H oscillators (centered at 2260 cm$^{-1}$ and which third harmonics could cause an optical absorption between 1.443 and 1.508 μm) of the fixed deposition pressure of 2.60 Torr of FIG. 8b and of the fixed PH$_3$ flow rate of 0.50 std litre/min of the FIG. 8c is maintained. This means that this new technique allows the elimination of the Si—H oscillators independently of the thermal treatment of buffer, core and cladding as to allow the thermal treatment optimization of the mechanical properties of the silica-based optical elements without any interaction with the Si—H oscillators of these optical elements.

Figure 9D:
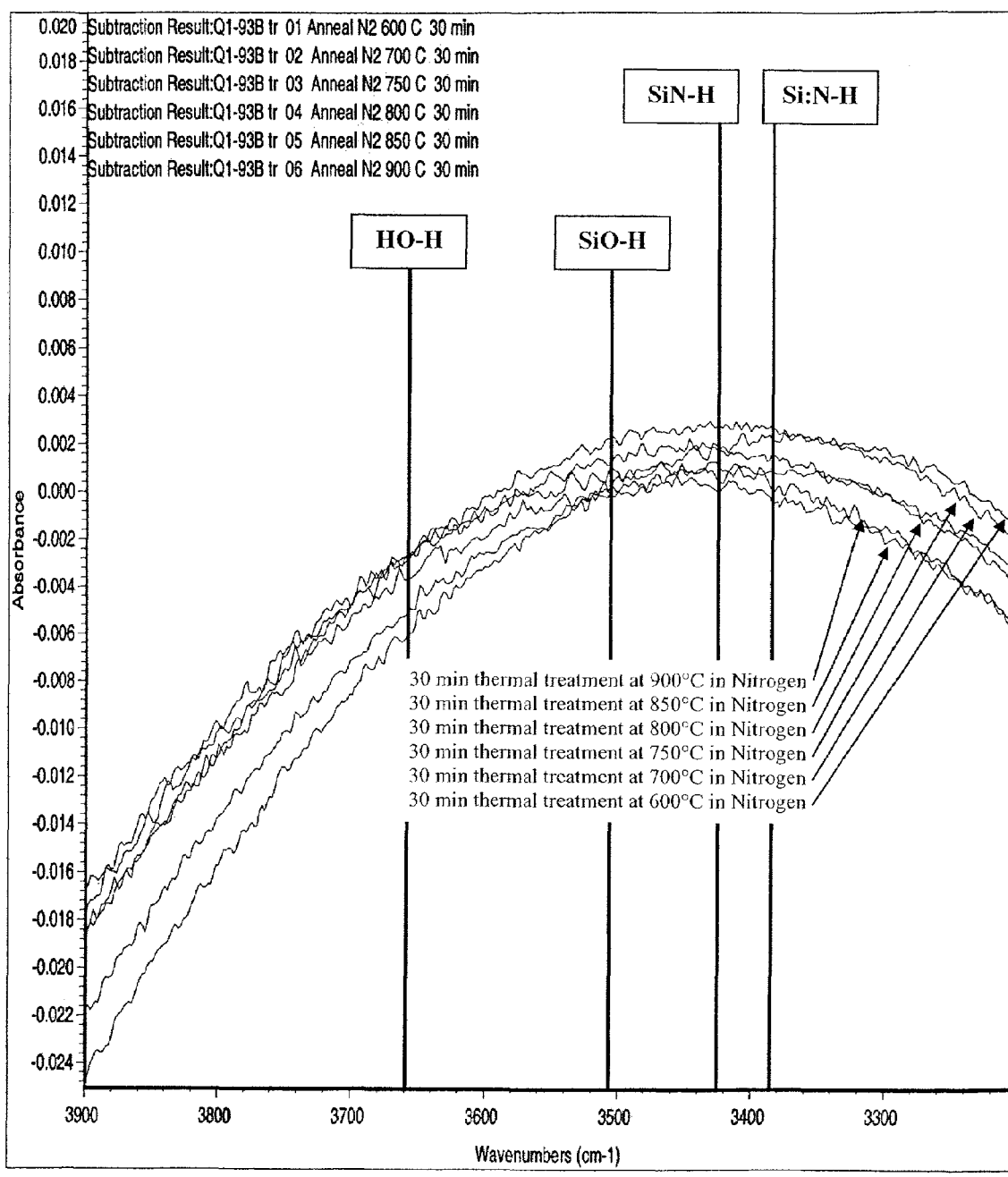
FIG. 9d shows the in-depth FTIR spectra from 3200 to 3900 cm$^{-1}$ of various Cores obtained with the new PECVD deposition technique after a 30 minutes thermal treatment in a nitrogen ambient at various temperatures.

FIG. 9d shows that the spectacular complete elimination of the Si:N—H oscillators (centered at 3380 cm$^{-1}$ whose 2$^{nd}$ harmonics could cause an optical absorption between 1.445 and 1.515 μm) of the fixed deposition pressure of 2.60 Torr of FIG. 9b and of the fixed PH$_3$ flow rate of 0.50 std litre/min of the FIG. 9c is maintained. This contrasts with the upper-mentioned results of typical PECVD silica films of FIG. 9a which require a 180 minutes thermal treatment in a nitrogen ambient at a temperature of 1100° C. in order to achieve similar results. This also contrasts with the upper-mentioned results of PECVD buffer (cladding) deposited at a non-optimized pressure of less than 2.40 Torr by our pending patent application 'Plasma Enhanced Chemical Vapour Deposition of low optical absorption silica films for Mux/Dmux optical devices' of FIG. 9b which still incorporate a lot of Si:N—H oscillators even after a 180 minutes thermal treatment in a nitrogen ambient at a much higher temperature of 800° C. FIG. 9d shows that a spectacular complete elimination of the SiN—H oscillators (centered at 3420 cm$^{-1}$ whose 2$^{nd}$ harmonics could cause an optical absorption between 1.445 and 1.479 μm) of the fixed deposition pressure of 2.60 Torr of FIG. 9b and of the fixed PH$_3$ flow rate of 0.50 std litre/min of the FIG. 9c is also maintained. This contrasts with the upper-mentioned results of typical PECVD silica films of FIG. 9a which require a thermal treatment in a nitrogen ambient at a temperature of 1000° C. in order to achieve similar results. This also contrasts with the upper-mentioned results of PECVD buffer (cladding) deposited at a non-optimized pressure of less than 2.40 Torr by our pending patent application 'Plasma Enhanced Chemical Vapour Deposition of low optical absorption silica films for Mux/Dmux optical devices' of FIG. 9b which still incorporate a lot of Si:N—H oscillators even after a 180 minutes thermal treatment in a nitrogen ambient at a much higher temperature of 800° C. FIG. 9d also shows that the complete elimination of the SiO—H oscillators (centered at 3510 cm$^{-1}$ whose 2$^{nd}$ harmonics could cause an optical absorption between 1.408 and 1.441 μm) of the fixed deposition pressure of 2.60 Torr of FIG. 9b and of the fixed PH$_3$ flow rate of 0.50 std litre/min of the FIG. 9c is maintained. This contrasts with the upper-mentioned results of typical PECVD silica films which require a thermal treatment in a nitrogen ambient at a temperature of 900° C. in order to achieve similar results. Finally, FIG. 9d also shows that the complete elimination of the HO—H oscillators (centered at 3650 cm$^{-1}$ whose 2$^{nd}$ harmonics could cause an optical absorption between 1.333 and 1.408 μm) of the fixed deposition pressure of 2.60 Torr of FIG. 9b and of the fixed PH$_3$ flow rate of 0.50 std litre/min of the FIG. 9c is maintained. This means that this new technique allows the elimination of the Si:N—H oscillators, of the SiN—H oscillators, of the SiO—H oscillators and of the HO—H oscillators independently of the thermal treatment of buffer, core and cladding as to allow the thermal treatment optimization of the mechanical properties of the silica-based optical elements without any interaction with the Si:N—H oscillators, with the SiN—H oscillators, with the SiO—H oscillators or with the HO—H oscillators of these optical elements.

It is clear from these various FTIR spectra that this technique allows the optimisation of the post-deposition thermal treatments of buffer (cladding) and core as to eliminate the various thermally-induced and stress-related residual mechanical problems.

Residual Stress-induced Mechanical Problems at the Buffer/core Interface or at the Core/cladding Interface The Stress Hysteresis of Buffer (Cladding) and Core FIG. 10 shows the stress hysteresis in a nitrogen ambient of buffer (cladding) and core during the heating of the silicon wafer from room temperature to 800° C., during its stabilization for 180 minutes at 800° C. and during its natural cooling from 800° C. to room temperature.

FIG. 10 shows that the mechanical stress of buffer (cladding) is compressive at about −250 MPa prior to the stress hysteresis cycle; is compressive throughout the complete stress hysteresis cycle; decreases (almost linearly) as the temperature linearly increases (an expected situation since the (almost constant) coefficient of linear expansion of silica-based buffer (cladding) is smaller than the one of the underlying silicon; shows three plastic deformation regions during the stress hysteresis cycle (Region B1, from 450° C. to 575° C., where it decreases much faster than what is expected from a linear decrease associated with its elastic deformation; Region B2, from 575° C. to 650° C., where it is almost constant; Region B3, during the 180 minutes stabilization at 800° C., where it decreases as the temperature remains unchanged); and is compressive at about −150 MPa after the stress hysteresis cycle.

FIG. 10 shows that the mechanical stress of core is tensile at about 175 MPa prior to the stress hysteresis cycle; is tensile throughout the complete stress hysteresis cycle; increases (almost linearly) as the temperature linearly decreases (an expected situation since the (almost constant) coefficient of linear expansion of silica-based core is smaller than the one of the underlying silicon); shows two plastic deformation regions during the stress hysteresis cycle (Region C1, from 450° C. to 675° C., where it reverses its trends and in fact decreases as the temperature is increasing; Region C2, from 675° C. to 800° C., where it is almost constant); and is tensile at about 40 MPa after the stress hysteresis cycle.

FIG. 10 shows that the optical elements of the device are to be prepared from a (compressive stress buffer)/(tensile stress core) combination bi-layer after a 180 minutes thermal treatment in a nitrogen ambient at a reduced temperature of 800° C. To this particular combination are associated some residual stress-induced mechanical problems of deep-etched optical elements (mechanical movement of side-walls), some residual stress-induced mechanical problems at the buffer/core or core/cladding interfaces (micro-structural defects, micro-voiding and separation) and some residual stress-induced optical problems (polarisation dependant power loss).

Stress-induced Mechanical Movement of the Side-walls of Deep-etched Optical Elements Optical elements, such as gratings or waveguides, require deep-etched (compressive stress buffer)/(tensile stress core) with vertical side-walls and with a seamless buffer/core interface.

FIG. 11 shows SEM pictures of a grating and a waveguide with deep-etched vertical side-walls and with a seamless buffer/core interface deep-etched through buffer and core.

FIG. 12 shows a stress-relief mechanism involving the elastic strain of such a deep-etched (compressive stress buffer)/(tensile stress core) optical element. From this sequence of three graphical representations, it is clear that such a (compressive stress buffer)/(tensile stress core) deep-etched optical element will systematically result in a positively sloped elastic strain of the optical element's side-wall.

This stress-relieve mechanism shows that the lateral strain of the compressive stress buffer forces the deep-etched side-wall of buffer to move outward; and the lateral strain of the tensile stress core forces the deep-etched side-wall of core to move inward.

This combination of strains will systematically result in deep-etched (compressive stress buffer)/(tensile stress core) optical elements with a positive slope side-wall, i.e. a side-wall with an angle smaller than 90°.

To estimate the amplitude of this effect, lets consider the hypothetical of zero bonding at the buffer/(Silicon wafer) interface, of zero bonding at the buffer/core interface, and of zero bonding at the buffer/core interface. The outward elastic strain of the side-wall of the compressive stress buffer, $\epsilon_B$, and the inward elastic strain of the side-wall of the tensile stress core, $\epsilon_C$, would simply be:

$$\epsilon_B = \sigma_B/E_B; \epsilon_C = \sigma_C/E_C$$

where $\sigma_B$ and $E_B$ are respectively the mechanical stress and the modulus of elasticity of buffer and where $\sigma_C$ and $E_C$ are respectively the mechanical stress and the modulus of elasticity of core.

The modulus of elasticity of silica thin films measured by micro-indentation and measured by electrostatic membrane deflection are respectively reported as 70 GPa and 69 GPa in the following two references: Thin Solid Films, Vol. 283, p. 15, (1996); IEEE Transactions on Electron Devices, Vol. ED25, No. 10, p. 1249, (1978)

To the −150 MPa compressive stress of buffer and 40 MPa tensile stress of core reported in FIG. 10 at room temperature would then be associated a strain of about −0.21% (−0.15 GPa/70 GPa) for buffer and of about 0.057% (0.040 GPa/70 GPa) for core. The negative sign indicates that the strain is outward.

This means that the buffer portion of a 5.0 µm wide deep-etched waveguide not bonded to the underlying silicon wafer and not bonded to the core portion of the same deep-etched waveguide would laterally expand by about 0.011 µm (0.21% of 5 µm) and that the buffer portion of a 1150 µm wide deep-etched grating not bonded to the underlying silicon wafer and not bonded to the core portion of the same deep-etched grating would laterally expand by about 2.46 µm (0.21% of 1150 µm). Similarily the core portion of the 5.0 µm wide deep-etched waveguide not bonded to the underlying buffer portion of the same deep-etched waveguide would laterally expand by about 0.0029 µm (0.057% of 5 µm) and that the core portion of a 1150 µm wide deep-etched grating not bonded to the underlying buffer portion of the same deep-etched grating would laterally expand by about 0.66 µm (0.057% of 1150 µm).

In reality, since buffer is bonded to the underlying silicon wafer and to the upper core at the buffer/core interface, the effect of the outward strain of buffer and of the inward strain of core would be observed as a noticeably different sloped side-wall for a narrow waveguide and for a wide grating.

If we assume a 2.0 µm deep-etched buffer and a 5.0 µm deep-etch core then the single-sided strain of the upper core surface of the 5.0 µm wide deep-etched waveguide and of the 1150 µm wide deep-etched grating could be as high as 0.0070 µm (50% of (0.011+0.0029 µm)) and 1.56 µm (50% of (2.46+ 0.66 µm)) respectively with respect to the bottom of the resulting 7.0 µm deep-etch optical element. The expected 89.9° (90°-arctan(0.0070 µm/7.0 µm)) side-wall slope of the deep-etched waveguide would not be noticeable on a SEM picture but the expected 77.4° (90°-arctan(1.56 µm/7.0 µm)) side-wall slope of the deep-etched grating would certainly be easy to see on a SEM picture.

FIG. 13 shows four SEM pictures. The first two SEM pictures show the relative position between an isolated 5.0 µm wide deep-etched waveguide and its neighboring 1150 µm wide deep-etched grating at two different magnifications. The third SEM picture confirms that side-wall of the 5.0 µm wide deep-etched waveguide facing the neighboring grating has a slope of about 90°. The fourth SEM picture confirms that side-wall of the 1150 µm wide deep-etched grating facing the neighboring deep-etched waveguide has a much smaller slope of about 84°, slightly larger than the expected 77.4° slope. The difference between the measured and expected values will be discussed below.

The mechanical stress of buffer and core must be minimized as to maintain the ideal verticality of the side-wall of the waveguides, of the grating and of the other integrated optical elements of the optical device and allow minimum power loss from undesirable reflection and refraction of the infrared optical beams at the side-wall of these optical elements.

Stress-induced Micro-structural Defects at the Buffer/core Interface or at the Core/cladding Interface FIG. 14 shows a graphical representation of the variable intensity shear stress building at the (compressive stress buffer)/(tensile stress core) interface and at the (tensile stress core)/(compressive stress cladding) interface during the stress hysteresis cycle of FIG. 10 and during the various thermal treatments in a nitrogen ambient.

If the bonding of the buffer/core interface or of the core/cladding interface is strong enough, the exposure of the various optical elements to the various thermal treatments in a nitrogen ambient can result in a modification of the microstructure near these interfaces.

FIG. 14 also shows some SEM pictures demonstrating the induced modification of the microstructure of core near these buffer/core and core/cladding interfaces.

Stress-induced Micro-voiding at the Buffer/core Interface or at the Core/cladding Interface FIG. 15 shows a graphical representation of the variable intensity shear stress building at the (compressive stress buffer)/(tensile stress core) interface and at the (tensile stress core)/(compressive stress cladding) interface during the stress hysteresis cycle of FIG. 10 and during the various thermal treatments in a nitrogen ambient. In this case, the intensity of the shear stress is such that it results in the formation of micro-voids in core and near the interfaces as an interfacial stress relief mechanism. These micro-voids are delineated during wafer preparation for SEM using a very light acid dip etch before loading in the electronic microscope.

If the bonding of the buffer/core interface or of the core/cladding interface is strong enough, the exposure of the various optical elements to the various thermal treatments in a nitrogen ambient can result in such a modification of the micro-structure near these interfaces that micro-voids are forming in core and near these interfaces.

FIG. 15 also shows some SEM pictures demonstrating that the induced modification of the microstructure of core near these buffer/core and core/cladding interfaces is cause the formation of micro-voids. It is clear on these SEM pictures that the micro-voids are generated and aligned horizontally in a plane about 0.5 μm away from the buffer/core interface. This is not that surprising since the transition from the (compressive stress buffer) to the (tensile stress core) is not absolutely abrupt at the interface and since micro-voids cannot form in a material under compressive stress.

Figure 16:
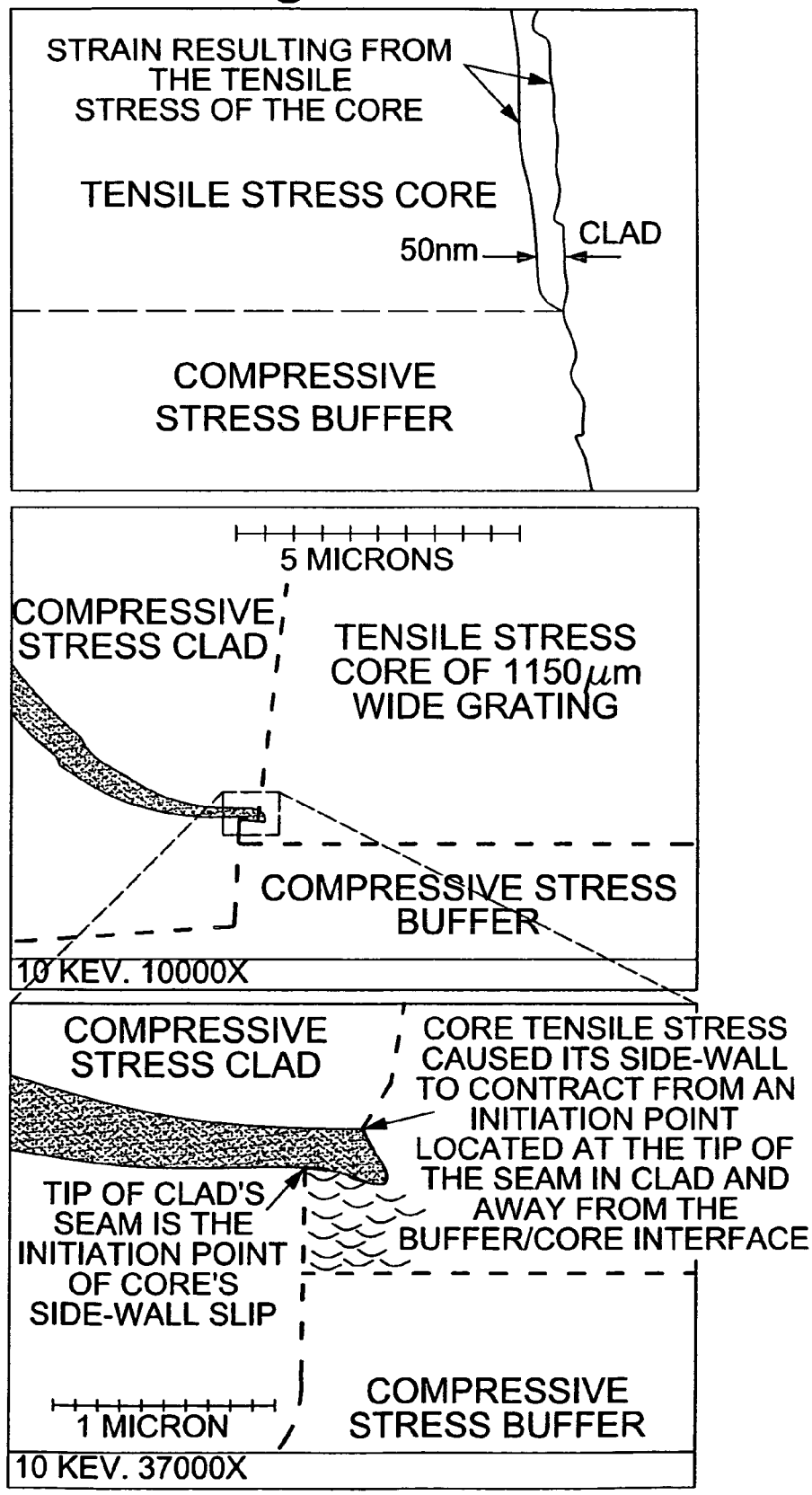
FIG. 16 shows the stress relief contraction of the tensile stress core during SEM preparation.

Stress-induced Separation at the Buffer/core Interface or at the Core/cladding Interface FIG. 16 shows some SEM pictures which demonstrate the stress relief of the variable intensity shear stress building at the (compressive stress buffer)/(tensile stress core) interface and at the (tensile stress core)/(compressive stress cladding) interface during the stress hysteresis cycle of FIG. 10, during the various thermal treatments in a nitrogen ambient or simply during wafer cleavage for SEM pictures.

In this case, the bonding of the buffer/core interface (or core/cladding interface) is not strong enough anymore and core partially slip on buffer at the buffer/core interface (or cladding partially delaminate from core at the core/cladding interface).

In one particular case, the interface separation is only observed between core and buffer, indicating that core contraction is the root cause of the delamination.

The second SEM picture of FIG. 16 shows the contraction of the 1150 μm wide grating. It is clear from this picture that a portion of core has slipped aside over buffer and over a distance of about 0.40 μm at the periphery of the grating. This is in line with the upper calculated contraction of 0.66 μm. The slip is again initiated from a point located at the tip of the seam of the cladding and slightly away from the buffer/core interface from which a crack did propagate horizontally in core and about 0.5 μm away from the buffer/core interface.

Since a crack cannot propagate in a material under compressive stress, this crack propagation did require core to be in tensile stress. Since the transition from the compressive stress buffer to the tensile stress core is not absolutely abrupt at the interface, it is normal to see the crack initiation slightly away from the buffer/core interface. The tensile stress-relief mechanism of core has partially releases its energy by propagating a 0.40 μm long crack in core and by allowing its side-wall to slip by 0.40 μm. This lateral of core explains the difference between the observed 84° of FIG. 13 and the expected 77° from the upper calculation of the expected side-wall slope.

Optimised Stress-releasing Process of Buffer (Cladding) and Core

It is clearly demonstrated that the mechanical stresses of core, buffer and cladding play a key role in the side-wall slope of deep-etched optical elements.

Figure 17:
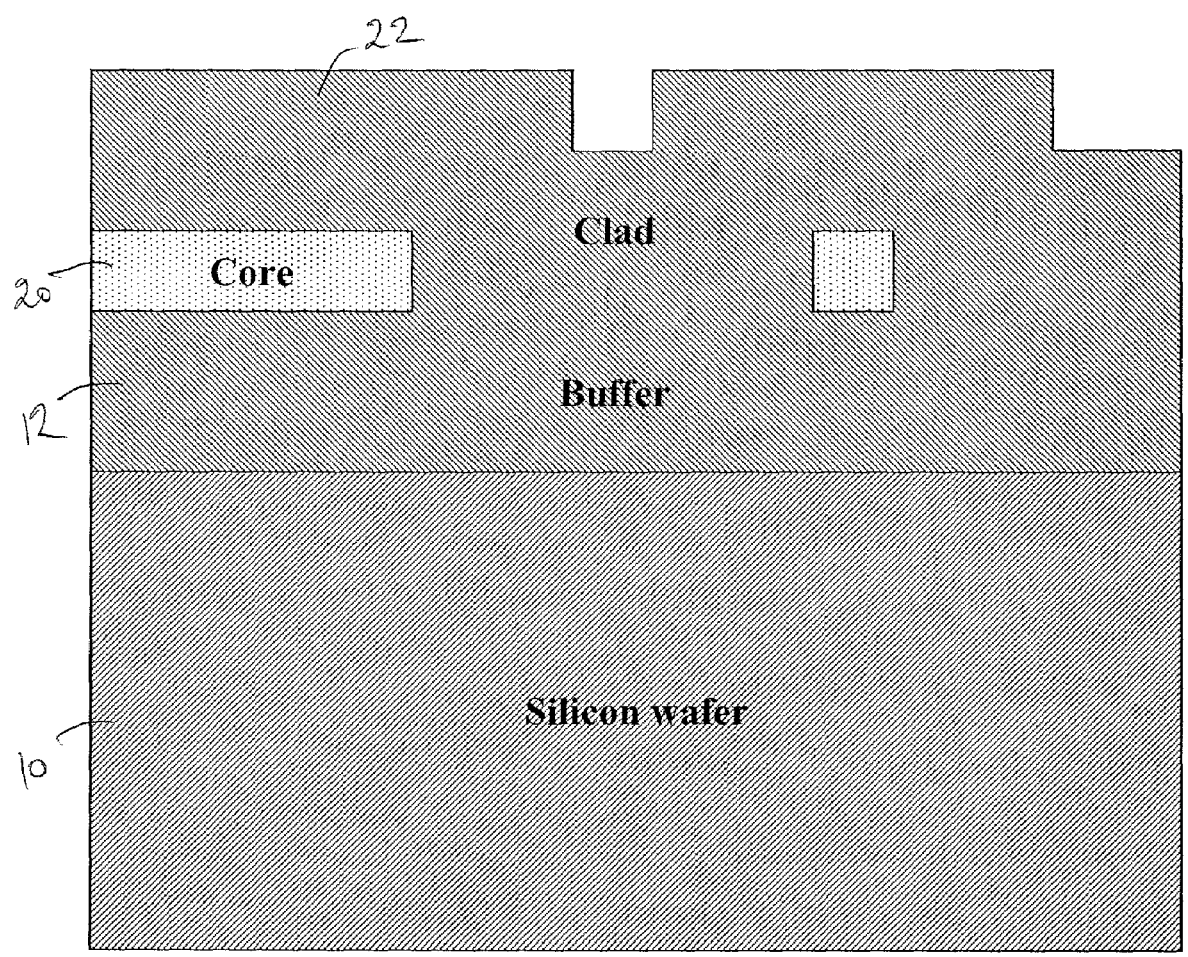
FIG. 17 shows the required buffer/core/cladding optical elements structure.

It is also clearly demonstrated from these various FTIR spectra, from the stress hysteresis of buffer, core and cladding and from the various presented SEM pictures that the optimization of the thermal treatments (i.e. the use of the Regions B1, B2, B3, C1 and C2 of the stress hysteresis of FIG. 10) is key to achieving the required 'delta-n'; and reducing the optical absorption in the 1.55 μm wavelength (and/or 1.30 wavelength) associated with the following undesirable residual oscillators: Si:N—H oscillators (observed as a FTIR peak centered at 3380 cm$^{-1}$ whose $2^{nd}$ harmonics could cause an optical absorption between 1.445 and 1.515 μm); SiN—H oscillators (centered at 3420 cm$^{-1}$ whose $2^{nd}$ harmonics could cause an optical absorption between 1.445 and 1.479 μm); SiO—H oscillators (centered at 3510 cm$^{-1}$ and whose $2^{nd}$ harmonics could cause an optical absorption between 1.408 and 1.441 μm); and eliminating the residual stress of deep-etched optical elements in core. This results in mechanical movement of core side-walls; micro-structural defects, micro-voiding and separation at the buffer/core or core/cladding interfaces; residual stress-induced optical problems Description of the Required Buffer/core/cladding Optical Elements Structure An example of the required buffer/core/cladding optical elements structure is shown in FIG. 17. It consists in a 10 μm thick buffer 12 followed by a deep-etched 5 μm thick core 20 and followed by a 10 μm thick cladding 22.

Figure 18A:
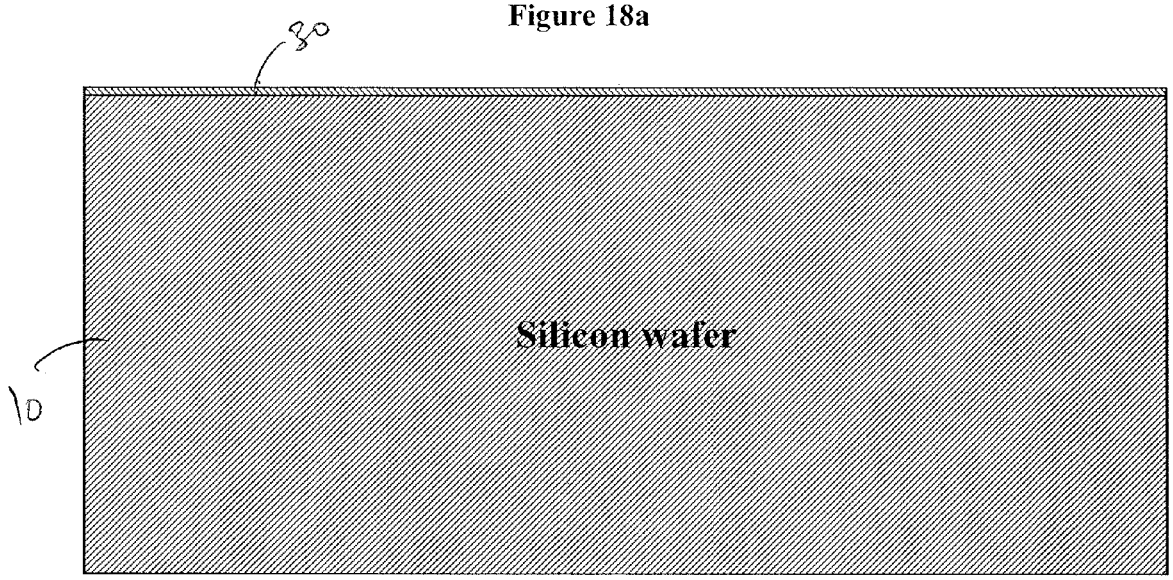
FIG. 18a shows the deposition of a 0.5 μm thick Buffer on the front face of the wafer.

In reality, to perform this optical elements structure, the following steps should be carried out as shown in FIGS. 18a to 18l:

FIG. 18a shows that in order to eliminate the marks left by the wafer holder of the PECVD equipment on the front face of the wafer during the deposition of a 10.0 μm buffer on the back face of the wafer, a 0.5 μm thick sacrificial buffer 30 is deposited on, and later removed from, the front face of the wafer.

Figure 18B:
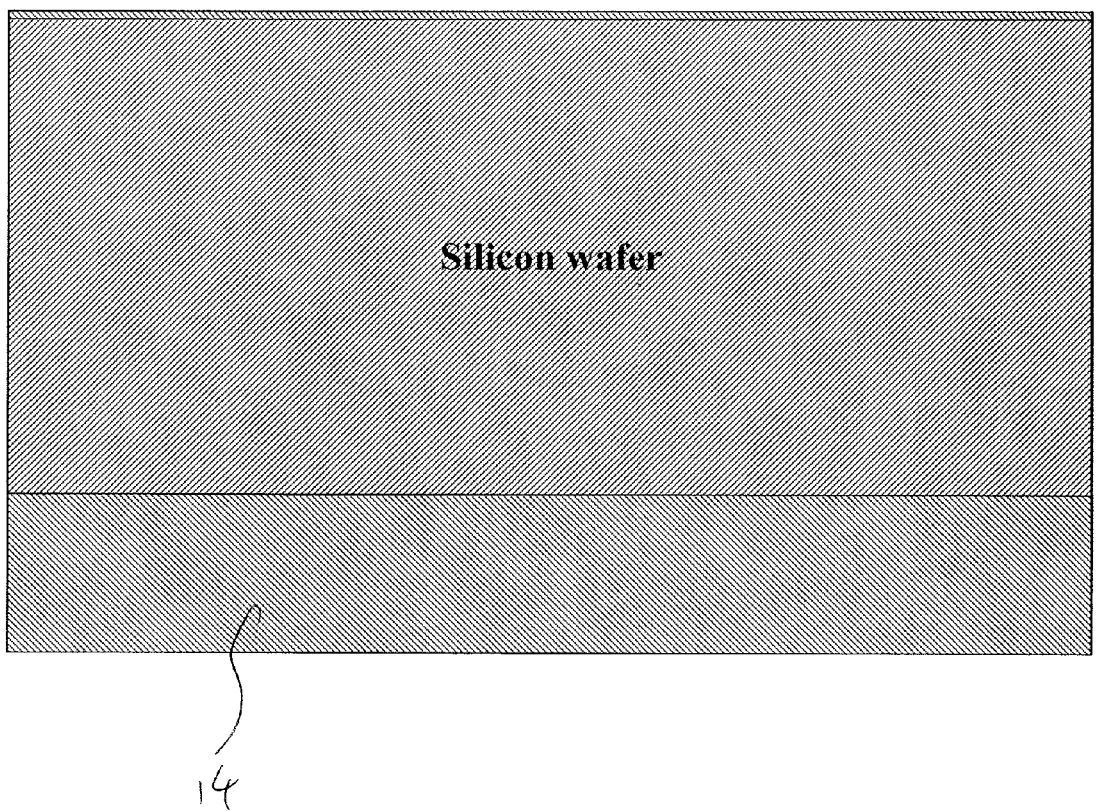
FIG. 18b shows the deposition of a 10.0 μm thick buffer on the back face of the wafer.
Figure 18C:
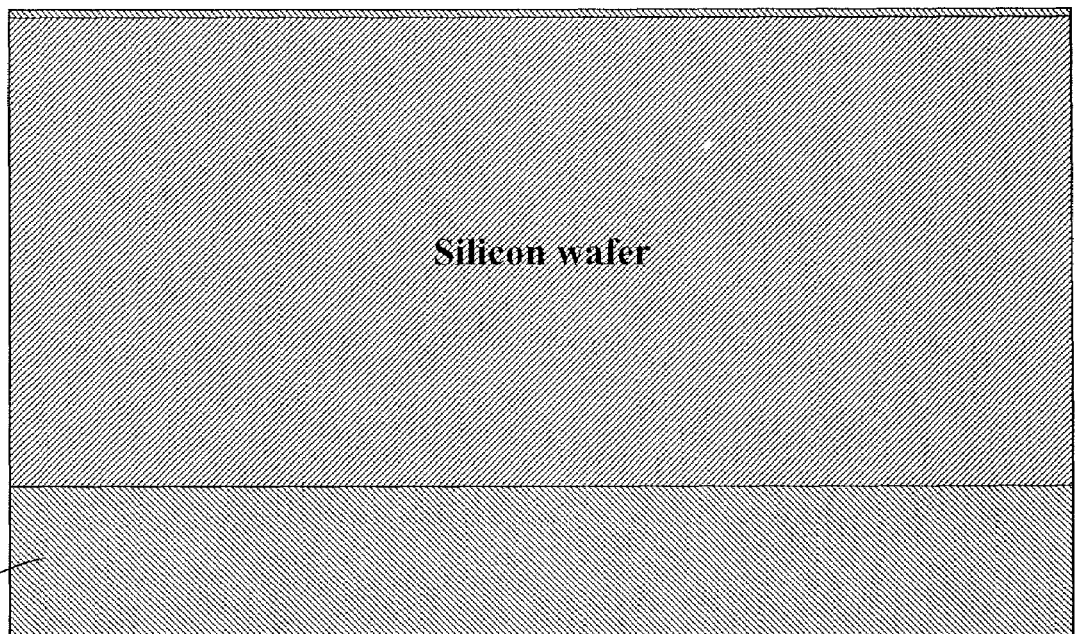
FIG. 18c shows the deposition of a 0.5 μm thick PECVD silicon nitride on the back face of the wafer.
Figure 18D:
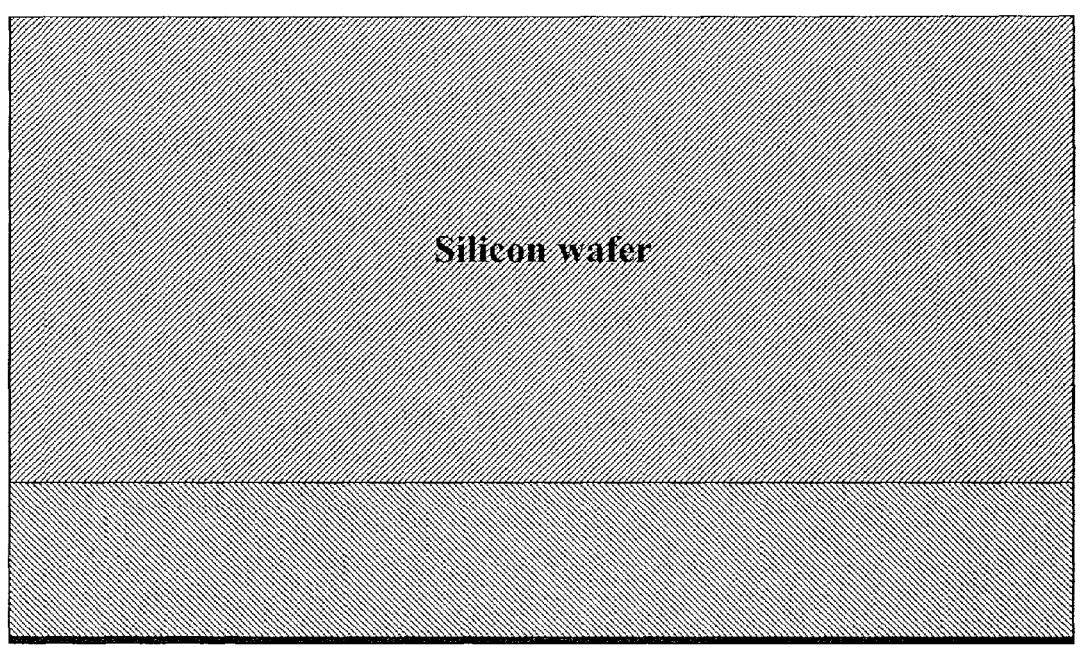
FIG. 18d shows a wet-etch of the 0.5 μm thick Buffer on the front face of the wafer and of 0.1 μm of the 0.5 μm thick PECVD silicon nitride on the back face of the wafer.
Figure 18E:
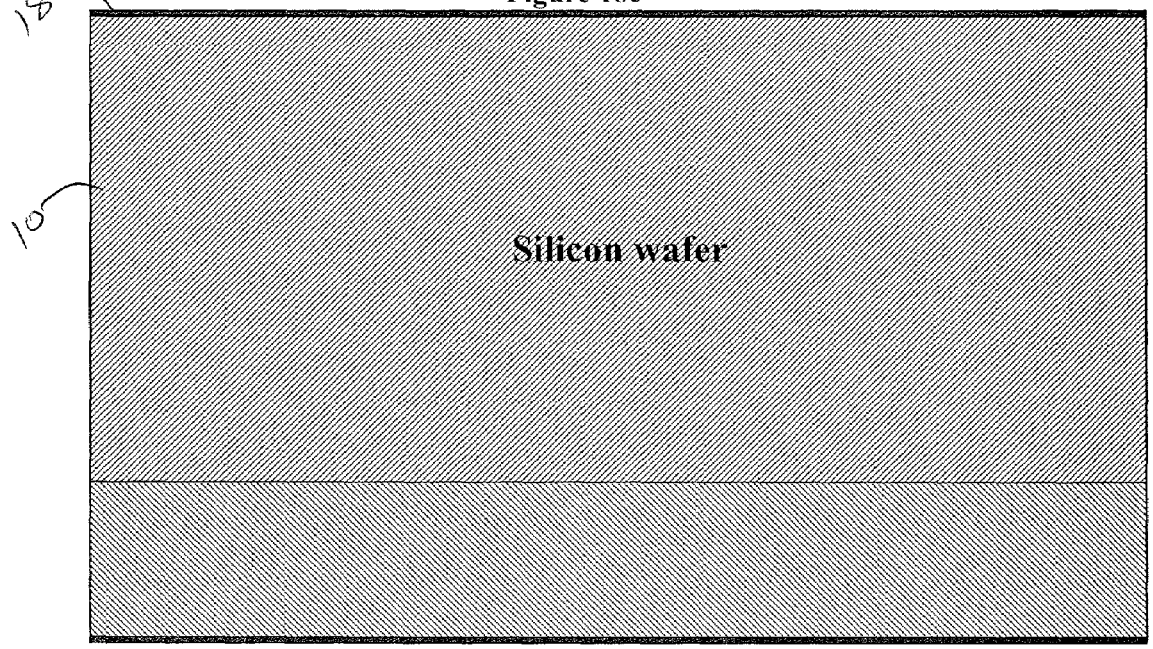
FIG. 18e shows the deposition of a 0.3 μm thick PECVD silicon nitride on the front face of the wafer.

As discussed in one of our co-pending patent application Ser. No. 09/799,491 FIG. 18b shows that in order to prevent the wafer warp pr various thermal treatments a 10.0 μm thick buffer 14 is deposited on the back face of the silicon wafer to compensate for the 10.0 μm to be deposited on the front face of the wafer;

FIG. 18c shows that in order to protect the buffer on the back face of the wafer during the wet-etch of the 0.5 μm thick sacrificial buffer on the front face of the wafer, a 0.5 μm thick layer of PECVD nitride 32 is deposited on the back face of the wafer. About 0.1 μm of the 0.5 μm thick layer of PECVD nitride will be removed on the back face of the wafer during the subsequent wet-etch of the 0.5 μm thick sacrificial buffer on the front face of the wafer;

FIG. 18d shows that in order to remove the sacrificial 0.5 μm thick buffer on the front face of the wafer and the undesirable marks left by the wafer holder of the PECVD equipment an non-patterned wet-etch is performed simultaneously on both faces of the wafer. This wet-etch removes all of the 0.5 μm think buffer on the front face of the wafer and about 0.1 μm of the 0.5 μm thick PECVD silicon nitride deposited on the back face of the wafer;

FIG. 18e shows that in order to compensate for the remaining 0.4 μm of PECVD silicon nitride on the back face of the wafer and to prevent the wafer warp problem associated with the various thermal treatments a 0.3 μm thick PECVD silicon nitride layer 18 on the front face of the wafer (the difference of 0.1 μm is to take into account another removal of about 0.1 μm of PECVD silicon nitride in a later wet-etch step of the process).

Figure 18F:
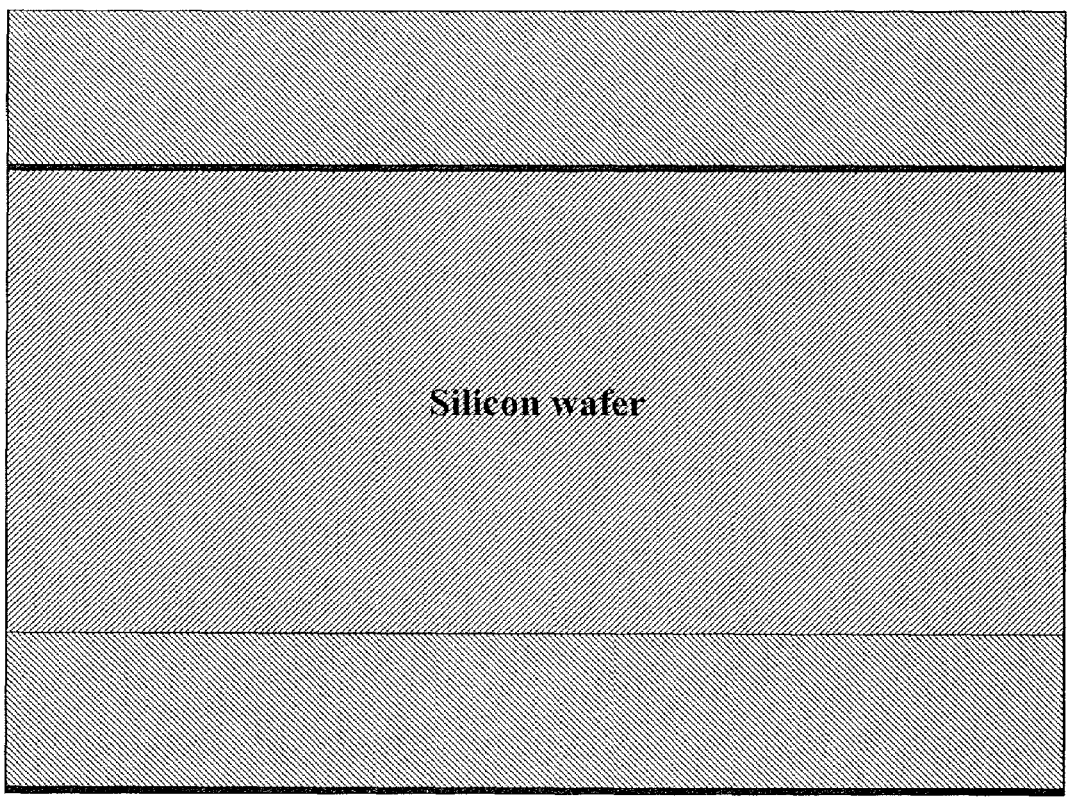
FIG. 18f shows the deposition of a 10.0 μm thick buffer on the front face of the wafer.

FIG. 18f shows that in order to produce the first layer of the optical elements, a 10.0 μm thick buffer layer 12 is deposited on the front face of the wafer.

Figure 18G:
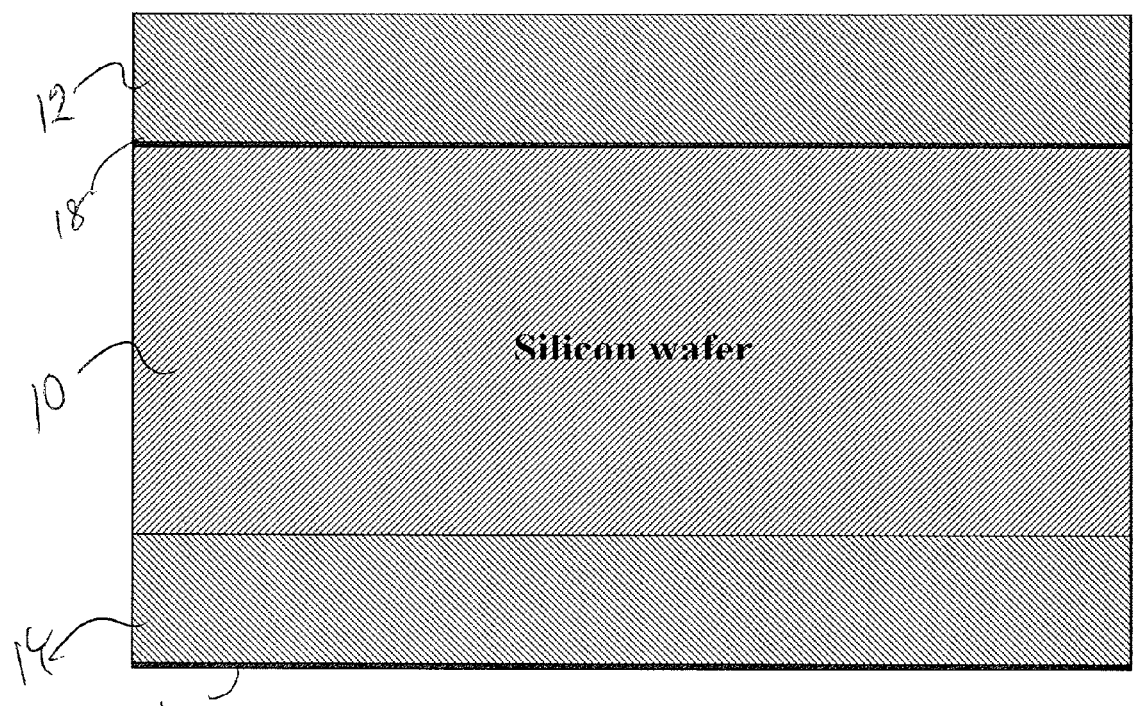
FIG. 18g shows a first optimised thermal treatment of in accordance with one embodiment of the invention.
Figure 18H:
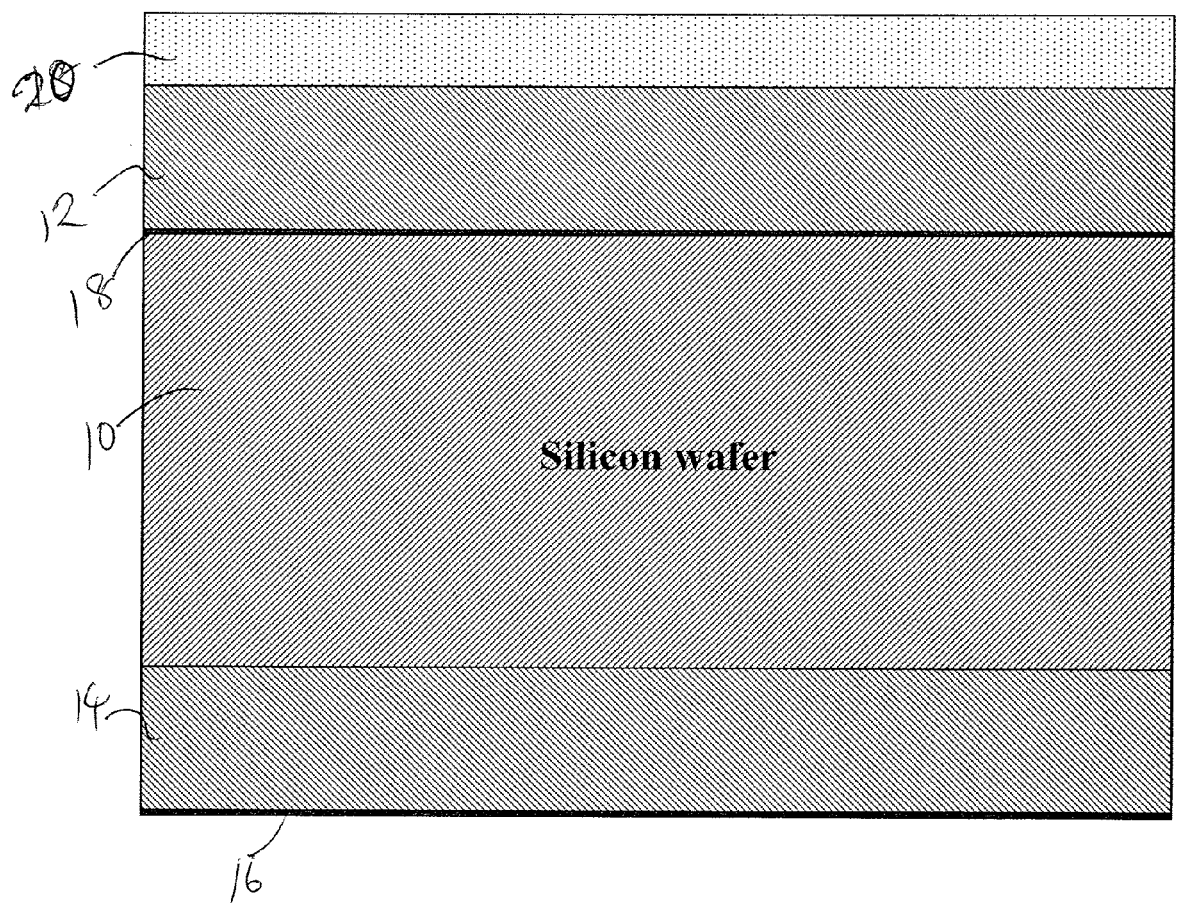
FIG. 18h shows the deposition of a 5.0 μm thick core on the front face of the wafer.

FIG. 18g shows that in order to achieve the required optical and mechanical properties of buffer, the first optimized thermal treatment should preferably be carried out on the above-formed structure consisting of 10.0 μm thick buffer 12 on the front face of the wafer 10, its equivalent 10.0 μm thick buffer 14 on the back face of the wafer, a remaining 0.4 μm thick PECVD silicon nitride layer 16 on the back face of the wafer, and a compensating 0.3 μm thick PECVD silicon nitride layer 18 on the front face of the wafer;

FIG. 18h shows that in order to produce the first layer of the optical elements, a 5.0 μm thick core 20 is desposited on the front face of the wafer.

Figure 18I:
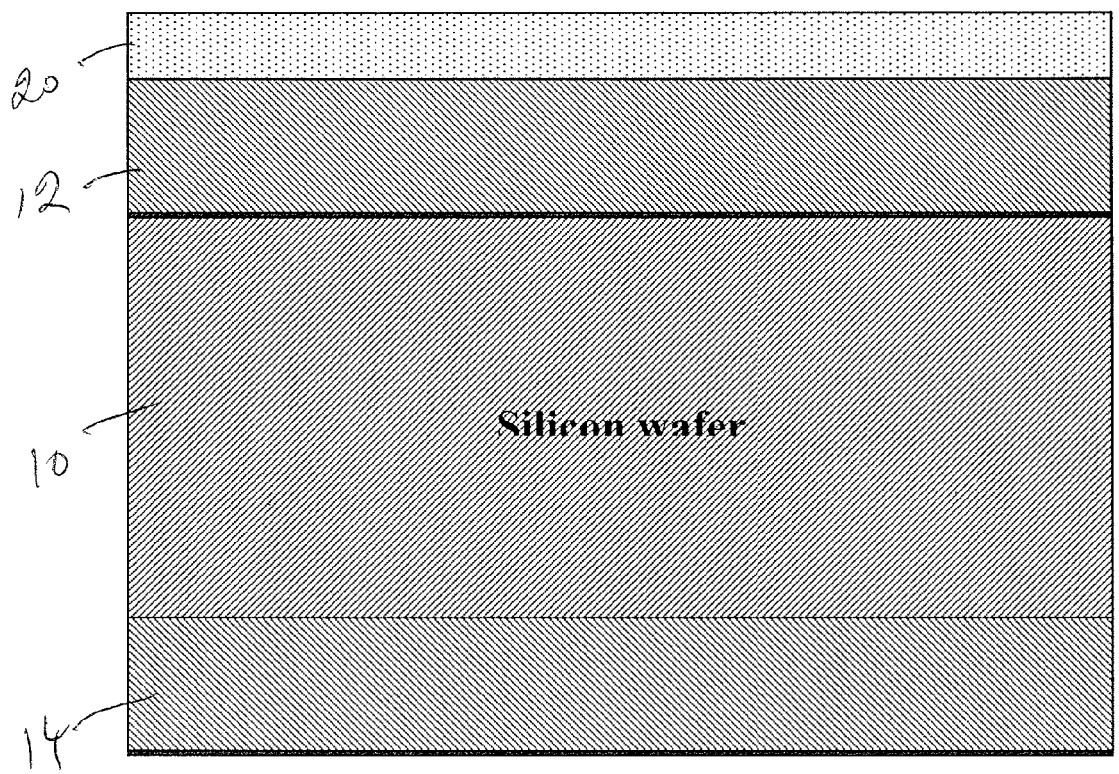
FIG. 18i shows a second optimised thermal treatment in accordance with the invention.
Figure 18J:
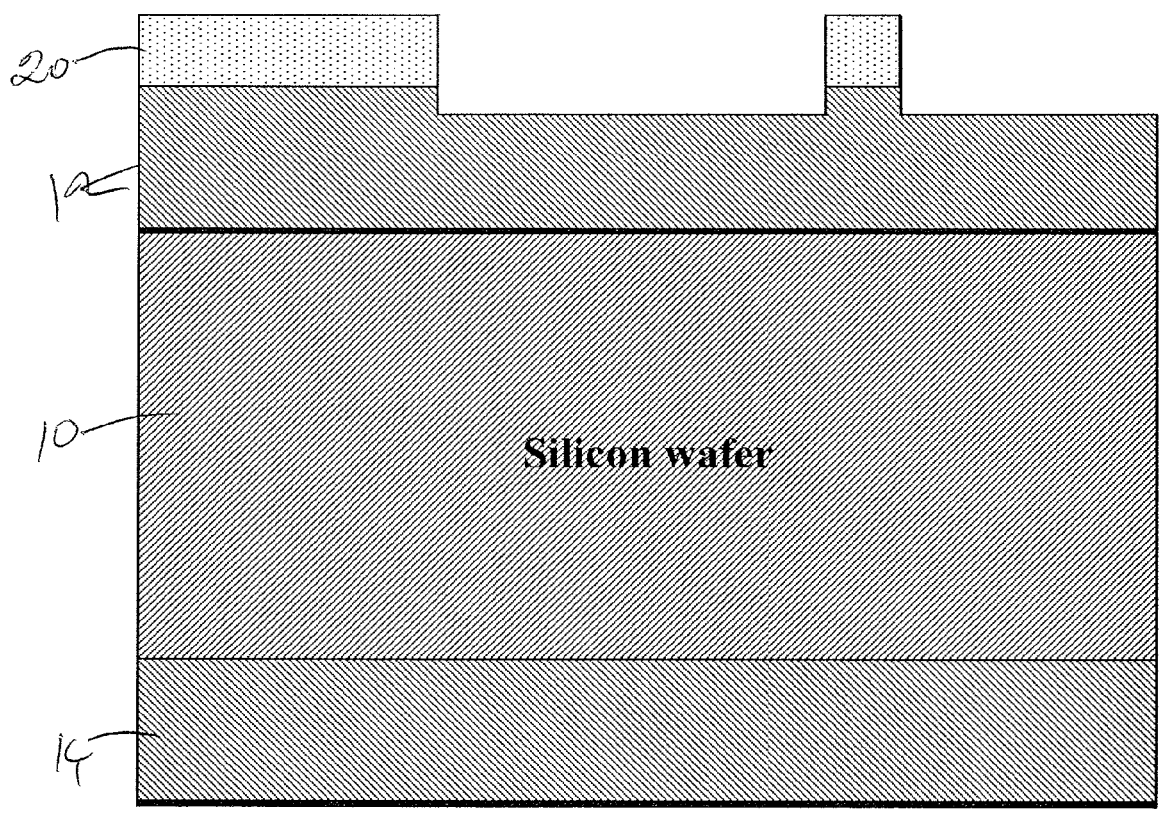
FIG. 18j shows the deep-etching of a core with a 2.0 μm penetration into a buffer.

FIG. 18i shows that in order to achieve the required optical and mechanical properties of core, the second optimized thermal treatment should be performed on the 5.0 μm thick core 20 on the front face of the wafer, the underlying 10.0 μm thick buffer 12 on the front face of the wafer, its equivalent 10.0 μm thick buffer 14 von the back face of the wafer, the remaining 0.4 μm thick PECVD silicon nitride layer 16 on the back face of the wafer, the compensating 0.3 μm thick PECVD silicon nitride layer 18 on the front face of the wafer;

FIG. 18j shows that in order to define the optical elements, the 5.0 μm thick core on the front face of the wafer patterned and deep-etched with a small penetration of about 2.0 μm into the 10.0 μm thick buffer.

Figure 18K:
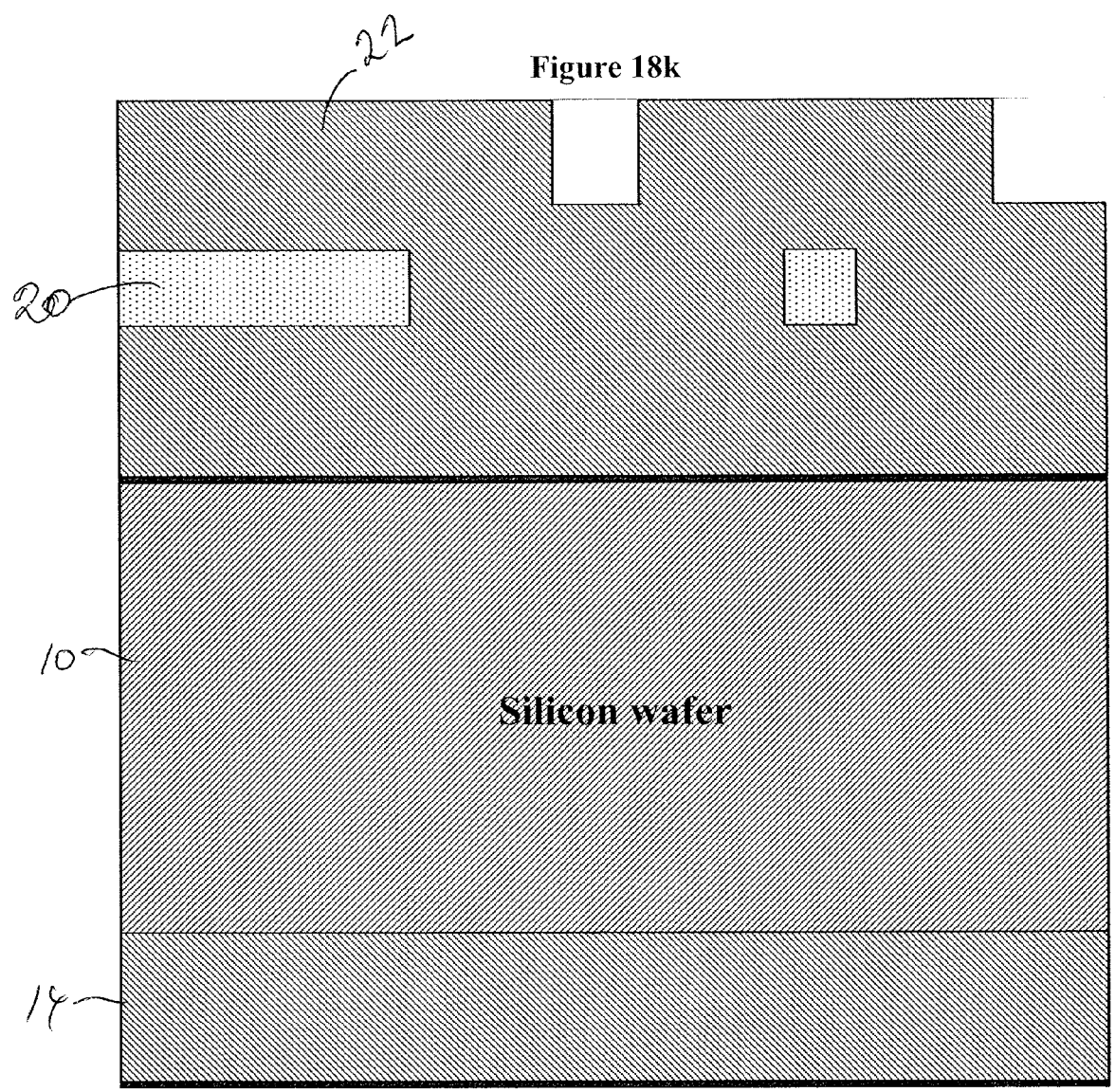
FIG. 18k shows the deposition of a 10.0 μm thick cladding on the front face of the wafer.

FIG. 18k shows that in order to produce the third layer of the optical elements, a 10.0 μm thick cladding layer 22 is deposited on the front face of the wafer.

Figure 18L:
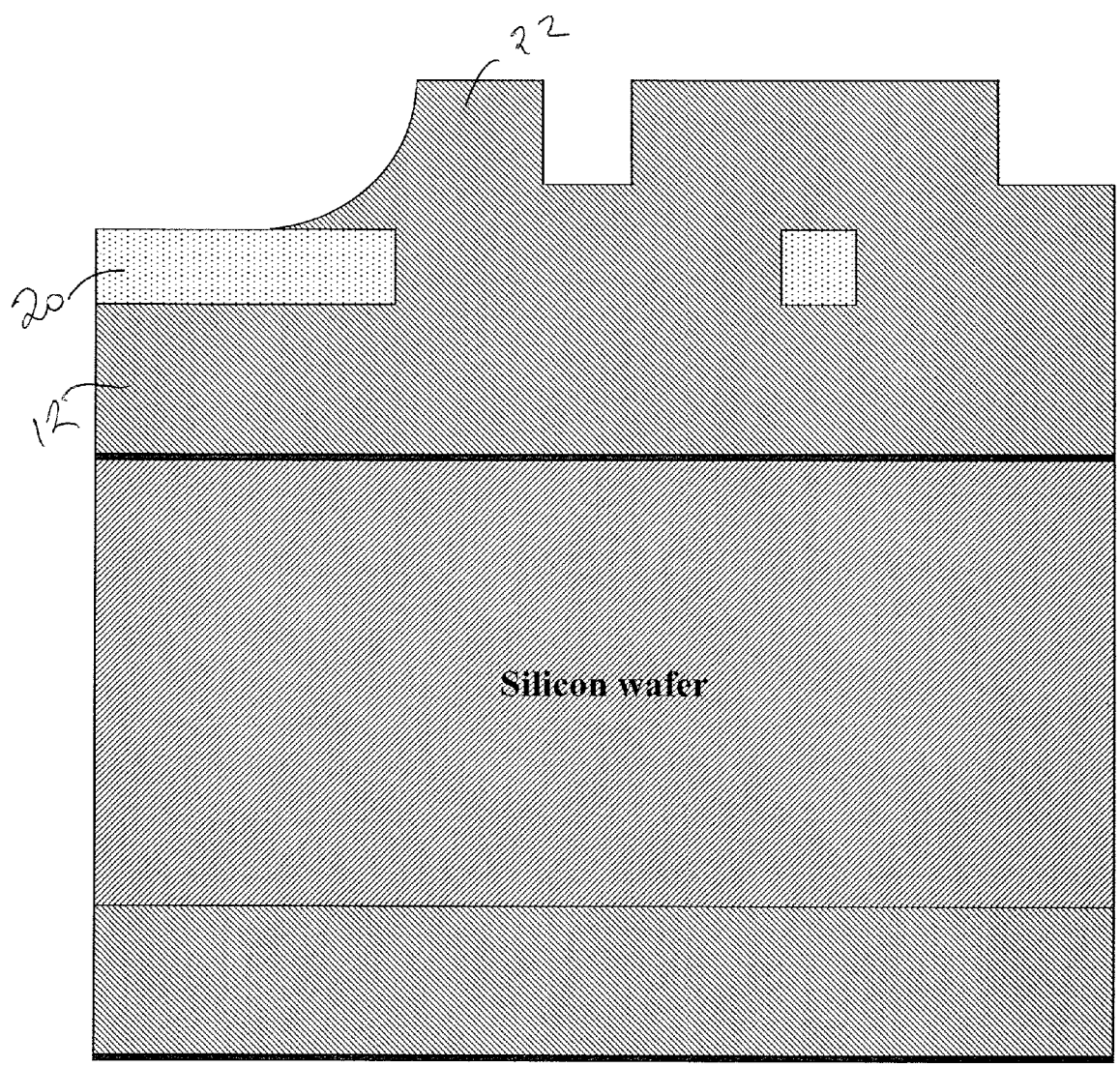
FIG. 18l shows the pattern and wet-etch of the 10.0 μm thick cladding on the front face of the wafer.

FIG. 18l shows that in order to define the optical elements, it is necessary to pattern and wet-etch the 10.0 μm thick cladding 22 on the front face of the wafer while protecting the 10.0 μm thick buffer on the back face of the wafer with the remaining 0.4 μm of PECVD silicon nitride on the back face of the wafer which will be consumed by about 0.1 μm as to finish with a residual 0.3 μm of PECVD silicon nitride on the back face of the wafer.

The two optimized thermal treatments of FIG. 18g, and FIG. 18i allow the optimized optical and mechanical properties of the optical elements.

Description of the First Optimised Thermal Treatment:

The first optimized thermal treatment is required to achieve the required optical and mechanical properties of buffer.

FIG. 18g shows that the first optimized thermal treatment of this is performed on a structure comprising a 10.0 μm thick buffer on the front face of the wafer, an equivalent 10.0 μm thick buffer on the back face of the wafer, a remaining 0.4 μm thick PECVD silicon nitride on the back face of the wafer, and a compensating 0.3 μm thick PECVD silicon nitride on the front face of the wafer.

The goal of this first optimized thermal treatment is to reduce the optical absorption, the wafer warp and the compressive stress of buffer.

Reduction of Optical Absorption of Buffer Following a Thermal Treatment:

It is clear from FIG. 9a that it is important to reach a temperature of at least 1100° C. to eliminate the optical absorption of typical PECVD buffer.

It is clear from FIG. 9b that our patent application titled 'Plasma Enhanced Chemical Vapour deposition of low optical silica films for Mux/Dmux optical devices' allows the minimum temperature to be reduced to about 800° C. in order to eliminate the optical absorption of these special buffer deposited by this patent pending technique.

So, a thermal treatment temperature of at least 800° C. will ensure the elimination of the optical absorption of these special buffer deposited by this patent pending technique.

Reduction of Wafer Warp Due to a Thermal Treatment of Buffer:

FIG. 18g uses the principles of our patent application titled 'A Technique to Allow the Manufacturing of Silica Waveguides in MUX/DMUX Optical Devices' and a structure consisting of a 10.0 μm thick buffer on the front face of the wafer, its equivalent 10.0 μm thick buffer on the back face of the wafer, a remaining 0.4 μm thick PECVD silicon nitride on the back face of the wafer, and a compensating 0.3 μm thick PECVD silicon nitride on the front face of the wafer.

This structure prevents the wafer warp problem associated with the thermal treatment to be performed on the 10.0 μm thick buffer on the back face of the silicon wafer. The symmetry of films on the front face as well as on the back face of the silicon wafer allows the use of a wide variety of thermal treatments without the associated wafer warp problem.

Reduction of the Compressive Mechanical Stress of Buffer Following the First Optimised Thermal Treatment:

It is clear from FIG. 10 that the mechanical stress of buffer is compressive at about −250 MPa prior to the stress hysteresis cycle and following its Plasma Enhanced Chemical Vapor Deposition at a substrate temperature of 400° C. and following its cooling at room temperature; follows an elastic deformation and decreases linearly as the temperature is increased linearly from room temperature to about 450° C., an expected situation since the coefficient of linear expansion of silica-based buffer is smaller than the one of the underlying silicon; follows three plastic deformations during the stress hysteresis cycle up to 800° C. (Region B1, from 450° C. to 575° C., where the compressive mechanical stress decreases much faster than what is expected from a linear decrease associated with its elastic deformation; Region B2, from 575° C. to 650° C., where the compressive mechanical stress is almost constant; and Region B3, during the 180 minutes stabilization at 800° C., where the compressive mechanical stress gradually decreases as the temperature remains unchanged at 800° C.); follows another elastic deformation and increases linearly as the temperature is decreased linearly from 800° C. to room temperature, an expected situation since the coefficient of linear expansion of silica-based buffer is smaller than the one of the underlying silicon; and is still compressive at about −150 MPa after the stress hysteresis cycle up to 800° C.

The compressive mechanical stress of buffer prior to the thermal treatment is well in control at about −250 MPa. In order to reduce its compressive mechanical stress and to prevent the upper-discussed mechanical problems reported in FIG. 12, FIG. 13, FIG. 14, FIG. 15 and FIG. 16 following the deep-etch of FIG. 18j, it is necessary to make sure that all wafers are exposed to the exact same optimized thermal treatment, particularly in the regions B1, B2 and B3 of FIG. 10; make sure that the maximum temperature of the thermal treatment exceeds 800° C. as to reduce even more the room temperature compressive stress following the elastic deformation as the temperature is decreased linearly from the maximum temperature to room temperature (Cooling to RT of FIG. 10); and make sure that the duration of the thermal treatment at the maximum temperature is long enough as to allow the compressive stress to relax (Region B3 of FIG. 10).

Figure 19:
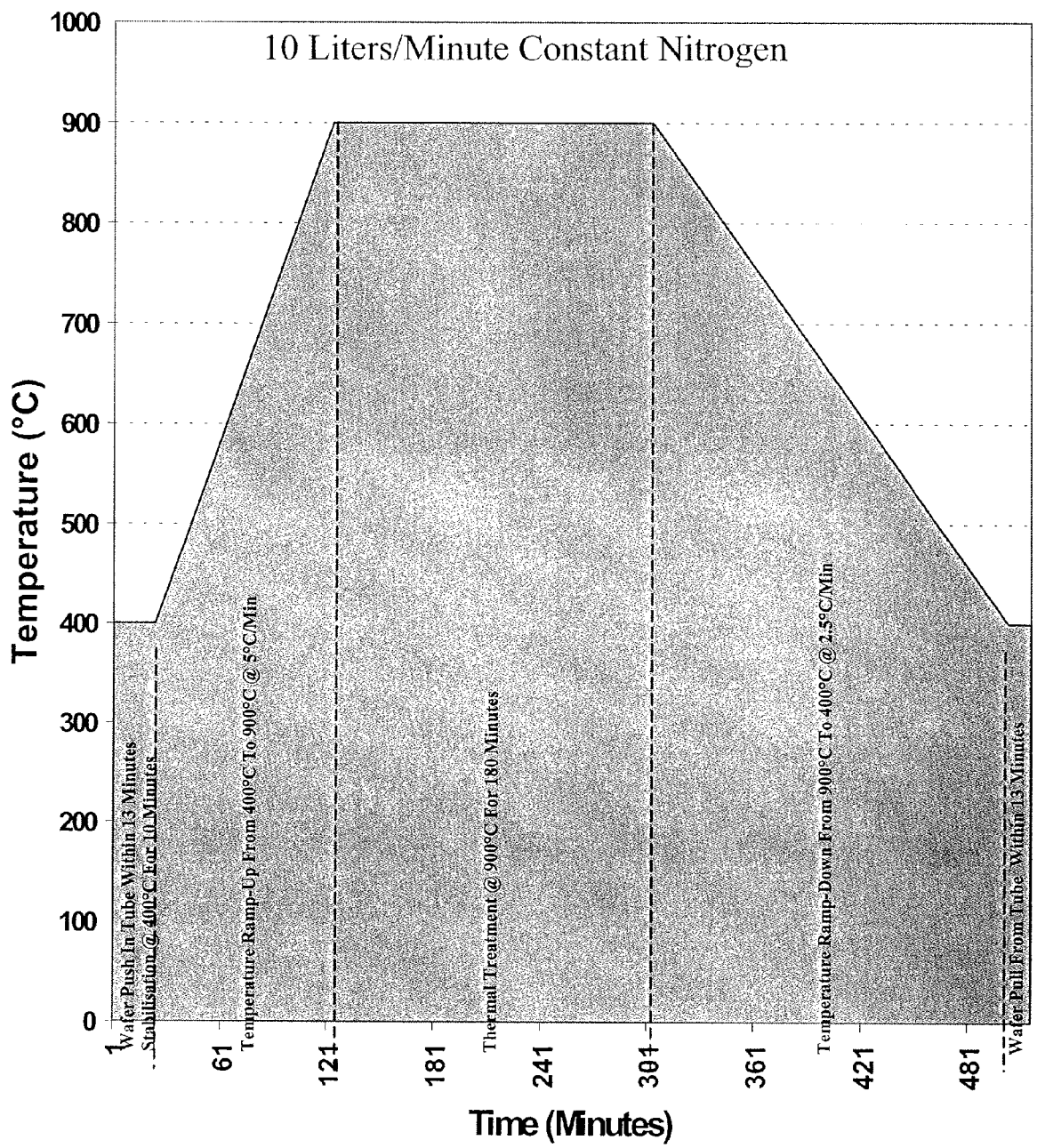
FIG. 19 show the temperature profile of the first optimized thermal treatment.

The temperature profile of the first optimized thermal treatment is shown on FIG. 19. This optimized thermal treatment is characterized by a constant flow of 10 liters/minute of nitrogen throughout the process; a 13 minutes duration wafer push into a diffusion tube stabilized at a temperature of 400° C. (This stabilization temperature of 400° C. is important since each one of the 125 wafers of a load sees a slightly different temperature profile up to this stabilization temperature during the 13 minutes duration wafer push step of FIG. 19. Since this stabilization temperature of 400° C. is lower than the minimum temperature of 450° C. causing the first plastic deformation associated with region B1 of FIG. 10, the slight variation of temperature profile from wafer-to-wafer will have no effect on the post-thermal-treatment mechanical stress); a 10 minutes stabilization time prior ramp-up of the temperature of the diffusion tube; a controlled ramp-up at a rate of 5° C./minute up to the maximum thermal treatment temperature of 900° C. in order to cross the Region B1 and Region B2 of FIG. 10 in a controlled and repeatable fashion for all of the wafers in the load; a 180 minutes duration thermal treatment at the maximum thermal treatment temperature of 900° C. in order to allow a repeatable stress relaxation in the Region B3 of FIG. 10 for all of the wafers in the load; a controlled ramp-down at a rate of 2.5° C./minute down to 400° C. in order to control the cooling rate and the (nitrogen) ambient as to reproduce the elastic behavior of FIG. 10 for all of the wafers in the load; and a 13 minutes duration wafer pull from the diffusion tube stabilized at a temperature of 400° C.

Description of the Second Optimised Thermal Treatment:

The second optimized thermal treatment is required as to achieve the required optical and mechanical properties of core.

FIG. 18i shows that the second optimized thermal treatment of this patent application is performed on a structure comprising a 10.0 μm thick buffer on the front face of the wafer, its equivalent 10.0 μm thick buffer on the back face of the wafer, a remaining 0.4 μm thick PECVD silicon nitride on the back face of the wafer, a compensating 0.3 μm thick PECVD silicon nitride on the front face of the wafer, and a 5.0 μm thick core on the front face of the wafer.

The goal of this second optimized thermal treatment is to reduce the optical absorption, the wafer warp and the tensile stress of core.

Reduction of Optical Absorption of Core Following a Thermal Treatment:

It is clear from FIG. 9c that our patent application titled 'Silica waveguides for Mux/Dmux optical devices' allows the achievement of excellent optical quality core following a 180 minutes thermal treatment in a nitrogen ambient at a reduced temperature of 800° C.

It is clear from FIG. 9d that our patent application titled 'A technique to optimize the optical and mechanical properties of silica-based optical elements in integrated optical devices' allows the optimization of the temperature of the thermal treatment as to simultaneously minimize the optical absorption and the mechanical stress of core.

Reduction of the Tensile Mechanical Stress of Core Following the Second Optimised Thermal Treatment:

It is can be seen from FIG. 10 that the mechanical stress of core is tensile at about 175 MPa prior to the stress hysteresis cycle and following its Plasma Enhanced Chemical Vapor Deposition at a substrate temperature of 400° C. and following its cooling at room temperature; follows an elastic deformation and decreases linearly as the temperature is increased linearly from room temperature to about 450° C., an expected situation since the coefficient of linear expansion of silica-based core is smaller than the one of the underlying silicon; follows two plastic deformations during the stress hysteresis cycle up to 800° C. (Region C1, from 450° C. to 675° C., where the tensile mechanical stress decreases as the temperature is increased; Region C2, from 675° C. to 800° C., where the tensile mechanical stress is almost constant); follows another elastic deformation and increases linearly as the temperature is decreased linearly from 800° C. to room temperature, an expected situation since the coefficient of linear expansion of silica-based core is smaller than the one of the underlying silicon; and is still tensile at about 40 MPa after the stress hysteresis cycle up to 800° C.

The tensile mechanical stress of core prior to the thermal treatment is well in control at about 175 MPa. In order to reduce its tensile mechanical stress and to prevent the upper-discussed mechanical problems reported in FIG. 12, FIG. 13, FIG. 14, FIG. 15 and FIG. 16 following the deep-etch of FIG. 18j, it is necessary to make sure that all wafers are exposed to the exact same optimized thermal treatment, particularly in the regions C1 and C2 of FIG. 10; make sure that the maximum temperature of the thermal treatment exceeds 800° C. as to reduce even more the room temperature tensile stress following the elastic deformation as the temperature is decreased linearly from the maximum temperature to room temperature (Cooling to RT of FIG. 10); and make sure that the duration of the thermal treatment at the maximum temperature is long enough as to allow the tensile stress to relax (Region C2 of FIG. 10).

Figure 20:
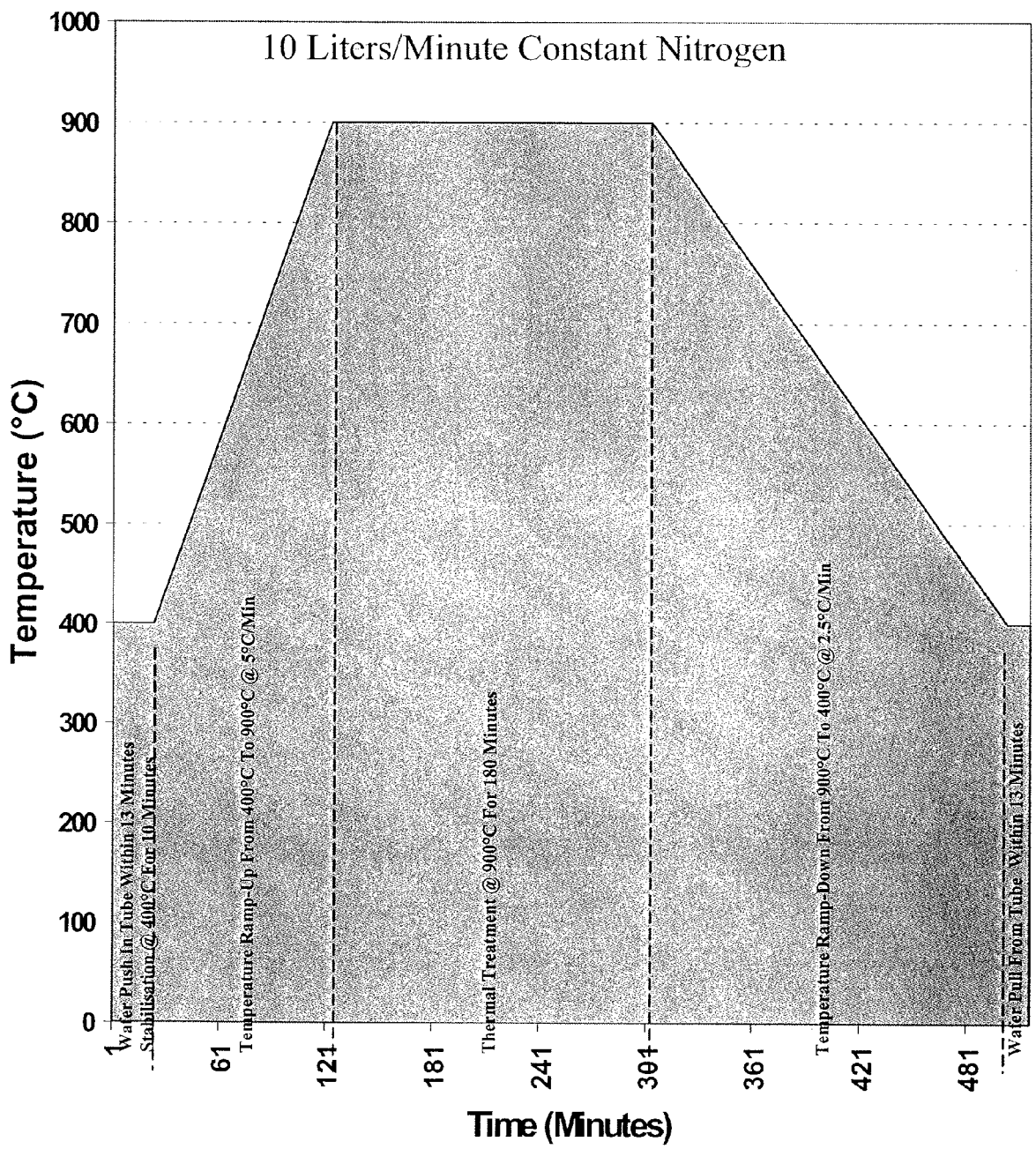
FIG. 20 shows the temperature profile of the second optimized thermal treatment.

The temperature profile of the second optimized thermal treatment is shown on FIG. 20. This optimized thermal treatment is characterized by a constant flow of 10 liters/minute of nitrogen throughout the process; a 13 minutes duration wafer push into a diffusion tube stabilized at a temperature of 400° C. (This stabilization temperature of 400° C. is important since each one of the 125 wafers of a load sees a slightly different temperature profile up to this stabilization temperature during the 13 minutes duration wafer push step of FIG. 20. Since this stabilization temperature of 400° C. is lower than the minimum temperature of 450° C. causing the first plastic deformation associated with region C1 of FIG. 10;, the slight variation of temperature profile from wafer-to-wafer will have no effect on the post-thermal-treatment mechanical stress); a 10 minutes stabilization time prior ramp-up of the temperature of the diffusion tube; a controlled ramp-up at a rate of 5° C./minute up to the maximum thermal treatment temperature of 900° C. in order to cross the Region C1 and Region C2 of FIG. 10 in a controlled and repeatable fashion for all of the wafers in the load; a 180 minutes duration thermal treatment at the maximum thermal treatment temperature of 900° C. in order to allow a repeatable stress relaxation in the Region C2 of FIG. 10 for all of the wafers in the load; a controlled ramp-down at a rate of 2.5° C./minute down to 400° C. in order to control the cooling rate and the (nitrogen) ambient as to reproduce the elastic behavior of FIG. 10 for all of the wafers in the load; and a 13 minutes duration wafer pull from the diffusion tube stabilized at a temperature of 400° C.

Demonstration of the Stress-releasing Process of the Buffer/core Structure

Figure 21:
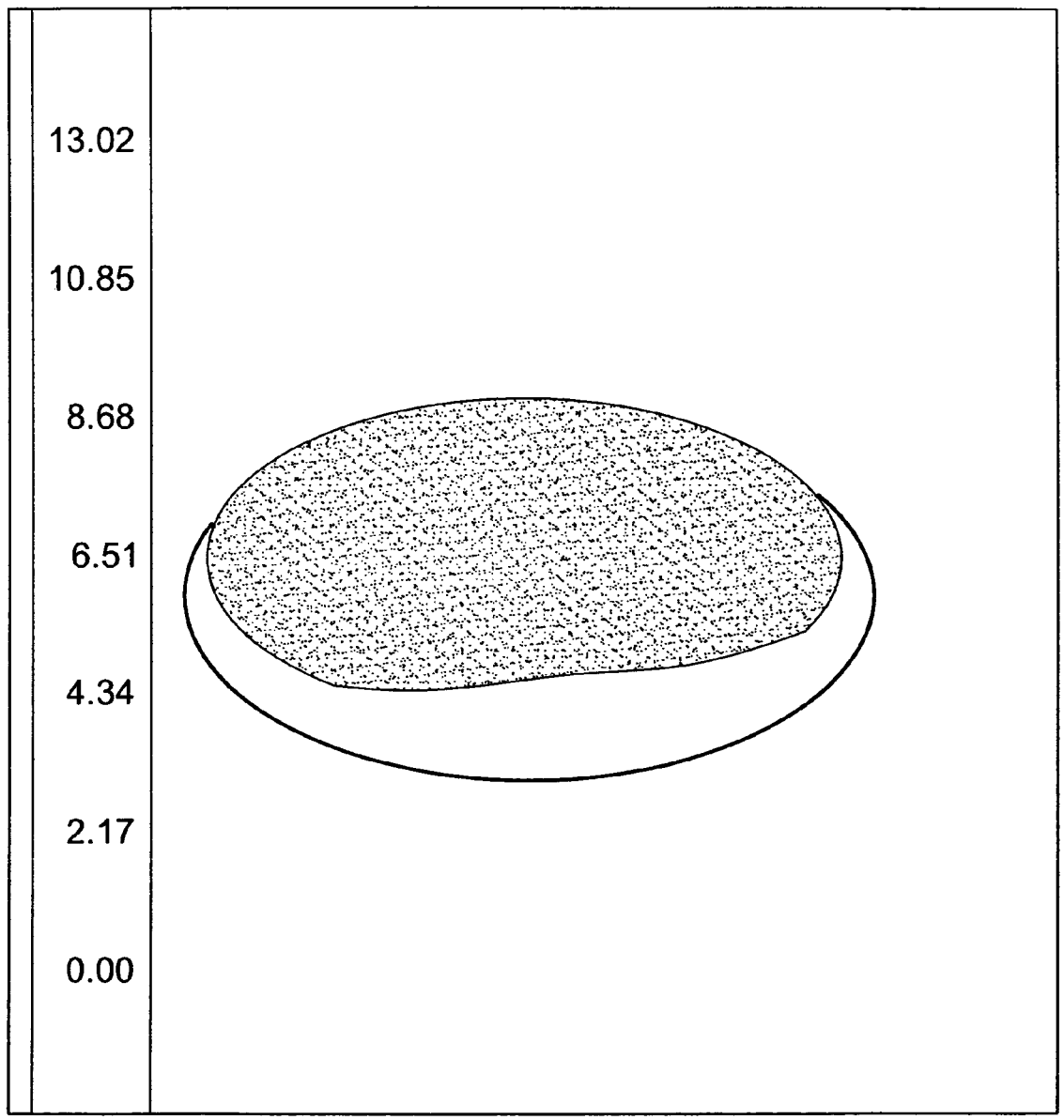
FIG. 21 shows the shape of the wafer before any processing.

FIG. 21 shows the shape of the silicon wafer before any processing. The relatively flat shape is typical of a SEMI standard silicon wafer.

Figure 22:
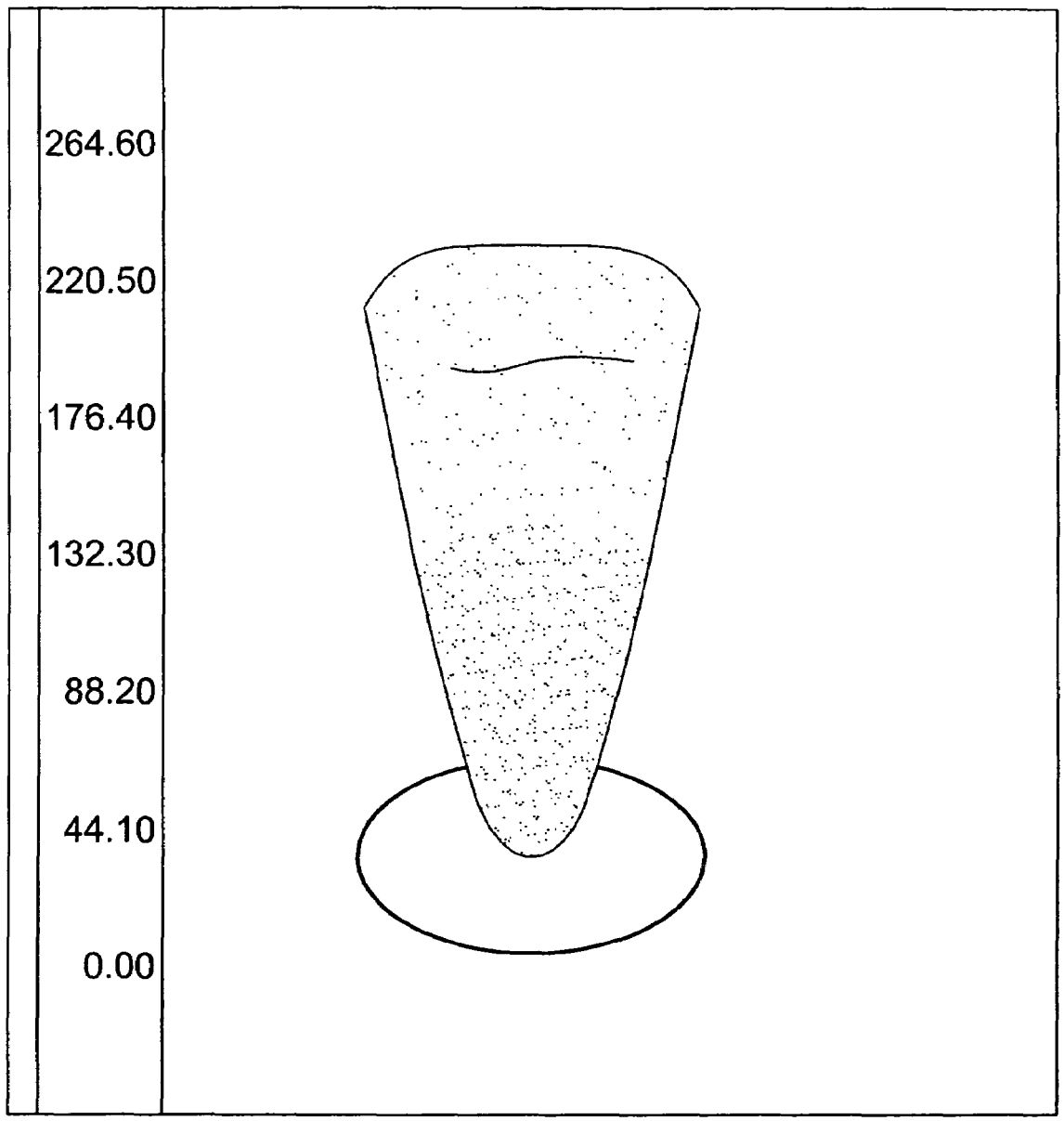
FIG. 22 shows the shape of the wafer after deposition of a 5.0 μm thick Core on the front face of the wafer (i.e.

FIG. 22 shows the shape of the same silicon wafer just after the deposition of the 5.0 μm thick core on the front face of the wafer, i.e. at the process step corresponding to FIG. 18h. It is clear that the tensile mechanical stress of core is causing the silicon wafer to warp upward in a U shape.

Figure 23:
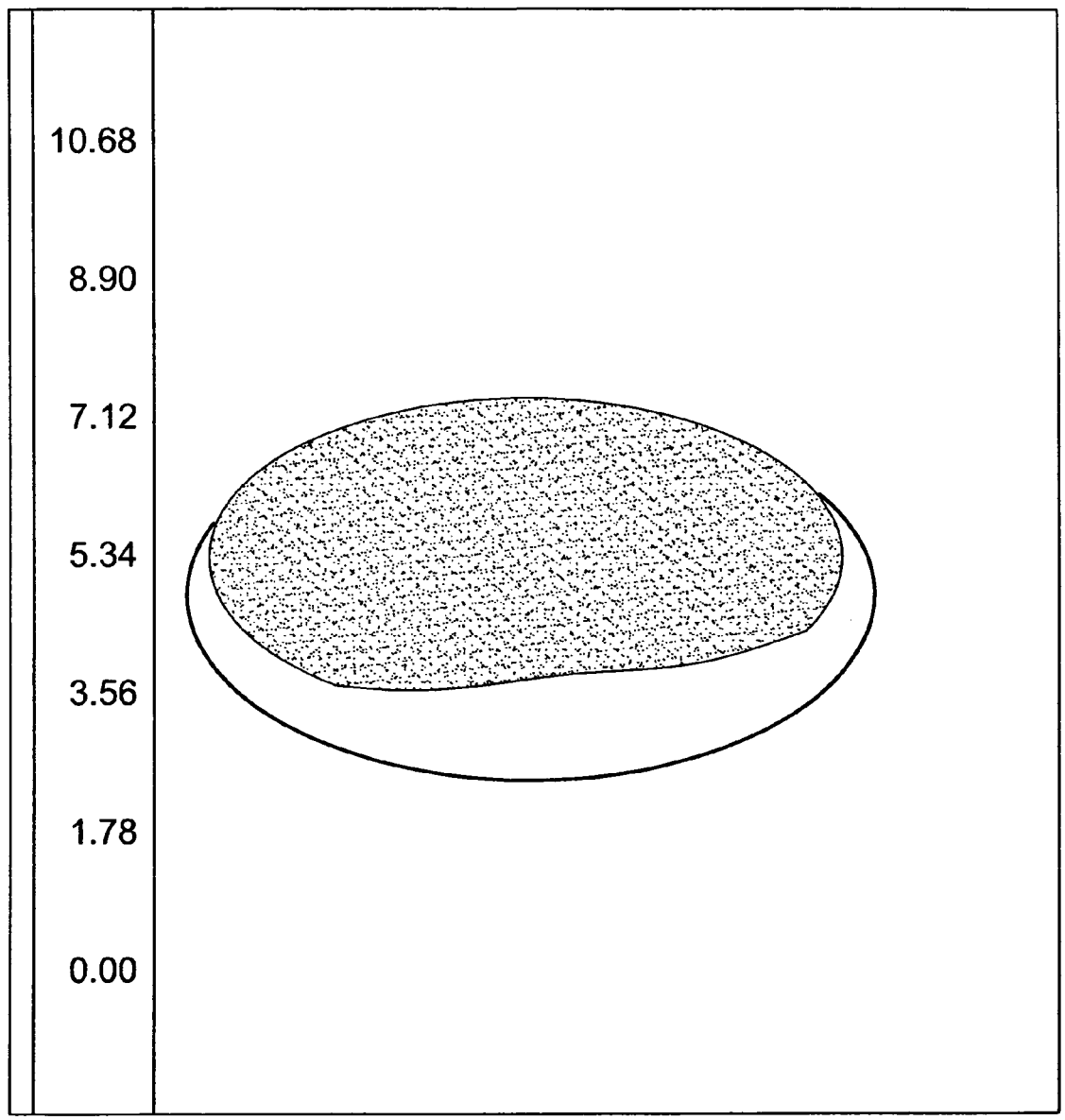
FIG. 23 shows the shape of the wafer after the second optimised thermal treatment of this patent application (i.e.

FIG. 23 shows the shape of the same silicon wafer just after the second optimized thermal, i.e. at the process step corresponding to FIG. 18i. It is clear that the shape of the silicon wafer returns to its initial shape and that the overall structure is completely stress-released after this second optimized thermal treatment.

The deep-etch of the structure associated to FIG. 18j can now be performed without the associated mechanical problems reported in FIG. 12, FIG. 13, FIG. 14, FIG. 15 and FIG. 16.

It will be seen that these optimised thermal treatments allow the elimination of these residual stress-induced mechanical problems of deep-etched optical elements (mechanical movement of the side-walls), of these residual stress-induced mechanical problems at the buffer/core interface or at the core/cladding interface (micro-structural defects, micro-voiding and separation) and of these residual stress-induced optical problems (polarisation dependant power loss) without the wafer warp problem following the optimised process.

Wafers in accordance with the invention are preferably made using the technique described in our co-pending co-our pending patent application Ser. No. 09/799,491 describes a technique involving the deposition of thick PECVD silica films on the back face of the silicon wafer in order to prevent the wafer warp problem associated with the required high temperature thermal treatments required to achieve low optical absorption silica film.

As discussed the invention involves the use of the two optimized heat treatments of FIG. 19 and FIG. 20.

It is clear from the FTIR spectra of: FIG. 3d, FIG. 4d, FIG. 5d, FIG. 6d, FIG. 7d, FIG. 8d, & FIG. 9d, from the stress hysteresis of buffer, core and cladding of FIG. 10 and from the wafer curvature results of FIG. 21, FIG. 22 and FIG. 23 that this new technique is key to achieve the required 'delta-n' while eliminating the undesirable residual Si:N—H oscillators, SiN—H oscillators and SiO—H oscillators after the two optimised thermal treatments of FIG. 19 and FIG. 20 which can provide improved silica-based optical elements with reduced optical absorption in the 1.55 μm wavelength (and/or 1.30 wavelength) optical region and without the residual stress-induced mechanical problems reported in FIG. 12, FIG. 13, FIG. 14, FIG. 15 and FIG. 16 of deep-etched optical elements.

It will be appreciated by one skilled in the art that many variations of the present invention are possible.

Variations Concerning the PECVD Deposition:

The PECVD equipment could be different from the Novellus Concept One. The basic requirement is to provide independent control of the four basic control parameters: $SiH_4$ gas flow rate, $N_2O$ gas flow rate, $N_2$ gas flow rate and total deposition pressure. The PECVD silica films could be deposited at a temperature different than 400° C. It could be deposited at any temperature between 100 and 650° C.

The $SiH_4$ silicon raw material gas could be replaced by an alternate silicon containing gas, such as: silicon tetra-chloride, $SiCl_4$, silicon tetra-fluoride, $SiF_4$, disilane, $Si_2H_6$, dichloro-silane, $SiH_2Cl_2$, chloro-fluoro-silane $SiCl_2F_2$, difluoro-silane, $SiH_2F_2$ or any other silicon containing gases involving the use of hydrogen, H, chlorine, Cl, fluorine, F, bromine, Br, and iodine, I;

The $N_2O$ oxidation gas could be replaced by an alternate oxygen containing gas, such as: oxygen, $O_2$, nitric oxide, $NO_2$, water, $H_2O$, hydrogen peroxide, $H_2O_2$, carbon monoxide, CO or carbon dioxide, $CO_2$;

The $N_2$ carrier gas could be replaced by an alternate carrier gas, such as: helium, He, neon, Ne, argon, Ar or krypton, Kr;

The $PH_3$ doping gas could be replaced by an alternate gas, such as: diborane, $B_2H_6$, Arsine ($AsH_3$), Titanium hydride, $TiH_4$ or germane, $GeH_4$, Silicon Tetrafluoride, $SiF_4$ of carbon tetrafluoride, $CF_4$;

Variations Concerning Buffer (Cladding):

The buffer (cladding) local optimum ($SiH_4$ gas flow of 0.20 std litre/min, $N_2O$ gas flow of 6.00 std litre/min, $N_2$ gas flow of 3.15 std litre/min and a total deposition pressure of 2.60 Torr) is this four-independent-variables space could have a different set of coordinates ($SiH_4$, $N_2O$, $N_2$, deposition pressure) using the same Novellus Concept One equipment;

The buffer (cladding) local optimum could have a different set of coordinates ($SiH_4$, $N_2O$, $N_2$, deposition pressure) in different PECVD equipment.

The 0.5 μm thick sacrificial buffer on the front face of the wafer could be as thin as 0.01 μm and as thick as 10 μm.

The 10.0 μm thick buffer on the back face of the silicon wafer could be as thin as 1.0 μm and as thick as 100.0 μm if buffer on the front face of the silicon wafer is as thin as 1.0 μm and as thick as 100.0 μm. In all cases, the goal is to deposit about the same thickness on both faces as to compensate their mechanical properties.

The 10.0 μm thick buffer deposited on the front face of the wafer in order to produce the optical elements could be as thin as 1.0 μm and as thick as 100.0 μm.

The 10.0 μm thick cladding deposited on the front face of the wafer in order to produce the optical elements could be as thin as 1.0 μm and as thick as 100.0 μm.

The wet-etch removing all of the 0.5 μm think buffer on the front face of the wafer could remove as little as 0.01 μm and as much as 10 μm of PECVD silicon nitride deposited on the back face of the wafer.

Variations Concerning the Core

The core local optimum ($SiH_4$ gas flow of 0.20 std litre/min, $N_2O$ gas flow of 6.00 std litre/min, $N_2$ gas flow of 3.15 std litre/min, $PH_3$ gas flow of 0.57 std litre/min, and a total deposition pressure of 2.60 Torr) is this five-independent-variables space could have a different set of coordinates ($SiH_4$, $N_2O$, $N_2$, $PH_3$, deposition pressure) using the same Novellus Concept One equipment.

The core local optimum could have a different set of coordinates ($SiH_4$, $N_2O$, $N_2$, $PH_3$, deposition pressure) in another PECVD equipment.

The 5.0 μm thick core deposited on the front face of the wafer in order to produce the first layer of the optical elements could be as thin as 0.5 μm and as thick as 50.0 μm.

The pattern and deep-etch of the core on the front face of the wafer in order to define the optical elements could have a penetration as small as 0.2 μm and as large as 20.0 μm into the underlying buffer.

Variations Concerning PECVD Nitride:

The 0.5 μm thick layer of PECVD nitride deposited on the back face of the wafer could be as thin as 0.01 μm and as thick as 10 μm.

The 0.3 μm thick layer of PECVD nitride deposited on the front face of the wafer could be as thin as 0.01 μm and as thick as 10 μm.

Variations Concerning the Mechanical Stress of Buffer:

The −250 MPa compressive mechanical stress of as deposited buffer could be tensile up to +250 MPa or compressive up to −750 MPa.

The stress hysteresis cycle of buffer up to 800° C. could be different than the one reported in FIG. 10.

The −150 MPa compressive mechanical stress of thermally treated buffer could be tensile up to +150 MPa or compressive up to −450 MPa.

Variations Concerning the First Optimized Thermal Treatment:

The 10 liters/minute of nitrogen constant flow could be as 1 liter/minute and as high as 100 liters/minute.

The 13 minutes duration wafer push into a diffusion tube could be as short as 1.3 minutes and as long as 130 minutes.

The 400° C. stabilization temperature of the tube could be as low as 300° C. and as high as 700° C.

The 10 minutes stabilization time prior ramp-up of the temperature of the diffusion tube could be eliminated or increased up to 100 minutes.

The 5° C./minute controlled ramp-up could be decreased down 1° C./minute or increased up to 25° C./minute.

The 900° C. maximum thermal treatment temperature could be as low 800° C. and as high as 1300° C.

The 180 minutes duration thermal treatment at the maximum thermal treatment temperature could be reduced to 30 minutes or increased to 24 hours.

The 2.5° C./minute controlled ramp-down could be decreased down 1° C./minute or increased up to 25° C./minute.

The 13 minutes duration wafer pull from the diffusion tube could be as short as 1.3 minutes and as long as 130 minutes.

The nitrogen ambient could be replaced by other ambient gases such as: oxygen, $O_2$, hydrogen, $H_2$, water vapour, $H_2O$, argon, Ar, fluorine, $F_2$, carbon tetrafluoride, $CF_4$, nitrogen trifluoride, $NF_3$, hydrogen peroxide, $H_2O_2$ Variations Concerning the Second Optimized Thermal Treatment The 10 liters/minute of nitrogen constant flow could be as 1 liter/minute and as high as 100 liters/minute.

The 13 minutes duration wafer push into a diffusion tube could be as short as 1.3 minutes and as long as 130 minutes.

The 400° C. stabilization temperature of the tube could be as low as 300° C. and as high as 700° C.

The 10 minutes stabilization time prior ramp-up of the temperature of the diffusion tube could be eliminated or increased up to 100 minutes.

The 5° C./minute controlled ramp-up could be decreased down 1° C./minute or increased up to 25° C./minute.

The 900° C. maximum thermal treatment temperature could be as low 600° C. and as high as 1300° C.

The 180 minutes duration thermal treatment at the maximum thermal treatment temperature could be reduced to 30 minutes or increased to 24 hours.

The 2.5° C./minute controlled ramp-down could be decreased down 1° C./minute or increased up to 25° C./minute.

The 13 minutes duration wafer pull from the diffusion tube could be as short as 1.3 minutes and as long as 130 minutes.

The nitrogen ambient could be replaced by other ambient gases such as: oxygen, $O_2$, hydrogen, $H_2$, water vapour, $H_2O$, argon, Ar, fluorine, $F_2$, carbon tetrafluoride, $CF_4$, nitrogen trifluoride, $NF_3$, hydrogen peroxide, $H_2O_2$ Variations Concerning the Mechanical Stress of Core:

The +175 MPa tensile mechanical stress of as deposited core could be compressive up to −325 MPa or tensile up to +675 MPa.

The stress hysteresis cycle of core up to 800° C. could be different from the one reported in FIG. 10.

The +40 MPa tensile mechanical stress of thermally treated core could be compressive up to −60 MPa or tensile up to +140 MPa.

The invention has many applications and can be use to manufacture Mux or Dmux devices, or other devices such as Add-After-Drop Filters (AADF) devices; arrayed Wave Guide (AWG) and Arrayed Wave Guide Grating (AWGG) devices; Athermal Arrayed Wave Guide (AAWGG) devices; charged Coupled Devices (CCD) devices; Distributed Feedback Laser Diode (DFB-LD) devices; Erbium Doped Fiber Amplifier (EDFA) devices; Fiber-To-The-Home (FTTH) application devices; Four Wave Mixing (FWM) devices; Fresnel Mirror (FM) devices; Laser Diode (LD) devices; Light Emitting Diodes (LED) devices; Mach-Zenhder (MZ), Mach-Zenhder Interferometer (MZI), Mach-Zenhder Interferometer Multiplexer (MZIM) devices; Micro-Opto-Electro-Mechanical Systems (MOEMS) devices; Monitor Photo Diode (MPD) devices; Multi-Wavelength Optical Sources (MWOS) devices; Optical Add/Drop Multiplexers (OADM) devices; Optical Amplifier (AF) devices; Optical Cross-Connect (OCC, OXC) devices; Optical Cross Point (OCP) devices; Optical Filter (OF) devices; Optical Interferometer (OI) devices; Optical Network Unit (ONU) devices; Optical Saw Wave (OSW) devices; Optical Splitter (OS) devices; Optical Switch (OSW) and Optical Switch Module (OSM) devices; Photonic ATM (PATM) switching devices; Planar Lightwave Circuits (PLC) devices; Positive Emitter Coupled Logic (PECL) devices; Quarter Wave (QW) devices; Receiver Photo Diode (RPD) devices; Semiconductor Optical Amplifier (SOA) devices; Spot-Size converter integrated Laser Diode (SS-LD) devices; Sub-Carrier Multiplexing Optical Network Unit (SCM-ONU) devices; Temperature Insensitive Arrayed Wave Guide (TI-AWG) devices; Thermo-Optic (TO) devices and Thermo-Optic Switch (TOS) devices; Time Compression Multiplexing-Time Division Multiple Access (TCM-TDMA) devices; Time Division Multiplexing (TDM) devices; Tunable Receiver (TR) devices; Uniform-Loss Cyclic-Frequency Arrayed Wave Guide (ULCF-AWG) devices; Vertical Cavity Surface Emitting Laser (VCSEL) devices; Wavelength Dispersive Multiplexing (WDM), Wavelength Dispersive Multiplexing Transceivers (WDMT) devices; Micro-Electro-Mechanical Systems (MEMS) device: Information Technologies MEMS devices; Medical/Biochemical MEMS devices; Biochips devices; Lab-On-A-Chip (LOAC) devices; Micro-Total Analysis System (μ-TAS) devices; Automotive MEMS devices; Industrial/Automation MEMS devices; Environmental Monitoring MEMS devices; and Telecommunications MEMS devices.

It will be appreciated that the above list is not exhaustive and other variations will be apparent to one skilled in the art. It is intended to cover all such variations within the scope of the appended claims.

We claim:

1. A method of making an optical waveguide having a plurality of layers with different refractive indices, comprising carrying out the following steps in sequence:
   a) fabricating a first structure resistant to wafer warp during thermal processing by PECVD (Plasma Enhanced Chemical Vapor Deposition), said first structure being fabricated by:
      i) depositing a sacrificial buffer layer on a front face of a silicon wafer,
      ii) depositing a first buffer layer on a back face of the silicon wafer,
      iii) depositing a first silicon nitride layer on said first buffer layer,
      iv) performing a wet etch to remove the sacrificial buffer layer on the front face of the wafer and a portion of the first silicon nitride layer,
      v) depositing a second silicon nitride layer on the front face of the wafer to compensate for a remaining portion of said first silicon nitride layer, and
      vi) depositing a second buffer layer on said second silicon nitride layer,
      vii) whereby said first structure comprises said silicon wafer having said second silicon nitride layer on the front face thereof, said second buffer layer on said second silicon nitride layer, said first buffer layer on said back face of said silicon wafer, and said first silicon nitride layer underneath and contiguous with said first buffer layer;
   b) reducing optical absorption and compressive stress in said buffer layers by subjecting said first structure to a first thermal treatment in the presence of an inert gas, said first thermal treatment comprising:
      i) stabilizing a diffusion tube at an initial stabilization temperature of about 400° C.;
      ii) inserting said first structure into said diffusion tube of step b(i);
      iii) stabilizing said first structure at said initial stabilization temperature;
      iv) decreasing compressive stress in said buffer layers from an initial compressive value by subjecting said first structure to a temperature that ramps up a rate lying in the range 1° C./min to 25° C./min from said initial stabilization temperature to a constant temperature of about 900° C.;
      v) further decreasing compressive stress in said buffer layers and reducing optical absorption by continuing to subject said first structure to said constant temperature in step b(iv) for a period of at least 30 minutes;
      vi) causing said first structure to undergo an elastic deformation wherein the compressive stress in said buffer layers increases linearly to a final compressive value that is less than said initial compressive value by ramping down said temperature to which said first structure is subjected to a final stabilization temperature of about 400° C. at a rate lying in the range 1° C./min to 25° C./min; and
      vii) extracting said first structure from said diffusion tube of step b(i) at said final stabilization temperature thereof
   c) depositing a silica core layer having a different refractive index from said first and second buffer layers on said second buffer layer by PECVD to form a second structure comprising in order said first silicon nitride layer, said first buffer layer, said silicon wafer, said second silica nitride layer, said second buffer layer, and said silica core layer;
   d) reducing optical absorption and tensile stress in said core layer by subjecting said second structure to a second thermal treatment in the presence of an inert gas, said second thermal treatment comprising:
      i) stabilizing a diffusion tube at a temperature at an initial stabilization temperature lying of about 400° C.;
      ii) inserting the second structure into said diffusion tube of step d(i) at said initial stabilization temperature;
      iii) relieving tensile stress in said core layer from an initial tensile value by subjecting said second structure to a temperature that ramps up a rate lying in the range 1° C./min to 25° C./min to a constant temperature of about 900° C.;
      iv) reducing optical absorption by continuing to subject said second structure to said constant temperature in step d(iii) for a period of at least 30 minutes; and
      v) causing said second structure to undergo elastic deformation and said tensile stress in said core layer to decrease linearly to a final tensile value that is less than said initial tensile value by ramping down said temperature to which said second structure is subjected to a final stabilization temperature of about 400° at a rate lying in the range 1° C./min to 25° C./min;
      vi) extracting said second structure from the diffusion tube of step d(i) at said final stabilization temperature thereof; and
   e) patterning said core layer;
   f) deep etching said patterned core layer with penetration into said second buffer layer;
   g) depositing a cladding layer on said etched core layer; and
   h) patterning and etching said cladding layer while protecting said first buffer layer with said first silicon nitride layer.

2. A method as claimed in claim 1, wherein said rate in steps b(iv) and d(iii) is 5° C./min.

3. A method as claimed in claim 1, wherein said rate in steps b(vi) and d(v) is 2.5° C./min.

4. A method as claimed in claim 1, wherein said first and second treatments are carried out in the presence of a gas selected from the group consisting of: nitrogen and argon.

5. A method as claimed in claim 1, wherein said inert gas has a constant flow rate.

6. A method as claimed in claim 1, wherein said flow rate of said inert gas lies in the range 1 liter/min. to 100 liters/min.

* * * * *